United States Patent [19]

Hoerning

[11] 4,021,782

[45] May 3, 1977

[54] DATA COMPACTION SYSTEM AND APPARATUS

[76] Inventor: John S. Hoerning, 4741 Perry Ave., North, Minneapolis, Minn. 55429

[22] Filed: Apr. 30, 1975

[21] Appl. No.: 573,571

Related U.S. Application Data

[63] Continuation-in-part of Ser. No. 431,066, Jan. 7, 1974, which is a continuation of Ser. No. 280,782, Aug. 15, 1972.

[52] U.S. Cl. .................. 340/172.5; 340/347 DD
[51] Int. Cl.² .................. G06F 5/00; H03K 13/00
[58] Field of Search ............ 340/172.5, 347 DD; 444/1

[56] References Cited

UNITED STATES PATENTS

| | | | |
|---|---|---|---|
| 3,656,178 | 4/1972 | De Maine | 444/1 |
| 3,675,211 | 7/1972 | Raviv | 340/172.5 |
| 3,694,813 | 9/1972 | Loh et al. | 340/172.5 |
| 3,701,108 | 10/1972 | Loh et al. | 340/172.5 |
| 3,717,851 | 2/1973 | Cocke et al. | 340/172.5 |

Primary Examiner—Raulfe B. Zache
Attorney, Agent, or Firm—Wicks & Nemer

[57] ABSTRACT

A data compaction system and apparatus is disclosed which, in the preferred embodiment, includes a high speed compaction controller utilizing both read only storage and read-write storage. A compaction device according to the present invention could then be placed upon both ends of a transmission line, the data received by a compaction unit at one end of the line from whatever apparatus wished to transmit data on the line, the data compacted within the compaction unit according to the present invention, the data transmitted on the line to a compaction unit on the other end of the line, the data decompacted, and the data provided to whatever apparatus wished to receive the data. Data received by the compaction device according to the present invention in a fixed length, fixed number base, coded manner would then be compacted by altering the expression of the data, as by altering the number bases in which the data is expressed and by switching between number bases. Thus, it has been found that expressing the data as a string of characters of varying lengths and varying number bases, that is characters not all expressed in the same number base, shortens the overall length of the data transmitted. This is true even if the length of certain characters may be increased by the techniques according to the present invention. Also, prior character and prior record comparisons according to the present invention significantly enhance the compaction ability of the present invention.

37 Claims, 26 Drawing Figures

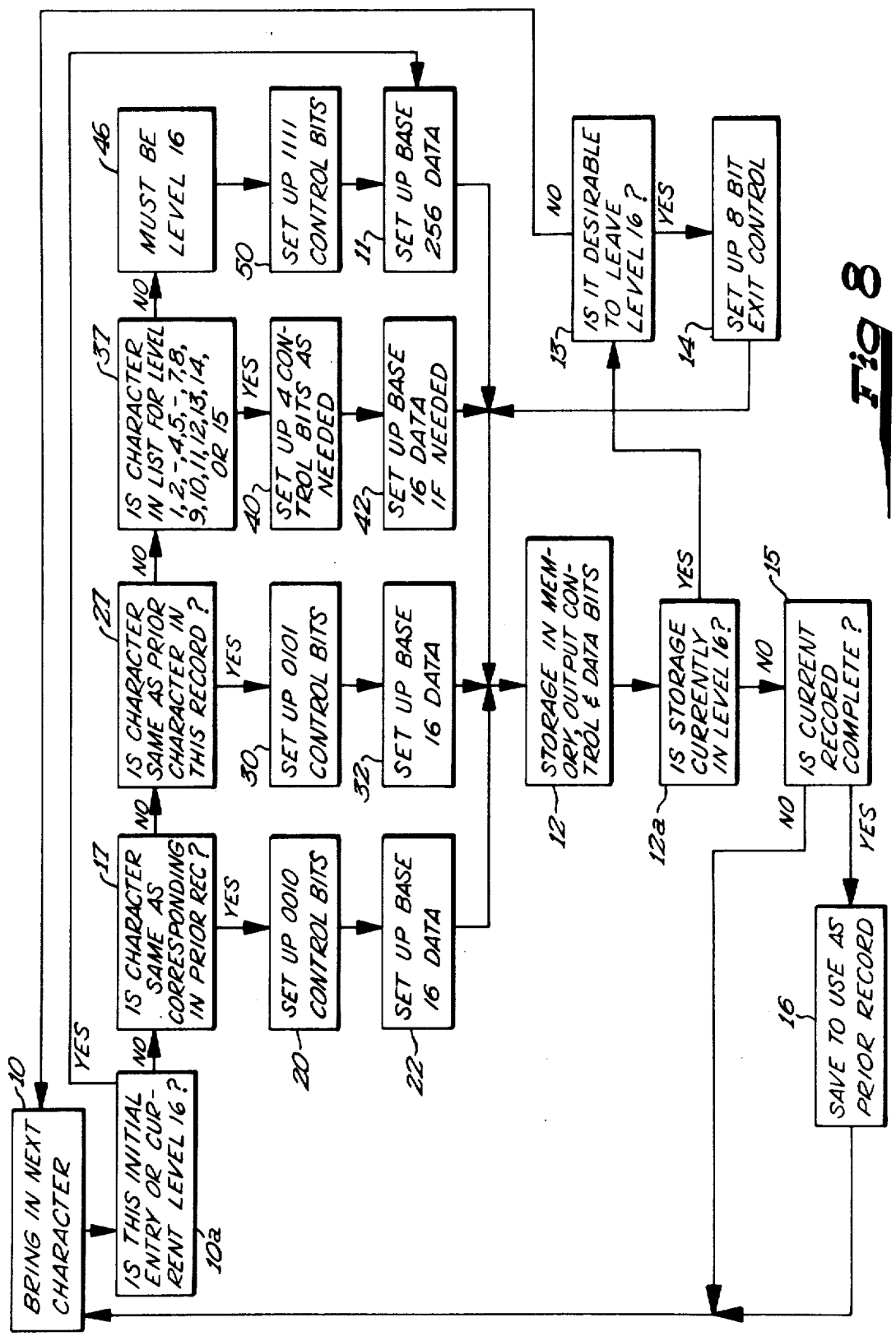

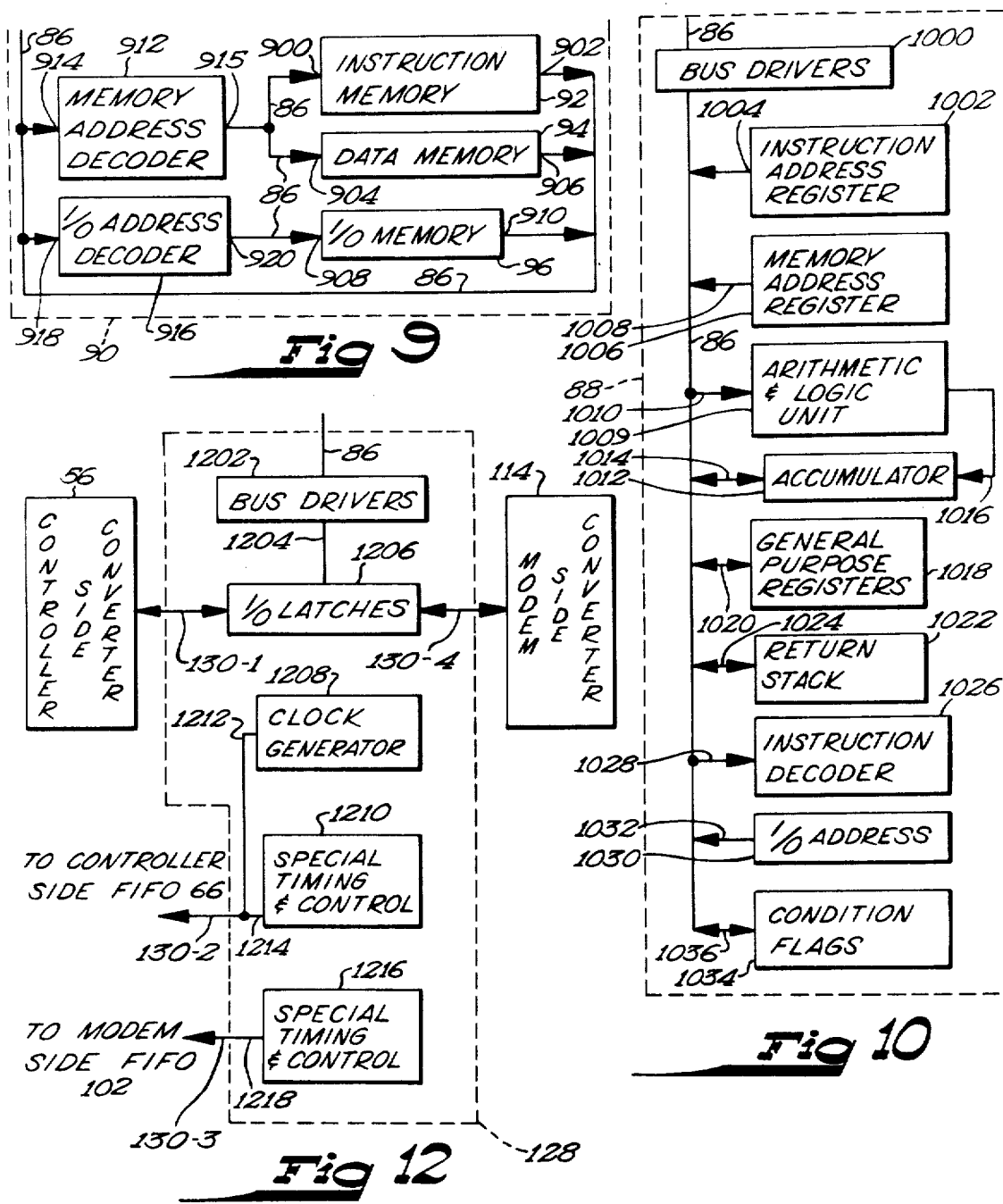

DATA COMPACTION SYSTEM AND APPARATUS

CROSS REFERENCE

The present invention is a continuation-in-part application of an application filed on Jan. 7, 1974 by John S. Hoerning, Ser. No. 431,066, entitled DATA COMPRESSION SYSTEM, which in turn is a continuation application of an application filed Aug. 15, 1972, by John S. Hoerning, Ser. No. 280,782, entitled DATA COMPRESSION SYSTEM.

BACKGROUND

For many years, persons and firms in the data processing field have sought a method and apparatus to reduce the time necessary to transmit data between two given points. The present invention provides such a method and such apparatus.

SUMMARY

A data compaction system and apparatus is disclosed which, in the preferred embodiment, includes a high speed controller utilizing both read-only storage and read-write storage. A compaction device according to the present invention could then be placed upon both ends of a transmission line, the data received by a compaction unit at one end of the line from whatever apparatus wished to transmit data on the line, the data compacted within the compaction unit according to the present invention, the data transmitted on the line to a compaction unit on the other end of the line, the data decompacted, and the data provided to whatever apparatus wished to receive the data. Data received by the compaction device according to the present invention in a fixed length, fixed number base, coded manner would then be compacted by altering the expression of the data, as by altering the number bases in which the data is expressed and by switching between number bases. Thus, it has been found that expressing the data as a string of characters of varying lengths and varying number bases, that is characters not all expressed in the same number base, shortens the overall length of the data transmitted. This is true even if the length of certain characters may be increased by the techniques according to the present invention.

Also, the present invention continuously stores the present character in the prior record mask and in the prior character mask. It has then been found that a comparison of the record to be compacted with both the prior character mask and the prior record mask allows a significantly shortened, coded representation which further and signficantly enhances the compaction ability of the present invention.

It is thus an object of the present invention to provide novel, efficient, and heretofore considered unavailable apparatus and methods for compacting data.

These and further objects and advantages of the present invention will become clearer in the light of the following detailed description of an illustrative embodiment of this invention described in connection with the drawings.

DESCRIPTION OF THE DRAWINGS

FIG. 8 shows a block diagram similar to FIG. 2 of an alternate embodiment according to the present invention.

FIGS. 9 to 14 show block diagrams further explaining the block diagrams of FIGS. 2 and 8.

All of the figures are drawn for ease of explanation of the basic teachings of the present invention only; the extension of the figures with respect to a particular application of the present invention will be within the skill of a partitioner of the art after the teachings of the present invention have been read, followed, and understood.

DESCRIPTION

Figure 1:
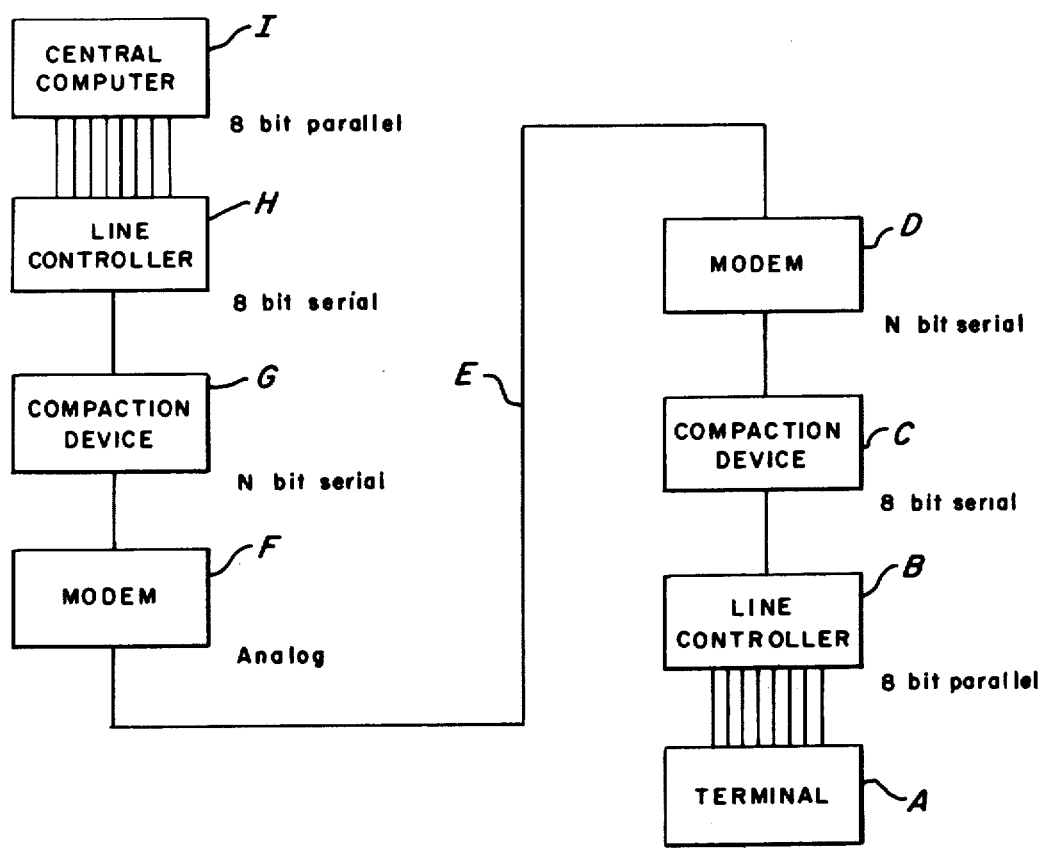
FIG. 1 shows a functional block diagram of an exemplary system incorporating the present invention at the terminal and computer ends of a transmission line.

Turning now to FIG. 1, and for the moment eliminating those portions of the block diagram designated C and G, the present state of the art is disclosed. That is, for example, a remote batch terminal transmission system is disclosed in which the input is fed into the reader at terminal A through means such as punched cards. The data passes from terminal A in an eight bit parallel mode into a line controller B where the data is translated into a bit serial mode and applied in some instances to a modem D which is commonly a modulator/demodulator. The modem conventionally translates the bit serial information into analog signals such as audio tones. These tones are conventionally applied to a voice grade telephone line E but it may also be possible to eliminate the modem and use a digital transmission line and transmit the data signals directly. Where a voice grade telephone line is used, the speed of data transfer is limited by the bandwidth of the line and the effectiveness of the modem in utilizing the particular bandwidth. For the purposes of description of operation of the present invention, the Bell 201A modem and the Bell dial up telephone line will be used, as there are the most widely used components.

At the far end of the line E there is another interface to a second modem F where the analog signals are conventionally translated to bit serial data and which is connected to the line controller H which converts that data into an eight bit parallel mode for storage in the memory of computer I. After processing by the computer I, the output data can then be transmitted to terminal A where it may be printed or punched into cards for the information retrieval.

For the exemplary system described, the eight bits of the character are gated to a line controller B in parallel form, that is, all eight bits simultaneously. Line controller B holds the character and releases one bit at a time to the modem D, which in turn generates tone modulated signals for the communication line. Depending upon the modem, it may use frequency shifting, phase shifting, or amplitude shifting to represent the different combinations of the bits. The Bell 201A model, for example, uses dibit (two bits) phase encoding and utilizes four phase shifts to represent the four possible bit combinations. Each combination is held for two cycles and in this way each bit is converted to one cycle of bandwidth and each character to eight cycles of bandwidth. Thus the usable bandwidth of a dial up line is normally 2000 cycles per second, from 750Hz to 2750Hz. This bandwidth provides a maximum transmission speed of 250 characters per second for this combination. Inasmuch as all characters are the same length and the transmission media delivers a constant speed in bits per second, it is apparent that the amount of data which may be transmitted in a given time is strictly limited, and thus the speed at which a terminal device may operate is also so limited.

In the exemplary system just described, while no specific compaction device is used, certain limited compaction may be conventionally performed by the central computer at one end and by the terminal A, which may be a small computer, at the other end of the transmission line. A first method previously utilized is the deletion of trailing blanks from each record of data by inserting a special character which signifies that no significant data exists beyond that point. This special coding is commonly known as end compression. Another method utilized for compression is the detection of strings of identical data, usually blanks, which is found in the record or text. Conventionally, this string is deleted and one to three special characters are inserted, depending upon the character which is deleted, the number deleted, and the system being used.

The particular compaction methods described above, however, and others currently in use have a number of characteristics in common. Generally, all characters are of fixed length, and this length may be 6, 7, 8, 10, or other binary bit lengths, but the character length is consistent for a given system. That is, all characters are given in the same number base and require the same number of bits for expression of that character. For example, all characters are generally eight bits long and are expressed in the number base 256, thus allowing a maximum of 256 characters to be expressed.

Now considering the complete exemplary FIG. 1, including the present invention, a compaction device C would be inserted between line controller B and modem D, and another compaction device G would be inserted between modem F and line controller H. Compaction device C, in relation to the exemplary system described, receives the bit serial data and performs compaction of the record received before passing the data of the record to modem D. It should also be recognized that if digital lines are used, compaction device C may be used without a modem.

As will be set out in more detail hereinafter, specifically with respect to FIG. 7, the compaction device according to the present invention is made up of a small, high speed compaction controller or coder/decoder utilizing both a read-only storage and a read-write storage. Also, logic devices for the system of the present invention, a preferred embodiment of which is shown in FIGS. 2 through 6, are preferred to be in the form of a diode matrix. The diode matrix is usually cast as an integrated circuit chip and, in either case, the diode matrix with its associated logic becomes the read-only storge referred to previously. Thus the read-only storage has the qualities of being nonchangeable and maintains its state indefinitely. As such, it is ideally suited for use at remote locations where service is not readily available. Since the read-only storage is nonchangeable, it cannot be used to store data and therefore a read-write or buffer memory is also used in the preferred embodiment. This read-write memory may be in the form of a magnetic core memory, where it is used for temporary retention of data and tables, or other conventional types. A basic type diode matrix is shown and described on pages 323 through 336 of a text entitled DIGITAL COMPUTER PRINCIPLES, published by the McGraw-Hill Book Company, Inc. in 1962. The same text also describes a buffer memory in the form of a magnetic core memory on pages 397-410.

In operation, the compaction device of the exemplary system continually receives and executes a microcode from the read-only storage mechanism and this microcode in turn produces the control necessary to operate the compaction device. In its preferred state of operation, the compaction device is running at an idle condition and accepts a signal from a modem to indicate that communications have been established. The compaction device C then begins to read the input material from the terminal A. As each amount, block, or byte of data is read in, the compaction device stores the data in the buffer memory and the compaction device performs the logical operations as encoded in the diode matrix forming the read-only storage. This reduces the amount of data transmitted substantially. As each byte or group of bytes is compacted, it is then transmitted across the communications line E. At the other end of the line, the compaction device goes through the reverse procedure to expand the data to its original content.

It should also be recognized that while the compaction device is reading noncompacted data, it is simultaneously compacting the prior data and also transmitting the data prior to that.

Because of the complexity of the present invention and its significant departure from the art, the remaining description of the preferred embodiments of the present invention will interweave a block diagram procedural, systematic description, such as that exemplified by FIGS. 2–6 and 8, a block diagram, functional, systematic description, such as that exemplified by FIGS. 7 and 9–14, and a particular example of how the present system would operate on a particular block of data. Following this, a particular hardware embodiment will be described, with a further preferred element.

Thus to illustrate the operation of the compactor of the present invention, the operation will be followed through a short, exemplary block of data consisting of four records which are to be considered printed lines at a terminal printer. The block of data used shows only the actual data and not the control characters, as these control characters will vary depending on the specific terminal equipment being used. At each step of the illustration, not only the effect of the present invention on this specific example of data will be shown, but also the general case in which that the data belongs will be described. Also, in addition to illustrating both the specific example and the general case, the illustration will be used to show the operation of the preferred hardward embodiment of the compactor of the present invention.

The example, a short block consisting of four records, is set out in its entirety below:

LINE 01 = (B)
LINE 02 = (DDDDDDDDD)
LINE 03 = (YYYDDDTTD)
LINE 04 = (;:#?)

All characters set out above are part of the data block. Although this example data block is short, it serves to illustrate the use of every level of compaction of the present invention, as will become clearer hereinafter.

Figure 7:
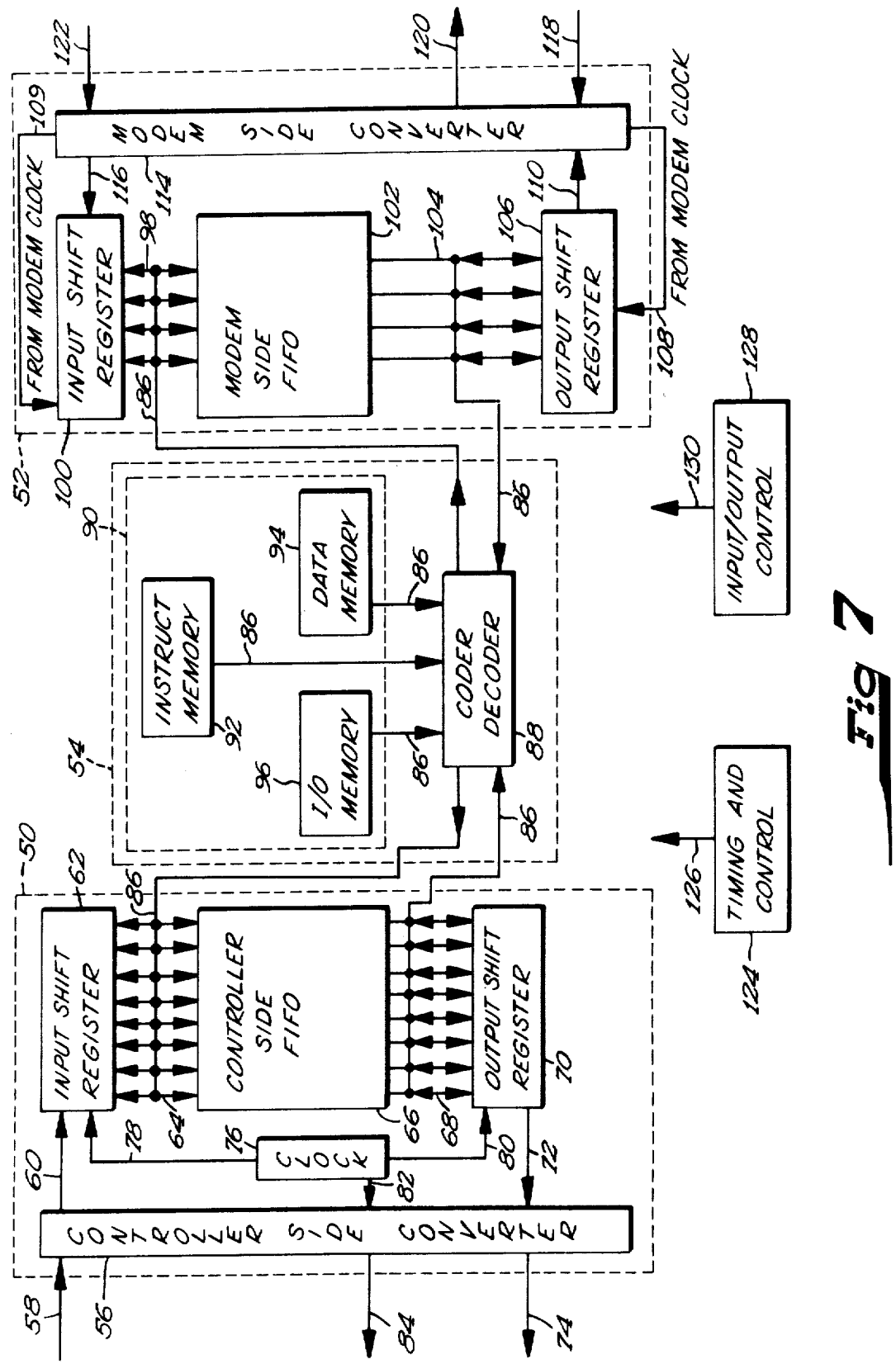
FIG. 7 is a functional block diagram of a preferred system and apparatus according to the present invention.

First, describing FIG. 7 which is a functional block diagram of a preferred system and apparatus according to the present invention, input/output devices are shown and generally designated 50 and 52. Input/output devices 50 and 52 provide access to and from the compactor of the present invention, generally designated 54.

Input/output device 50 then includes a controller side converter 56 including input data connection 58, as from line controller B, and output data connection 60 to an eight bit input shift register 62. Register 62, in turn includes output data connection 64 to a controller side FIFO register 66, which in turn includes an output data connection 68 to a further eight bit shift register 70 having a data output connection 72 to converter 56. Converter 56 then also includes an output data connection 74, as to line controller B of FIG. 1. All of the above are more fully described with reference to FIGS. 9 and following, hereinafter.

Input/output device 50 further includes a clock 76 connected by logic connection 78 to register 62, connected by logic connection 80 to register 70, and connected by logic connection 82 to converter 56. Further, a logic connection 84 extends from converter 56 with clock pulses. All of the above and more fully described with reference to FIGS. 9 and following, hereinafter.

Further, a principal data connection 86 extends from data connection 64, between register 62 to FIFO 66, and from data connection 68, between FIFO 66 and register 70, and provides a data stream to compactor 54, and specifically to compaction device, coder/decoder 88 therein. Still further, principal data connection 86 provides a data connection between coder 88 and memory, generally designated 90. Thus, data connection 86 interconnects with instruction memory 92, data memory 94, and input/output memory 96, all within memory 90. All of the above are more fully described with reference to FIGS. 9 and following, hereinafter.

Principal data connection 86 further extends out of compactor 54 and to input/output device 52 to intersect with a data connection 98, issuing from a four bit shift register 100 and extending to a modem side FIFO 102. Further, principal data connection 86 intersects with a data connection 104 extending from modem side FIFO 102 and extending to an additional four bit shift register 106.

Register 106 also includes a logic connection 108 extending from the clock within the modem and an output data connection 110 to a modem side converter 114. Clock connection 109 also extends to register 100. Modem side converter 114 includes an output data connection 116 to register 100, an input logic connection 118 from the modem clock, an output data connection 120, as to modem D in FIG. 1, and an input data connection 122, as from modem D in FIG. 1. All of the above are more fully described with reference to FIGS. 9 and following, hereinafter.

Also shown in timing and control block 124 including a general connection 126 to various parts, blocks, and portions of the system, as will be more fully described with reference to FIGS. 9 and following, hereinafter. Further shown is an input/output control block 128 including a general connection 130 to input/output devices 50 and 52, as will be more fully described with reference to FIGS. 9 and following, hereinafter.

With respect to FIGS. 1 and 7, as the computer I begins to send data, it raises its request to transmit signal, in a conventional manner, which signal is transmitted from the computer and into the controller side converter 56 and to the compactor 54 shown in FIG. 7. As this request to transmit signal issues from converter 56, it is recognized by the coder 88, which then produces the necessary control logic to start the clock 76. Clock 76 then shifts the incoming data line 60 into the eight bit input shift register 62. Incoming data then shifts through input device 50 continuously until it matches a synchronization register, described later. When syncronization is achieved, the first data character is transmitted into the controller side memory FIFO 66 via data connection 64 where it assumes a data position at the bottom of the register to await being accessed by coder 88. As soon as the first character is in a ready status, as will be discussed further hereinafter, the following character is beginning to shift in. This continues with each character being accessed by the coder 88 and operated on while other characters are being shifted in behind it and held in readiness.

In order to reduce the number of bits required to express a given character in accordance with the present invention, it has been found that the practice of expressing all characters in the base 256 (eight bits) can be eliminated. A device according to the present invention accepts the eight bit serial data, as from line controller B, performs extensive manipulation of the data, and expresses the data as a string of characters of varying lengths. That is, the characters are not all expressed in the same number base. By using different number bases to express the data, while the length of certain characters is increased, it has been found that the overall length of the data, in bits, is shortened. That is, it has been found that by using lower number bases (fewer bits) to express common characters or situations and higher number bases to express less common characters or situations the overall data length in bits is shortened.

In carrying out the preferred embodiment of the present invention, number bases 8 (three bits) and 256 (eight bits) are used to indicate specific characters or sequences of characters. Varying number bases are also used to indicate conditions such as (1) where the character is the same as the previous character, and (2) where a character is the same as corresponding characters in a previous record. In addition, number base 2 is used where one bit represents one character or one control bit, number base ⅛ is used where one bit represents three characters or one control bit, and number base 1/16 is used where one bit represents four characters or one control bit.

The control codes used in the different steps of compaction use a technique in which specific bit combinations of number bases 2, 4, 8, 16, 32, 64, 128, and 256 are used for control purposes. Therefore, depending on the specific data being compacted, the preferred matrix s constantly switching in and out of 10 number bases in performing its normal operation. A matrix using fewer number bases will be described hereinafter for purposes set forth hereinafter.

In order that control may be exercised over the various character groups, control level codes are assigned corresponding to a shift to a certain level for storage, and the control level codes are shown generally in Table I as set out below:

TABLE I

| Control Level Codes | | Characters |
|---|---|---|
| 1 | Shift to level 1 | 0 2 1 (blank) 5 . 7 3 |
| 0 | " 2 | 8 6 4 E 9 A - T |
| 10 | " 3 | Characters identical to prior record |
| 110 | " 4 | R C D S I O , N |
| 1110 | " 5 | P B F G M K L U |
| 11110 | " 6 | Characters identical prior character |
| 111110 | " 7 | H V * / Y & ( ) |
| 1111110 | " 8 | J = X W + Q Z $ |
| 1111111 | " 9 | No compaction mode |
| Level 3 Codes (base 1/16) | | |
| 0 | | Four character group identical to corresponding group in prior record. |
| 1 | | Shift to base 2. |
| Level 3 Codes (base 2) | | |
| 0 | | One character identical to corresponding character in prior record. |
| 1 | | Shift to control level. |
| Level 6 Codes (base ⅛) | | |
| 0 | | Three characters identical to prior character. |
| 1 | | Shift to base 2. |
| Level 6 Codes (base 2) | | |
| 0 | | One character identical to prior character. |
| 1 | | Shift to control level. |
| Level 1, 2, 4, 5, 7, 8 Codes (base 8) | | |
| NNN | | Base 8 character to represent 1 of 8 characters in level. |
| Level 9 Codes (base 256) | | |
| NNNNNNNN | | Base 256 character to represent 1 of 256 characters in level. |
| 11111111 | | One specific base 256 character designated for shift to control level. |

Returning to the example, data is in FIFO 66, and as soon as the first entire eight bit character has been shifted through the FIFO 66 and is available via data connection 68 at the eight bit output shift register 70, coder 88 will access this character and begin to operate the compacting logic which is stored in the instruction memory or the micro code 92. In the case of the above set out example, the first character to be brought in is an L from the word "LINE." As can be seen from Table I, L is a member of level 5 compaction logic. Therefore with reference to FIG. 2, the mechanism and process of compaction, according to the present invention, is to bring in the next character, step 10, and then to check to see if the character brought in is an initial entry, step 10a. Since, in the example set out, the letter L is an initial entry, the mechanism and process, according to the present invention, then proceeds to set up this character without compaction, step 11, and to transmit the data bits to modem side FIFO, step 12. For this example, it is assumed that the logical representation of the letter L is 11010011 in a conventional base 256 system.

Specifically with respect to FIG. 7, it can be seen that coder 88 transmits the eight bits representing the letter L, by grouping them in groups of four bits and transmitting them via data connection 86 into the four bit shift register 100 on the modem side FIFO stack 102. As each four bits is provided to the FIFO 102 via data connection 98 from the input shift register 100, it assumes a data position at the bottom of modem side FIFO stack 102 where it is then shifted via data connection 104 into the four bit output shift register 106. As each clock signal comes in from the modem clock line 118, through converter 114, and via connection 108, one bit at a time is shifted out of register 106 and onto the transmit data line 110. As each four bits of the data is provided to the data line 110, the next four bits, which are waiting in the modem side FIFO stack 102, are then shifted into the four bit shift register 106.

Similarly, and again with respect to FIG. 7, as the data is provided by a data connection 86 to the four bit shift register 100, it is simultaneously provided to memory 90 to be stored in data memory 94 in the location equivalent to its distance from the start of the record. At the end of the record, the entire record is saved to provide a comparison mask for the next record, as will be explained further hereinafter. This storage of each character of the record also allows a comparison mask for the next characters, as will also be described further hereinafter.

Returning again to FIG. 2, the compaction according to the present invention now continues by checking if the system is currently in level 9 and if it is desirable to leave level 9. Since the system is in level 9 in the example started above and because level 9 is an uncompacted level, the next compaction step is to see if it is desirable to leave level 9, step 13. Since the data character currently being operated upon, i.e. L, is not a level 9 character, but a level 5 character according to Table I and the next three characters "INE" are also not level 9 characters according to Table I, it is desirable to leave level 9 and the logic then sets up the eight bit exit control code 11111111, step 14. This particular feature of the present invention, termed "lookahead," will be discussed further hereinafter in relation to Table II. This eight bit exit control code allows the system to leave level 9 and enter the control level of the appropriate compaction logic, for the next character.

The system then proceeds through steps 12 and 12a. At step 12a, since the control bits have been set to leave level 9, the storage is not currently in level 9, and progress is made to step 15. At step 15 the system checks to see if the current record is complete. Since it is not complete, as only the first letter has been entered, the system stores the character just processed, L, into data memory 90 and proceeds back to step 10, to bring in the next character.

As indicated in step 10, the compactor then accesses the next data character, seen from the example given to be the letter I from the word "LINE." This letter is then in the form of an eight bit logic output from register 70. The system then again checks to see if this letter I is an initial entry or if the system is currently in level 9, step 10a. Since the system has progressed out of level 9, the answer is no, and the system progresses to step 17 of FIG. 2. Since the letter I, the character currently operated upon, is not the same as the corresponding character in a prior record, since it is assumed that there is no prior record, the system progresses to block 27. Since the letter I in the example given is not the same as the previous letter operated upon, the letter L, the system progresses to step 37.

The letter I is indicated by Table I as a level 4 character, so the system progresses to step 40 where necessary control bits are set up, specifically a four bit sequence consisting of 1110. The compaction logic then proceeds to step 42 where the base 8 data is set up. In this case, for the letter I, the base 8 data is 100, the binary code indicating that the letter I is the fifth position in the level 4 table. The system then continues through the process of transmitting the character, of storing the character in the data memory, and of preparing to bring in the next character, steps 12a, 12, 15, and back to 10.

Compaction level 4 requires four control bits to reach and three bits to express the character, because the expression is in number base 8. The compaction of a single character then produces a bit string 1110NNN where the 1110 form the control bits and the NNN are the three bits to identify one of the possible eight characters in level 4. From Table I, the characters represented by level 4 are:

R C D S I O , N

Returning again to the example, the next character brought in is the letter N from the "LINE," which also has been assigned by the preferred embodiment of the compaction system and apparatus of the present invention to level 4. This character also traverses step 10, 10a, 17, and 27, and is operated upon in step 37 in a manner explained previously. Therefore, the same control logic produces the same set of control bits. However, this time the three bit data portion is now 111 to indicate that the letter N is the eighth character in the character set.

The system then repeats progress through steps 12, 12a, and 15, and back to step 10, as previously explained.

To this point, the output from the compaction since the compactor was entered and including the level 9 character and the level 9 exit control, and for the exemplary data entered, i.e. "LIN," is:

| 11010011 | 11111111 | 1110100 | 1110111 |
|---|---|---|---|
| L | 9 exit | I | N |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

Continuing with the example, the next data character brought into the controller is the letter E, the last letter from the word "LINE." This character also traverses step 10, 10a, 17, and 27, and is operated upon in step 37 in a manner explained previously. The E is assigned to level 2, by the preferred embodiment of the compaction technique and apparatus found in Table I, and therefore a two bit control code of 10 is set up and this two bit control string is followed by a three bit data string of 011 indicating that the letter E is the fourth entry in the table.

Compaction level 2 is identical to compaction level 4 except that it only requires two control bits to reach and represents a different eight characters. The characters represented by level 2, in the preferred embodiment of the apparatus and system of the present invention as exemplified by Table I, are:

8 6 4 E 9 A - T

The compaction of a single character in the group assigned to level 2 produces a bit string 10NNN, where the 1 and the 0 are the control bits and the bits NNN are the three bits to identify one of the possible eight characters, in the number base 8.

The system then repeats progress through steps 12, 12a, and 15, and back to step 10, as previously explained.

At this point the total output according to the compaction of the data "LINE" from the compaction according to the present invention is:

| 11010011 | 11111111 | 1110100 | 1110111 | 10011 |
|---|---|---|---|---|
| L | 9 exit | I | N | E |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

The next data character brought into the system is a blank, between the word "LINE" and the remaining data. This character also traverses step 10, 10a, 17, and 27, and is operated upon in step 37 in a manner explained previously. The blank is found in level 1, of Table I, and therefore produces a single bit control code of 0 followed by three bits of data, 011, to indicate its fourth position in level 1 of Table I.

Compaction level 1 requires only one control bit to reach and three bits to express the character, again in number base 8. The compaction of a single character produces a bit string ONNN where O is the single control bit and NNN represents the three bits necessary to identify one of the eight possible characters in number base 8. This level is used for compacting the eight most commonly used characters, and while these characters may vary from one application to another, the preerred embodiment of the present invention has assigned level 1 characters as:

0 2 1 (blank) 5 . 7 3

The system then repeats progress through steps 12, 2a, and 15, and back to step 10, as previously explained.

The next exemplary character brought in by the oder 88 is a 0. This character also traverses step 10, 0a, 17, and 27, and is operated upon in step 37 in a manner explained previously. Since the 0 is found in vel 1, as discussed above, the operation is similar to at of the preceding character with the exception that e three bits of data following the control code 0 are 00 to indicate the placement of the character 0 in vel 1.

The system then repeats progress through steps 12, 2a, and 15, and back to step 10, as previously explained.

The next data character brought in in the example is , and again the operation is similar to that previously xplained since the 1 is also found in level 1. Again, the nly difference is in the three bits of data to be added ） the control code of 0. In the case of data character , the three bits of data are 010 to indicate that the haracter 1 occupies the third place in the assigned vel 1 according to the preferred embodiment of the resent invention.

The next exemplary character brought in by the oder 88 is a "blank." This character also traverses ep 10, 10a, 17, and 27, and is operated upon in step 7 in a manner explained previously. The "blank," in e manner explained above, produces a compacted ode of 0011.

At this point, the total output from the compaction ccording to the present invention for the portion of e example assumed compacted thus far, i.e. "LINE 1 " is

| 11010011 | 11111111 | 110100 | 110111 | 10011 |
|---|---|---|---|---|
| L | 9 exit | 1 | N | E |
| 0011 0000 0010 0011 | | | | |
| ank 0 1 blank | | | | |

The above presentation has been spaced for illustrave and explanatory purposes only. It will be recognized that spaces do not appear during actual transmison. Likewise, the characters represented by the biary bit string, and appearing below the bit string, are t out for purposes of explanation and illustration nly.

The next data character brought in according to the ample set forth above is an equals sign. This character also traverses step 10, 10a, 17, and 27, and is operated upon in step 37 in a manner explained previously. he equals sign is found in level 8, and therefore proces eight bits of control code logic 11111110, folwed by three bits of data 001, to indicate that the quals sign occupies the second position of level 8.

Compaction in level 8 is identical in operation to mpaction in levels 1, 2, and 4, except for the characrs represented. The compaction of a single character oduces a bit string 11111110NNN where the 1111110 are the control bits and the NNN are the iree bits to identify one of the eight possible characrs in this group in the number base 8. The eight characters represented by level 8 according to the preferred embodiment of the present invention are:

$$J = X W + Q Z \$$$

The next exemplary character brought in by controller 88 is also a blank, and the compaction logic produces an output of 0011 in the identical manner to the previous blank discussed.

The next character brought in by control logic 88 is an open parenthesis and this character has been assigned to level 7 by the preferred embodiment according to the present invention. This character also traverses step 10, 10a, 17, and 27, and is operated upon in step 37 in a manner explained previously.

Compaction level 7 is identical in operation to levels 1, 2, 4 and 8 discussed previously with the exception of the characters represented. Compaction of a single character produces a bit string of 1111110NNN where the 1111110 are the control bits and the NNN are the three bits identifying one of the possible eight characters. The eight characters assigned by the preferred embodiment according to the present invention to level 8 are:

H V * / Y & ( )

Thus, the open parenthesis character from the example produces a seven bit control code of 1111110 and a three bit data code 110 indicating that the open parenthesis occupies a seventh position, in order, in the characters assigned to level 8.

At this point, the total logical output from the compactor for the example data "LINE 01 = (" is:

| 11010011 | 11111111 | 1110100 | 1110111 | 10011 |
|---|---|---|---|---|
| L | 9 exit | 1 | N | E |
| 0011 0000 0010 0011 | 1111110001 | 0011 | 1111110110 | |
| blank 0 1 blank | = | blank | ( | |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

The system then repeats progress through steps 12, 12a, and 15, and back to step 10, as previously explained.

The next data character in the example is B. This character also traverses step 10, 10a, 17, and 27, and is operated upon in step 37 in a manner explained previously. From Table I, B has been assigned according to the preferred embodiment of the present invention to level 5. Compaction level 5 is identical in operation to the previously discussed levels 1, 2, 4, 7, and 8, again with the exception of the characters assigned to this level. The compaction of a single character produces a bit string of 11110NNN, where 11110 are the control bits and NNN are the three bits to identify one of the eight possible characters of this group, in base 8 logic. The eight characters represented by level 5 according to the preferred embodiment of the present invention are:

PBFGMKLU

Thus, the B next brought in by controller 88 produces a control code of 11110 and a three bit data code of 001 indicating its second position in the character string represented by the assigned level 5.

The system then proceeds through steps 12, 12a, 15, and back to step 10, as previously explained.

The final character in the first record of the example set out above is a close parenthesis. The close parenthesis falls in level 7, according to Table I. Thus this character, in the manner previously set out, produces a logical output of 1111110111 with the seven bit control code of 1111110 discussed above and the three bit data code of 111 indicating the position of the close parenthesis as the eighth position of level 7.

At this point the total compacter output for the first record of "LINE 01 = (B)" is:

| 11010011 | 11111111 | 1110100 | 1110111 | 10011 0011 0000 |
|---|---|---|---|---|
| L | 9 exit | 1 | N | E blank 0 |
| 0010 0011 | 11111110001 | 0011 | 1111110110 | 11110001 1111110111 |
| 1 blank | = blank | ( | B | ) |

To this point in the explanation of the present invention, only character level compaction has been performed. That is, no step 17 or step 27 compaction, as set forth in FIG. 2, has been performed; only step 37 compaction has been performed. The compaction performed, however, has reduced a record which was initially 104 bits in length to 94 bits. That is, the first record of "LINE 01 =(B)" consists of 13 characters and with a conventional representation of eight bits per character, would represent a total of 104 bits. From the total compaction output set forth above, it can be seen that only 94 bits are used to represent this data record, previously to the present invention conventionally represented by 104 bits.

The above set out compaction of the first record has also contained the overhead of the exit code for leaving level 9 and has also established a prior record mask which allows greater compaction in following records. The prior record mask is stored at the end of compaction upon the first record where step 12 is traversed, step 12a is traversed, and the system traverses step 15.

The test for record completion, step 15, is totally dependent on the type of terminal hardware with which the system of the present invention interfaces. Some terminals transmit only one record per transmissions block, and the end of a record is an actual half of data transmission. For simplicity, this is assumed to be the case for the example of this description. Other terminals, however, use special characters or sequences of characters to indicate the end of a record has occurred, and this allows multiple records to be transmitted and packed into a single transmission block. If this later technique were to be used, the compactor passes the special characters or sequences of characters along in a compacted form in the manner of ordinary data, but logic is arranged at step 15 to recognize these special characters or sequences of characters that separate the records, and thus allow each record to be used as a prior record mask.

As can be seen, since the record is now complete, it is transmitted and also saved, as in step 16, for use which can now be explained.

Returning again to the data example set out above, the second record is then ready to be brought into compacter 54 by coder 88. As can be visually seen in the simple example given, the first six characters of the second record are identical to the first six characters of the first record already processed. That is, from L to and including O, the records are identical for the first six locations in the prior record. Thus, compaction according to the present invention would proceed from step 10 of FIG. 2, through step 10a, as previously described, and stop at step 17 where it is found that a character is the same as a corresponding character in a prior record. The system then proceeds to step 20 where a three bit control code for level 3 is set up. From Table I, this control code is 110. The system then proceeds to step 22 and the remaining steps 23, 25 and 26 in sequence.

Compaction level 3 is used when portions of a record repeat the corresponding portions of a prior record and the three control bits, 110, are used to shift into level 3. In level 3, one bit represents four characters or one control bit, thus assuming a number base 1/16. A single 0 bit is inserted into the bit string to identify this condition, and further 0 bits are inserted as long as the condition exists and thus warrants. To shift from this level, and from the number base 1/16, a single 1 bit is inserted into the bit string and, upon so doing, a change to the number base 2 takes place where one bit represents one character or one control bit. A single 1 bit releases the compaction from the base 2.

As an example of use of level 3, and separate and apart from the continuing example considered thus far, assuming 11 characters in a row are identical to the prior record, the bit string produced would be 110 001 0001. Separation of the bit string is used to show the control bits (110), the representation to the base 1/16 (001) to represent eight identical characters and a shift from level 3, and the representation at base 2 (0001), representing the three additional characters and a release from base 2, as will be explained further hereinafter.

A second example of use of level 3, again separate and apart from the continuing example set forth above, is the situation where only two characters are identical. The bit string produced would be 110 1 001. Again, separation of the bit string is used to show the control bits and the data representation. Since there are no groups of four, only a single control bit is used in base 1/16, to change number bases in level 3. The remaining portions of the bit string (001) represent the two characters and the exit from base 2, level 3, as again will be explained further hereinafter.

Returning to the continuing example on the four records set forth above, it had been found that the first six characters of the second record were identical to the first six characters of the prior and first record, i.e. L through and including O. Utilizing step 22 of FIG. 2, the compaction according to the present invention sets up the data as a single 0, which indicates four characters identical to the prior record, and then sets up a 1, step 23, indicating that no further groups of four characters are identical to the prior record. Setting up the one control bit in step 23 causes the system to shift to base 2, level 3, step 25, where the system sets up a bit string 001 to represent the two remaining characters not yet compacted and a one to shift back to the control level, step 26. Thus, the six identical characters have now been indicated by one bit at level 3, base 16, representing four characters, and two bits at level base 2, representing two characters, along with two ontrol bits representing the various number base ifts.

At this point, the bit string representing the compaction output of the present invention for record two is:

| 11001001 |
|----------|
| 6L3      |

The notation "6L3" indicates that six characters ave been replaced by a single level three code.

Figure 2:
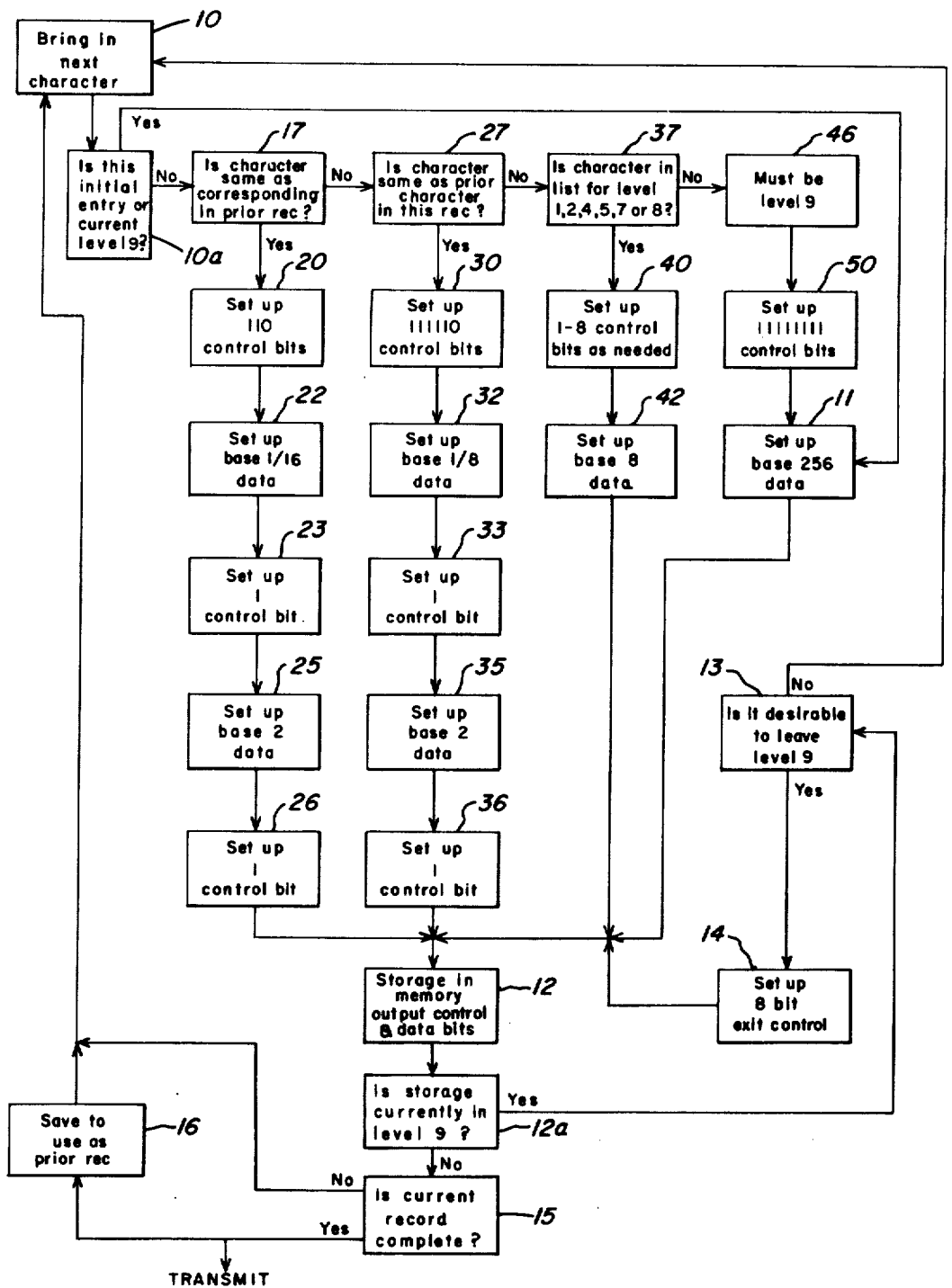
FIG. 2 shows a block diagram of a system according to the present invention.
Figure 4:
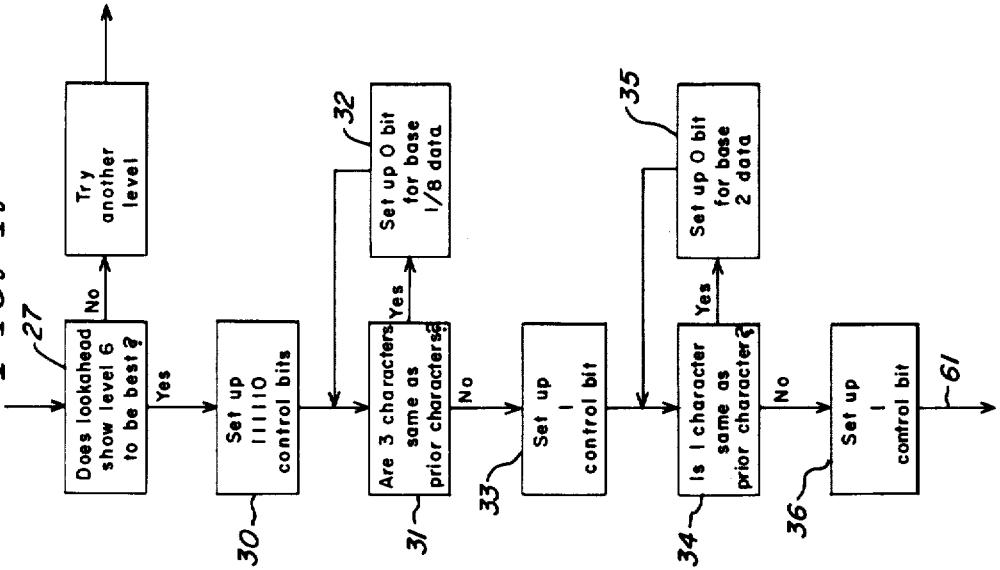
FIGS. 3 to 6 show block diagrams further explaining the block diagram of FIG. 2.

The system according to FIG. 2 would then traverse ep 12, 12a 15, and return to step 10.

The next data character in the continuing example is which is a level 1 character and is handled in that anner. That is, the system traverses steps 10a, 17, 27, 7, 40, 42, 12, 12a, 15, and returns to step 10. The bit ring output is 0001 representing a one bit control de of 0 and a three bit data code, in base 8, indicating at 2 is the second character in position in the assignent of level 1.

The next four characters of the second record starting with the blank and ending with the open parenthesis e identical to the four characters in the identical sition in the prior record. Again, level 3 is used and e system traverses steps 10, 10a, 17, 20, 22, 23, 25, 5, 12, 12a, 15, and back to step 10. The bit string tput is 110011 to include the control code for level 3 10) the representation that one group of four is prent in level 3 (0), the shift to base 2 (1), and the immeate shift out of base 2 since there are no leftover aracters (1).

indicate that this condition exists, and further 0 bits are inserted as long as the condition exists and warrants. Release from level 6, base ⅛ is by a single one bit inerted into the bit string. Again, similarly with base 1/16, the release from base ⅛ is always into number base 2 where one bit represents one character or one control bit. In number base 2, again, a single 0 bit is inserted so long as the condition exists, and a single 1 bit produces an exit from number base 2.

Returning to continuing example where eight data characters, all D exist in record two, the bit string produced would be 111110 001 001. Separation is used here to show the control bits (111110), the data in base ⅛ (001), and the data in base 2 (001). Thus, for the above example of eight identical characters, the level 6, base ⅛ information includes two zeros indicating two sets of three characters identical, a 1 to exit from level 6 and base ⅛, two further zeros to indicate two remainder characters exist in base 2, and a 1 to exit from base 2.

Thus, for the eight identical characters D the system according to the present invention traversed steps 10, 10a, 17, 27, 30, 32, 33, 35, 36, 12, 12a, 15, and returned to step 10.

The final data character in the second record is a close parenthesis, which as discussed above, is a level 7 character. This character causes the system to then traverse steps 10, 10a, 17, 27, 37, 40, 42, 12, 12a, 15, and return to step 10 to generate a bit string of 1111110111 representing the control code for level 7 and the three bit positional code for close parenthesis.

At this point, the bit string produced by the compaction according to the present invention of record two consisting of "LINE 02 = (DDDDDD)" is:

| 11001001 | 0001 | 110011 | 1110010 | 111110001001 | 1111110111 |
|----------|------|--------|---------|--------------|------------|
| 6L3      | 2    | 4L3    | D       | 8L6          | )          |

The next character of record two of the continuing ample is D. This character is a level 4 character and handled in a manner previously explained to produce bit string of 1110010, to include the control code for vel 4 (1110) and the base 8 positional information dicating the letter D is the third positional letter in vel 4 (010).

At this point, the compaction for record two for the ta "LINE 02 = (D" is:

| 11001001 | 0001 | 110011 | 1110010 |
|----------|------|--------|---------|
| 6L3      | 2    | 4L3    | D       |

Starting again at step 10 of FIG. 2 and with the conuing example, the next eight data characters are all , and therefore are the same as the prior character in e current and second data record. Thus, the system averses steps 10, 10a, and 17 and descends from step 7 into steps 30 and following to set up level 6 according to Table I.

Compaction in level 6 is used when a string of identi- l characters exists in the same record. Six control bits 11110 are used to compact in level 6, and entry into vel 6 assumes a number base ⅛ or a situation where e bit represents three characters or one control bit. single 0 bit is then inserted into the bit string to The notation "8L6" indicates that eight characters have been replaced by a single level six code.

The compaction provided by the present invention with respect to record two may now be discussed. In record two, further compaction was possible in that it was possible to utilize both the prior record and the prior character masks according to the present invention. Thus, record two, as set forth above, includes 21 characters, which at eight bits per character as conventionally encoded, would result in a bit string of 168 bits. As can be seen from the final compaction of record two, through the utilization of the teachings of the present invention, this 168 bit string has been compacted to 47 bits. Further, both records one and two have created a mask which may be utilized in further compacting succeeding records.

Returning again to the data example set out above, the third record is then ready to be brought into compactor 54 by coder 88. As can be visually seen in the simple example given, the first six characters of the third record are identical to the first six characters of the second record already processed. That is, from L to and including O, the records are identical for the first six locations in the prior record. Thus, compaction according to the present invention would proceed from step 10 of FIG. 2, through step 10a, as previously described, and stop at step 17 where it is found that a character is the same as a corresponding character in a prior record. The system then proceeds to step 20 where a three bit control code for level 3 is set up.

At this point record three is complete. The total compacted output for record three is:

| 11001001 | 0111 | 110011 | 1111110100 | 1111101001 | 11010001 | 10111 |
|----------|------|--------|------------|------------|----------|-------|
| 6L3      | 3    | 4L3    | Y          | 2L6        | 3L3      | T     |
|          |      |        | 111110101  | 1101001    |          |       |
|          |      |        | 1L6        | 2L3        |          |       |

From Table I, this control code is 110. The system then proceeds to step 22 and the remaining steps 23, 25, and 26 in sequence.

The next data character in the continuing example is 3, which is a level 1 character and is handled in that manner. That is, the system traverses steps 10a, 17, 27, 37, 40, 42, 12, 12a, 15, and returns to step 10. The bit string output is 0111 representing a one bit control code of 0 and a three bit data code, in base 8, indicating that 3 is the eighth character in position in the assignment of level 1.

The next four characters of the third record starting with the blank and ending with the open parenthesis are identical to the four characters in the identical position in the prior record. Again, level 3 is used and the system traverses steps 10, 10a, 17, 20, 22, 23, 25, 26, 12, 12a, 15, and back to step 10. The bit string output is 110011 to include the control code for level 3 (110) the representation that one group of four is present in level 3 (0), the shift to level 2 (1), and the immediate shift out of level 2 since there are no leftover characters (1).

The next character of record three of the continuing example is Y. This character is a level 7 character and is handled in a manner previously explained to produce a bit string of 1111110100, to include the control code for level 7 (1111110) and the base 8 positional information indicating the letter Y is the fifth positional letter in level 7 (100).

At this point, the compaction for record three for the data "LINE 02 = (Y" is:

| 11001001 | 0111 | 110011 | 1111110100 |
|----------|------|--------|------------|
| 6L3      | 3    | 4L3    | Y          |

The next two characters in the continuing example are both Y. Since these characters are the same as the prior characters, a single level six output of 1111101001 is generated, in the manner previously explained.

The next three characters in the example are all D. Since these characters are the same as in the prior, second record, a single level three output of 11010001 is generated, in the manner previously explained.

The next character is the continuing example is a T. This character is a level 2 character and an output of 10111 is generated, in the manner previously explained.

The next character in the continuing example is also a T, but this is the same as the prior character of the present record, and a level 6 output of 111110101 is generated, in the manner previously explained.

The next two characters in the continuing example are D). Since these two characters are the same as in the prior, second record, a level 3 output of 1101001 is generated, in the manner previously explained.

The compaction provided by the present invention with respect to record three may now be discussed. In record three, further compaction was possible in that it was possible to utilize both the prior record and the prior character masks according to the present invention. Thus record three, as set forth above, includes 21 characters, which at eight bits per character as conventionally encoded, would result in a bit string of 168 bits. As can be seen from the final compaction of record three, through the utilization of the teachings of the present invention, this 168 bit string has been compacted to 67 bits. Further, record three has created a mask which may be utilized in further compacting succeeding records.

Record four is handled in much the same manner as the first three records, discussed above, until the characters of the semicolen, the colen, the number sign, and the question mark are reached. These four characters are used in the present description to represent level 9 logic. Although these four characters are often printable characters, the vast majority of level 9 logic characters are not printable characters.

Compaction level 9 is thus a no-compaction mode. In some instances, all of the 256 possible bit combinations are used even though most are not printable characters and therefore each of the eight bits are passed along as exactly received in the number base 256. It is also this mode of operation which guarantees that any string of characters, no matter how unusual or unprintable, can be correctly transmitted through the compactor, even though some combinations could cause an increase in record size. This level is entered by the use of control bits 11111111 and therefore the first such character in a contiguous string produces a bit string 11111111NNNNNNNN. Once in this mode of operation, eight specific control bits (11111111) are also required to leave the level.

Returning again to the data example set out above, the fourth record is then ready to be brought into compactor 54 by controller 88. As can be visually seen in the simple example given, the first six characters of the fourth record are identical to the first six characters of the third record already processed. That is, from L to and including O, the records are identical for the first six locations in the prior record. Thus, compaction according to the present invention would proceed from step 10 of FIG. 2, through step 10a, as previously described, and stop at step 17 where it is found that a character is the same as a corresponding character in a prior record. The system then proceeds to step 20 where a three bit control code for level 3 is set up. From Table I, this control code is 110. The system then proceeds to step 22 and the remaining steps 23, 25, and 26 in sequence.

The next data character in the continuing example is 4, which is a level 2 character and is handled in that manner. That is, the system traverses steps 10a, 17, 27, 37, 40, 42, 12, 12a, 15, and returns to steps 10. The bit string output is 10010 representing a two bit control code of 10 and a three bit data code, in base 8, indicating that 4 is the third character in position in the assignment of level 2.

The next four characters of the fourth record starting with the blank and ending with the open parenthesis are identical to the four characters in the identical position in the prior and third record. Again, level 3 is used and the system traverses steps 10, 10a, 17, 20, 22, 23, 25, 26, 12, 12a, 15, and back to step 10. The bit string output is 110011 to include the control code for level 3 (110) the representation that one group of four is present in level 3 (0), the shift to level 2 (1), and the immediate shift out of level 2 since there are no leftover characters (1).

The next character of record four of the continuing example is ";". This character is a level 9 character and is not contained in the levels 1, 2, 4, 5, 7, or 8. Therefore it must be a level 9 character, as is shown by reaching step 46 of FIG. 2. The control bits 11111111, which signal an entry to level 9, are generated in step 50. The noncompacted input value for ";" which is 01011110 is also generated and transmitted.

At this point the compacted output from record four "LINE 04 = (;" is:

| | | | | |
|---|---|---|---|---|
| 11001001 | 10010 | 110011 | 11111111 | 01011110 |
| 6L3 | 4 | 4L3 | 9 entry | ; |

The notation "9 entry" indicates the control bits which cause an entry to level 9. This is then followed by the level 9 character, as provided to the system of the present invention.

The next character in the continuing example is a ":". This is also a level 9 character, so the compactor will remain in level 9. At the time of the last character a test was made, in step 13, to determine the desirability of leaving level 9. A lookahead was done, as will be explained further hereinafter, and if the next three characters were all nonlevel 9 characters, a level 9 exit code would have been generated. This is not the case in the present continuing example; so the compactor remains in level 9 until three characters in a row are nonlevel 9 characters, or until the record is finished. In this case the record finishes first, so the remaining characters are handled in level 9.

At the end of record four the compacted code for "LINE 04=(::#?)" is:

| | | | | |
|---|---|---|---|---|
| 11001001 | 10010 | 110011 | 11111111 | 01011110 |
| 6L3 | 4 | 4L3 | 9 entry | ; |
| 01111010 | 01111011 | 01101111 | 01011101 | 11111111 |
| : | No. | ? | ) | 9 exit |

The compaction provided by the present invention with respect to record four may now be discussed. In record four again, in compaction, it was possible to utilize both the prior record and the prior character masks according to the present invention. Thus record four as set forth above, includes 16 characters, which at eight bits per character as conventionally encoded, would result in a bit string of 128 bits. As can be seen from the final compaction of record four through the utilization of the teachings of the present invention, this 128 bit string has been compacted to 75 bits. Further record four has created a mask which may be utilized in further compacting succeeding records.

Compaction for the total example may now be examined. The following table shows the results for the four record example:

| Record | Length in bits non-compacted | Length in bits compacted | Ratio |
|---|---|---|---|
| 1 | 104 | 94 | 1.11 |
| 2 | 168 | 47 | 3.57 |
| 3 | 168 | 67 | 2.51 |
| 4 | 128 | 75 | 1.71 |
| Total | 568 | 283 | 2.01 |

It can then be seen that a substantial improvement has taken place. Although no claim is made that this example is typical data, it is data for which most currently used techniques are useless. It may also be seen that the ratio of record one may be disregarded since after one initial record the compactor may run for long periods of time with each record masking from the record ahead. Record four is also nontypical due to the unusual amount of special characters contained to illustrate a point. In general, commonly transmitted data would resemble records two and three, with similar results, but would be more compactible due to large areas of blanks in a typical printed page.

Once the continuing example and the discussion presented thus far is understood, a discussion and explanation of the present invention may be continued, first with respect to FIGS. 2–6.

As has now basically been explained, FIG. 2 is a block diagram generally showing the logic created in the matrix to select the number base and the control level in going from one number base to another, and to select the control level in going from one number base to another. As each character is read into the mechanism, it is stored in a temporary buffer and compaction on the record is performed in the manner shown generally in FIG. 2. The compacted data is then transmitted while new data is being read into the device, and as each record is completed, it is saved to be used as the prior record mask.

Compaction of the data always starts at level 9, and under the worst conditions or when necessary to maintain compatibility with other equipment, this level will continue to be used. Normally, a shift into the control level is made, and the control level, as explained earlier, uses from one to eight control bits to call out various compaction levels. As also explained earlier, the control strings are arranged so that frequently used compaction levels require a small number of control bits to reach, and infrequently used compaction levels require a large number of bits to reach.

To recapitulate and expand, in FIG. 2, assuming the compaction process to begin in level 9, another character is brought into the matrix at step 10 and, upon comparison at step 10a, a data string is created. The data string is created, as at step 11, under the base 256, and the data is stored in an output buffer, step 12. For a more detailed description of operation according to the present invention, reference is made to FIG. 6. The output storage buffer 12 has its output compared in step 12a to determine if storage is currently in level 9 and if it is, then comparison is made to the next character coming in at step 13a where it is compared to see if level 9 is the least desirable, and if the answer is no, another character is brought in, in level 9, and is applied to the output storage in the fixed code. However, if it appears that level 9 is the least desirable, another comparison is made at step 13b to determine if the compatibility allows a level other than 9, and again if the answer is no, another character is brought in, at level 9. Once it is determined that it is desirable to leave level 9 at step 13, an eight bit exit control code (11111111) is generated at step 14 and applied to output storage buffer 12. Once it is determined that level 9 is no longer desirable, the next character being brought into the matrix at step 10a will then be applied to one of the character groups to determine how it may be compacted. Thus far, the current record is complete as found in step 15 which produces a mask, step 16, resulting from saving the record.

Figure 3:
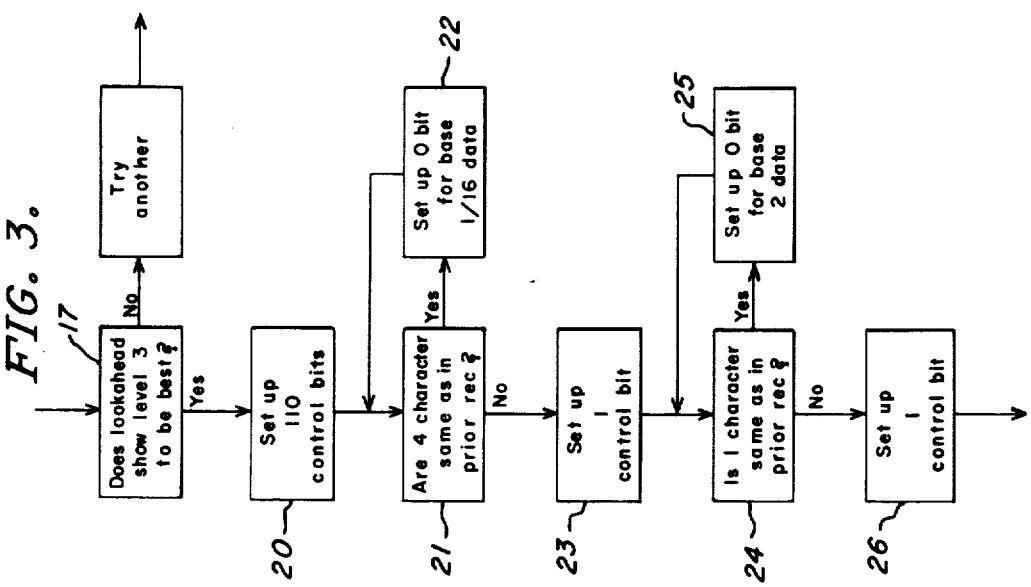
Figure 6:
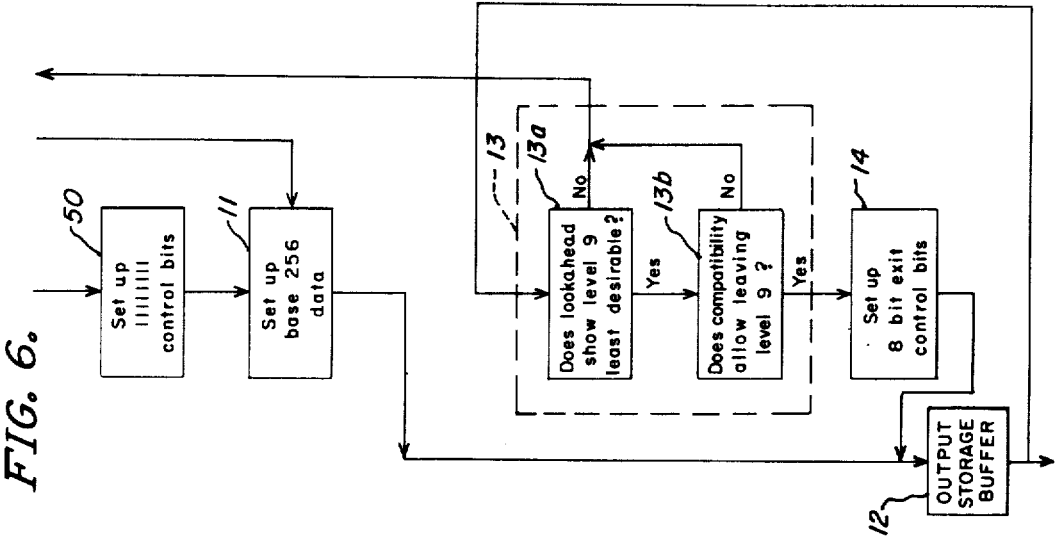

Since the matrix is now operating at some level other than level 9, the next character is compared at step 17 and if the character is the same as in the corresponding prior record, a control code of 110 control bits is established at step 20. FIG. 3 shows a more detailed disclosure of the steps performed by the matrix where a comparison is made at step 21 to determine if there are four characters the same as in the prior record, and if there are, the characters are encoded where one bit represents four characters or one control bit, to the base 1/16 as established in step 22. If there are less than four characters or there is a remainder, a single one bit is inserted into the bit string by generating a signal of such in step 23, and the remainder is then encoded in the number base 2 where one bit represents one character or one control bit as found in step 24. As long as there is a remainder, a 0 bit is established for each character as in step 25 until the comparison at step 24 produces no further characters being the same as in the prior record and a control bit is generated at step 26 to produce an exit code from the base 2. These bits are then stored in the output buffer, step 12, with the control remaining in the control level, and the matrix is now ready to receive another character.

Assuming at this point that, within the record, a number of identical characters exist and are brought in at steps 10 and 10a, the matrix will recognize the string of identical characters by a comparison, step 27, and 111110 are generated by a step 30. These six control bits are used to shift into level 6 which is shown in more detail in FIG. 4. A comparison is made at step 31 to determine if there are three characters the same as a prior character, and if they are, the characters are encoded by having one bit represent three characters or one control bit and are encoded in the base ⅛ as found in step 32. A 0 bit is inserted in the bit string to indicate the three characters and the remainder is encoded at a different base, by first inserting a single 1 as a control bit into the bit string in step 33. The remainder is compared to determine if one character is the same as the prior character, and if it is, it is encoded in the number base 2 in step 35 where one bit is used to represent that one character. Once the remainder is encoded and there is no additional character which is the same as the prior character, a single 1 bit is generated to develop a control bit at step 36 causing the matrix to return its operation to the control level. It will also be understood that the characters are stored in the output buffer, step 12, and the matrix is then ready to receive additional characters.

Figure 5:
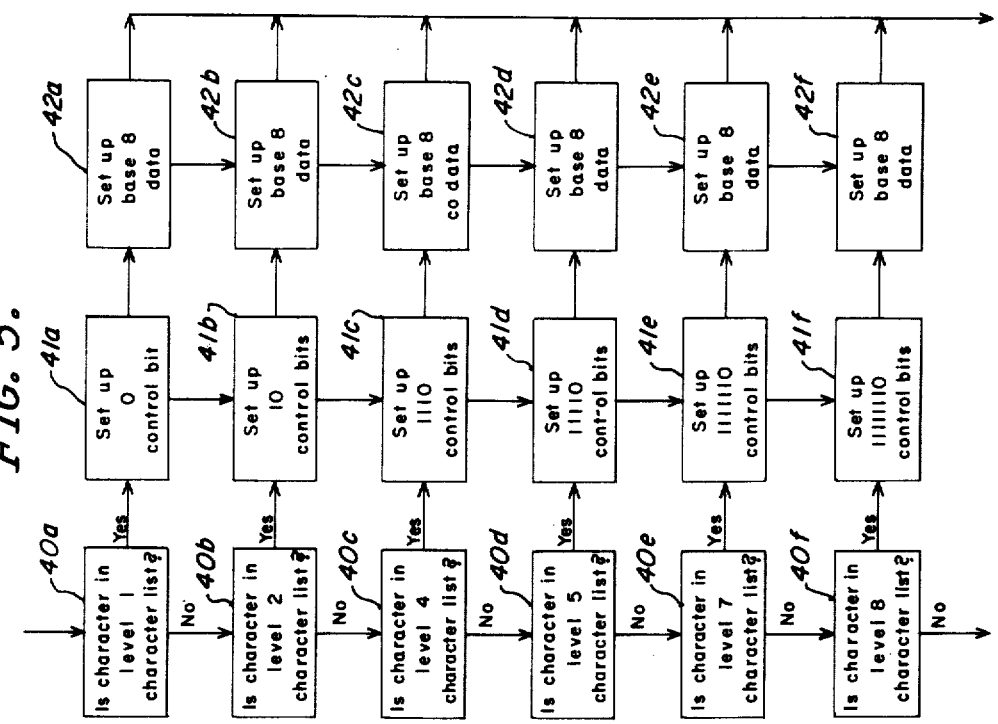

After completing the two steps of compaction, 17 and 27, just described without obtaining a "yes" output, a comparison is then made of the characters to determine in which of the groups for levels 1, 2, 4, 5, 7 and 8 the characters belong, as established in step 37. Reference is made to FIG. 5 for a more detailed disclosure of the steps in which characters are grouped in levels 1, 2, 4, 5, 7 and 8. Assuming the next character is compared to those of the group to be stored in level 1 at step 40a, a control level signal represented by a 0 bit is generated at step 41a, and the character is encoded by three bits expressed in the number base 8 as found in step 42a, with the data being stored in the output buffer, step 12. After compaction of a single character, return to the control level is automatic and requires no control bits to return operation to the control level.

Compaction at level 2 is identical to that established for level 1 except a comparison is made at step 40b, and if the character is found to exist in the group established for level 2, control bits 10 are generated in step 41b, and the character is then encoded by three bits expressed in the number base 8 as found in step 42b, with the data being stored in the output buffer 12. After compaction of the character, return to the control level is automatic and again requires no control bits to return the operation to the control level.

The operation is the same for establishing a compaction for levels 4, 5, 7 and 8 in that the control code is first established and then the character is encoded to the base 8 code.

Returning again to FIGS. 2 and 6, upon finding that a character, upon comparison, does not become encoded at one of the bases which is less than the fixed base such as base 256, the character will appear as a level 9 character as shown in step 46. Because the character is found to exist while in a control level rather than at the level 9, and further not being compactible, control bits 11111111 are encoded at a step 50 which permits the character to be encoded in the fixed base 256 as found in step 11 and stored in the output buffer, step 12, in the fixed base code rather than being compacted.

Lookahead may now be explained, i.e. the feature of the present invention which attempts to assure that the shifting of Levels, as from Table I, would result in an advantageous result on compaction.

In the continuing example, only a very simple form of lookahead was used, in order to simplify the explanation. The form used was to enter levels 3 and 6 if a single character appeared which could be expressed in those levels. Likewise, when in level 9, the test to determine desirability of leaving level 9 and entering the control level was to read ahead three characters, and if none of these three would cause a reentry to level 9, it was desirable to leave level 9.

In some cases it is desirable to use a more complex lookahead technique. This technique uses lookahead to determine the advisability of entering levels 3 or 6, and also the advisability of leaving level 9. Although this requires some logic to implement, the overall efficiency of the compactor is higher if it is used.

Table II shows the logic required to perform the more complex lookahead function relating to entering levels 3 and 6 as well as the lookahead function relating to leaving level 9 to enter the control level. A comparison is made to the total control and character bits required to enter the control level with the total of the bits required to represent the characters in the noncompacted mode or base 256, and where the number of bits is less to enter the appropriate level, the shift is made to levels 3 or 6. When in level 9 and the number of control bits to leave level 9, including the eight plus the number required to shift to one of the eight levels, is less than the expression in the base code 256, the control mode is entered.

TABLE II

Lookahead Logic

Where:
Current char = N
Prior char in same record = N−1
Next char in same record = N+1
Same char in prior record = M = Mask
Not required to stay in = (≠)
Logic to enter Level 3 (from control level)

|  | Absolute control level of N | | | | | | |
|---|---|---|---|---|---|---|---|
|  | 1 | 2 | 4 | 5 | 7 | 8 | 9 |
| N = M | N | N | Y | Y | Y | Y | Y |
| (N = M) and (N+1 = M+1) | Y | Y | Y | Y | Y | Y | Y |

Logic to enter Level 6 (from control level)

|  | Absolute control level of N | | | | | | |
|---|---|---|---|---|---|---|---|
|  | 1 | 2 | 4 | 5 | 7 | 8 | 9 |
| N = N−1 | N | N | N | N | Y | Y | Y |
| (N = N−1) and (N = N+1) | N | Y | Y | Y | Y | Y | Y |
| (N = N−1) and (N = N+1) and (N = N+2) | Y | Y | Y | Y | Y | Y | Y |

Logic to leave Level 9 (to enter control level)

|  | Absolute control level of N | | | | | | |
|---|---|---|---|---|---|---|---|
| Not req'd to stay in | 1 | 2 | 3 | 4 | 5 | 6 | 7 | 8 |
| N ≠ Level 9 | N | N | N | N | N | N | N | N |
| +N+1 ≠ Level 9 | N | N | Y | N | N | N | N | N |
| +N+2 ≠ Level 9 | N | N | Y | N | N | Y | N | N |
| · N+3 ≠ Level 9 | Y | Y | Y | N | N | Y | N | N |
| + N+4 ≠ Level 9 | Y | Y | Y | Y | Y | Y | N | N |
| + N+5 ≠ Level 9 | Y | Y | Y | Y | Y | Y | Y | Y |

Within Table II, the letter N under a numerical column represents the decision "NO." Similarly, within Table II, the letter Y under a numerical column represents the decision "yes." Outside of the Table and numerical columns, N is defined as the current character. As an example of the complex lookahead function as set forth by Table II, the effect on the continuing example will now be considered assuming the complex lookahead had been used.

With respect to the initial entry of record 1, the entry was in level 9 as explained above. Since this first character, L, would normally have been treated as a level 5 character, by Table I, the complex lookahead logic will be controlled by the logic of the Table II under the heading "Logic to leave level 9." Under "Absolute control level of N," the column 5, and following down the column until the first Y is encountered, the minimum condition which makes it desirable to leave level 9 is found, i.e. that N, N+1, N+2, N+3, and N+4 must all be nonlevel 9 characters. Although this is a more stringent requirement than the simple lookahead used in the continuing example, the result would have been the same and the system would leave level 9, as in the continuing example.

The only part of the continuing example which would have changed had the complex lookahead been used would have been the second character T in record 3. Using the simple lookahead, this character was encoded as a single level 6 character, which was then expressed as 111110101. If the complex lookahead had been used, the logic would have controlled, according to Table II, and particularly under the heading "Logic to enter level 6." Since the character T is a level 2 character according to Table I, the logic according to column for "Absolute control level of N" equal to 2 would control. The first condition, i.e. of the character being equal to the prior character, is met, but that is not sufficient to enter level 6 according to the complex lookahead. A second condition, as seen from Table II that the following character D also be equal to the prior character T, is not met, and level 6 is not entered, the character T is coded as a level 2 character of 10111. This encoding would then be four bits shorter than the bit string provided using the simple lookahead. The rest of the example would have remained as illustrated.

It is then assumed that the foregoing detailed explanation and example of compaction according to the present invention has been read, followed, and understood.

Based upon this detailed explanation and example of compaction according to the present invention, decompaction according to the present invention can now be explained. Since, as can now be explained, decompaction is the inverse of compaction, the following explanation of decompaction will place reliance upon the previous detailed explanation and example of compaction and thus attempt to avoid unnecessary repetition of mere detail. For clarity, the continuing example compacted above will be decompacted according to the present invention.

As shown and described with respect to FIG. 1, a compaction device is located on the receiving end of the transmission line E. Each compaction device contains both a compaction and a decompaction section. Only one of these sections is used at a given time and which is used depends on the direction of the data transmission at that time. The receiving or decompaction section of the compactor is actually much simpler than the transmitting or compaction section of the compactor. That is, the transmitting section of the compactor, of necessity, requires decisions as to what compacted code is to be generated, and how, while the receiving section of the compactor has a much simpler job, and all that is required of the receiving section of the compactor is to decompact the code received in a mechanical fashion. The receiving section of the compactor has no choices to make in the matter of what compaction level is used or what coding is used. Also, because the decompaction section of the compactor performs operations which are merely inverse of the operations on the data performed by the transmitting section of the compactor, no separate block diagram has been provided for the decompaction section of the compactor, as FIG. 2 with only minor explanatory adjustments, also represents decompaction according to the present invention.

Referring again to FIG. 2, the decompaction section of the compactor brings in the next character at step 10 just as explained above with respect to the compaction section of the compactor. The character brought in is in whatever data base is conventionally used by the system, assumed for the sake of the continuing example to be in base 256 and include eight bits. Again, this decompaction section of the system assumes an initial entry currently in level 9, step 10a.

With succeeding characters, as will be explained further hereinafter, the steps of FIG. 2 are traversed in an identical manner to that set forth with respect to compaction; however, the procedure is inverse to that of compaction. That is, if the character is not in level 9, step 17 is used to recognize the control bits 110 indicating that the character is the same as the corresponding character in the prior record. If such a condition is found to exist, the system proceeds to step 22, but inversely. That is, the system recognizes the number of 0 bits, which indicate the number of repetitive characters, as discussed in detail above, and the system will store this information until step 23 is reached and the system recognizes the 1 control bit which separates the base 1/16 data from the base 2 data. In a similar fashion, the system stores the number of characters represented by the zeros in base 2, and finally recognizes the single 1 control bit which terminates the level 3 compaction, as represented by steps 17, 20, 22, 23, 25, and 26.

At this time, the system, from the prior record mask, is aware of the position in the prior record of the characters corresponding to the characters currently transmitted, the number of characters in the prior record corresponding to the data currently transmitted, and stores this information in memory, step 12, and likewise transmits the data, except in the case of decompaction, instead of transmitting the data onto a transmission line, it is transmitted to whatever apparatus it is desirous of receiving the data or to the line controller interface at the receive end of the transmission line.

Again, assuming operation not in level 9, steps 12a, 15, and 16 are traversed and the system returns to step 10. Again, the only difference between compaction and decompaction at this stage is that each time a new character is brought in, step 10, it is brought in from the communications line, in the case of decompaction, and each time data is transmitted out, in the case of decompaction, it is transmitted via the controller side FIFO and then to the line controller, as seen in FIGS. 7 and 1. The inverse operation of decompaction according to the present invention can now be recognized.

In a similar manner, if step 17 is traversed and the system finds that, in step 27, the character currently operated upon is the same as a prior character in the current record, the compacted data is decompacted via steps 27, 30, 32, 33, 35 and 36 in an exactly analogous manner to that set forth above with respect to step 17, 20, 22, 23, 25, and 26. The system then again returns to step 10 via steps 12, 12a, 15, and 16.

Similarly, if steps 17 and 27 are traversed and the system finds that a character currently operated upon is in a level 1, 2, 4, 5, 7, or 8, as by step 37 and Table I, the data is decompacted by first recognizing the control code, as will be explained further hereinafter, and decoding the data base stored in memory to find the corresponding eight bit, base 256, full data representation corresponding to the compacted data base received, in a manner inverse to that explained previously with respect to FIGS. 2 and 5.

Similarly, if steps 17 and 27 and 37 are traversed and the system finds no control code match, the only possible control code left is level 9 entry code, 11111111, as recognized in steps 46 and 50. The data is then decompacted by deleting the entry code, step 50, and recognizing the level 9 data, step 11. Step 12 then follows, but step 12a is omitted as unnecessary in the decompact mode since the decompaction, as discussed above, has no decisional responsibilities. The system then traverses steps 15, 16, 10 and returns to step 10a.

When the current level 9 condition exists, however, step 13 follows step 10a, rather then step 11. If the character being operated upon is not an exit code, then step 11 follows step 13. If, however, it is discovered in step 13 that the character currently operated upon is a level 9 exit code, 11111111, the decompaction portion of the system and apparatus according to the present invention next proceeds to step 14, where this exit code is deleted, and returns to step 10, where the control code search begins again.

Thus, with respect to a situation where the system is in level 9, the system traverses steps 10, 10a, and 13. If an exit code is found, the system next traverses step 14 and returns to step 10. If no exit code is found, the system next traverses steps 11, 12, 15, 16 and returns to step 10.

Thus, in steps 17, 27, 37, and 46, the control bits representing these levels of control are recognized, since these control bits are nonambiguous, and there is no possible way that these control bits may be misrepresented.

Returning to the continuing example compacted hereinbefore, the decompaction compactor begins, as set out immediately above, just as the compaction compactor, in level 9 or a noncompacted level. The first character received from the communication line is a 11010011. Since this character is in level 9, it traverses steps 10, 10a, 13, and 11, and is stored and provided to the output at step 12 exactly as it exists since the above code is a noncompacted representation of the letter L. The system then traverses steps 15, 16, and returns to step 10 where the next character, eight bits, is received. This next character is 11111111 which is a representation of a level 9 exit code. The system the recognizes this level 9 exit code in step 13, deletes it in step 14, and returns to step 10 where the system returns to control level.

Now that the system is in a control level, upon bringing in the next character, the system has no advance manner of predicting how long this character may be. Therefore, the system begins receiving the incoming data one bit at a time until the first 0 bit is encountered. The number of bits which the system has read, including the 0 bit, defines the level of the character to follow. In any case, the character following is then expressed via the next three data bits. Thus, it can now be seen and appreciated that the control bits are nonambiguous and there is no possible manner in which they may be misinterpreted.

Thus, the first control code after the level 9 exit code received from the first record, as compacted above, is 1110, which describes the character as a level 4 character. The system would then traverse steps 10, 10a, 17, 27, and 37 of FIG. 2 and steps 40a, 40b, 40c, 41c, and 42c of FIG. 5, but in an inverse fashion. That is, once the character has been recognized as a level 4 character, the three bits following the control code are 100, which step 42c recognizes as the fifth character on that level, which may be seen from Table I to be the letter I.

At this point the system brings in the next bit string in the manner hereinbefore described. This bit string, from the continuing example set out above, includes the bits 1110, defining level 4, and the three following bits, 111, define the eighth character in level 4, which is the letter N.

The next bit string received from the line includes the initial bits 10 which define level 2. These control bits are followed by bits 011 which define the fourth character in level 2, which is the letter E.

The next bit string received begins with a 0, which defines level 1, and is followed by the three bit code 011, which defines the fourth character in level 1, or a blank.

The next bit string received from the line begins with 0 which, again, defines level 1, and this bit is followed ׳ the three bit bit strings 000 which defines the first ıaracter in level 1, or a 0.

The next bit string received from the line again starts ıth the 0, which indicates level 1, and is followed by e bit string 010 which indicates the third character in vel 1, which is the number 1.

The next bit string received from the line in the con ıuing example is a 0, which again indicates level 1, ıd is followed by the three bit bit string 011, which dicates the fourth character in level 1, which is a ank.

The next bit string received from the line includes the ts 11111110, which indicates level 8, and this bit ring is followed by the three bit bit string 001 which dicates the second character in level 8, which is an ıuals sign.

The next bit received from the line is a 0 which, ;ain, indicates level 1. This 0 control code is followed y the three bit bit string 011, which again, from Table indicates a blank.

The next bit string received from the line in the con nuing example is 1111110, which indicates level 7, ıd is followed by the three bit bit string 110, which ıdicates an open parenthesis.

The next bit string received from the line includes the its 11110, which indicate level 5, and is followed by ıe three bit bit string 001, which indicates the letter B.

The next bit string received from the line includes the its 1111110, which indicate the level 7, and this is ıllowed by the three bit bit string 111, which indicate close parenthesis.

As can now be seen, decompaction according to the resent invention has now taken place for the entire rst record of the continuing example set forth above, nd this decompaction has been performed with no mbiguities and no problems in completely restructur ıg the original data from the compacted code sent cross communication line E of FIG. 1. Again, as ex lained above with respect to compaction, after ecompaction has taken place, each character of this ıcord was sent to the controller side FIFO 66 as it was ecompacted for transmission to the controller side onverter 56 in a normal eight bit noncompacted ıode. This can be seen with reference to FIGS. 1 and . Also, via the storage of record 1, as in step 12, a prior ıcord mask has been created for use in following re ords.

Next, examining record 2 of the continuing example s compacted above, and continuing in the control ıvel since a level 9 character has not occurred, the bit tring for the first character received is 110, which ıdicates level 3. The next bit received is a 0 which ıdicates that four characters are included in record 2 nd are the same as the similarly positioned four char cters taken from the mask created by the prior record. ˙he next bit received is a 1 which indicates that this ondition no longer exits, i.e. that the next four charac ɛrs in record 2 are not the same as in the prior record. ˙o this point, the level 3 decompaction logic has oper ted in a base 1/16, and with the receipt of the 1 indi ated above, the system shifts into number base 2.

The next bit received is a 0 which indicates that one haracter is the same as the similarly positioned char cter in the prior record. The next character received is lso a 0, which similarly indicates that an additional character of record 2 is identical and the same as the similarly positioned character in record 1.

The next bit received is a 1 which indicates the com pletion of the string in base 2 and that a total of six characters of record 2 are identical to similarly posi tioned characters in the prior record, record 1.

As each bit of the above bit string in level 3 and level 2 have been received and decoded, the appropriate characters which are represented by this string, as indi cated above, are extracted from the data memory 94, as shown in FIG. 7, where the conventional eight bit code for the characters was stored as received from the previous record, record 1. These decoded, decom pacted, conventionally represented eight bit characters are then sent to controller side converter 56 for provi sion to line controller B of FIG. 1.

Keeping in mind that the system is yet in the control level, the next bit received is a 0 which indicates a level 1 character, and the next three incoming bits of 001 indicate that this character is the number 2.

The next bit string received is 110, indicating level 3, followed by a single 0 bit indicating that four characters are the same in the prior record. The succeeding bit is a 1, terminating the base 1/16 data, followed by an other 1 indicating immediate termination of the base 2 data. Thus, a total of four characters of record 2 are indicated as identical or the same in as similarly posi tioned characters of the prior record, record 1.

The next bit string received is 1110, indicating level 4, followed by 010, indicating the letter D.

The next bit string received in 111110, indicating level 6. This bit string is received and interpreted as a level 6 control code, whereupon the system enters the base ⅛ decompaction logic.

In base ⅛, the next bit entering the system is a 0, which indicates that three characters of the current record 2 are the same as the prior character, and the compaction logic extracts this prior character from memory in a conventional eight bit encoding, and transmits this character to controller side converter 56, three times.

The next bit received is a 0, which indicates that three additional characters are the same as the last four characters received, and the decompaction logic again transmits the last character received to controller side converter 56 in conventional eight bit format, three times, as indicated above.

The next bit received is a 1, which terminates the base ⅛ control and causes the decompaction logic to shift into base 2, as explained hereinbefore with respect to compaction.

The next bit received is a 0 which indicates that one additional character of the current record is the same as the prior character received, and again the system and apparatus according to FIG. 7 provides the con ventionally encoded prior character to controller side converter 56.

The next bit received is again a 0, which indicates that an additional character of record 2 is the same as the prior character.

The next bit received is a 1, thus terminating the base 2 representation and the control in level 6. Thus, the decompaction according to the present invention has indicated that eight characters were the same as the prior character received.

The next bit string received from the line is 1111110, indicating a level 7 character, followed by the bit string 111, which indicates a closed parenthesis.

At this point, record 2 has been completely received, decompacted, and transmitted to controller side converter 56. Also, the system, as explained hereinbefore, has generated and stored the record mask for record 2.

Continuing with decompaction according to the present invention and treating record 3, and again noting that the compaction system according to the present invention is yet in the control level, the first bit string received is 11001001 which indicates, according to level 3, that six characters exist in record 3 which are identical or the same as six characters identically positioned in the prior record, record 2.

The next bit string received is 0111, which indicates level 1 and the number 3, in the manner hereinbefore described.

The next bit string received is 110011, which indicates that four characters exist in record 3 which are identical or the same as four similarly positioned characters in record 2, in the manner previously explained.

The next bit string received is 1111110100, which indicates level 7 and the letter Y.

The next bit string received is 1111101001, which indicates that two additional characters exist in record 3 which are identical or the same as the preceding character of record 3, with the control of the system in level 6.

The next bit string received is 11010001, which indicates three characters of record 3 are identical or the same as three similarly positioned characters in the prior record received, record 2, with the control in level 3.

The next bit string received is 10111, which according to level 2, is the letter T.

The next bit string received is 111110101, which according to level 6, indicates one character identical with a prior character.

The next bit string received is 1101001 which indicates two characters of the current record 3 are identical or the same as two characters identically positioned in the prior record 2, with the control in level 3. As explained hereinbefore, the characters are then extracted from memory and transmitted, and this completes record 3.

Decompacting record 4 and again noting that the system according to the present invention is yet in the control level, the first bit string received is 11001001, which indicates, according to level 3, that six characters of the fourth record are identical or the same as six characters in a corresponding position in the previous record 3.

The next bit string received is 10010 which, according to level 2, is the number 4.

The next bit string received is 110011 which, according to level 3, indicates that four characters are again identical in the current record 4 to identically position characters in the prior record 3.

The next bit string received is 11111111, which is a level 9 entry code. This level 9 entry code is not stored and transmitted, according to the previous explanation, but rather is used by the compactor according to the present invention to force the decompaction side to enter level 9 decompaction.

The next bit string received is taken in an eight bit grouping rather than bit by bit since the system is now in level 9. This next eight bit grouping is 01011110, which is the noncompacted code for a semicolon.

The next eight bit grouping is 01111010, which is not a level 9 exit code, and thus is transmitted as a noncompacted code for a colon.

The next eight bit grouping is 01111011, which again is not a level 9 exit code, and thus is transmitted as a noncompacted code for the number sign.

The next eight bit grouping is 01101111, which again is not a level 9 exit code, and thus is transmitted as a noncompacted code for a question mark.

The next eight bit grouping is 01011101, which again is not a level 9 exit code, and thus is transmitted as a noncompacted code for a closed parenthesis. Note that although the closed parenthesis is not normally a level 9 character, since it has been assigned to level 7, it was transmitted in level 9 and it is also received in level 9. The receiving compactor has no way of knowing what the true level of this character is because it was forced into level 9 and has not been released from level 9.

The next eight bit grouping received is 11111111 and this is a level 9 exit command, which the compactor does not send to the controller side converter 56 but uses in a control fashion to return to the control level. At this point, record 4 has been completed.

Thus, the complete compaction and decompaction of four records has been shown in detail as an illustrative embodiment of operation according to the present invention. With this explanation and operation in mind, an explanation of an alternate method and apparatus according to the present invention may be explained.

It has been found that the maximum effectiveness of compaction according to the present invention is related to minimum width of data which may be conveniently handled by the compactor according to the present invention. For explanation and description thus far, it has been assumed that the compactor hardware was capable of handling the compacted data on a bit by bit basis, and thus a minimum data width basis. This approach generally yields the maximum compaction possible, as it allows the compactor to match the probability of occurrence quite closely with the length in bits of compacted data generated.

However, to compact and decompact data on a one bit minimum data slice or width basis does require substantial speed in the hardware of the compactor. It thus may be desirable to utilize a degraded technique for compaction according to the present invention, as by utilizing a minimum data slice or width of either two bits or four bits. It has been found that use of such an increased slice or data width will generally reduce the ratio of compaction somewhat, but this technique will also reduce the necessary hardware speed and cost by a much large amount. Conversely, use of an increased data slice or data width according to the present invention will allow any given set of compactor hardware to run at a much higher line and interface speed.

After considerable study and effort, it has been found that the hardware configuration, as shown and described in relation to FIGS. 15–26 and setting forth the preferred embodiment of a commpactor according to the present invention is currently the most practical for a mass produced product. It has also been determined that this hardware according to the present invention will support a communications line speed of 2400 bits per second (bps) if a single bit minimum slice is used, as described above. It has further been found that, by using a minimum bit slice of two bits, the compactor, as described above and as will be described, will support a communications line speed of 4800 bps with only a 7% loss in compaction efficiency. It has still further been found that by using a minimum bit slice of four bits the same compactor described will support a line speed of 9600 bps with an average loss of only 17% in compaction efficiency.

Therefore, demand for higher line speeds in communications oriented application has dictated using a four bit minimum data slice at present rather than the originally described one bit minimum data slice. This change to a four bit data slice only affects the internally generated bit strings described in detail above and the method and apparatus described above are in no way altered. Therefore, in order to illustrate that this change to a four bit minimum data slice affects only the compacted bit strings produced but does not affect the basic apparatus or techniques according to the present invention, as described, the same continuing example of four records will again be explained in detail using a four bit minimum data slice.

The first alteration, to reflect use of four bits instead of one bit, is to Table I. Table I must then be redefined to reflect the fact that certain number bases can not be used and that certain definitions, utilizing only one bit, are no longer possible. That is, using a four bit minimum data slice of necessity reduces the total number of numbers available by a substantial amount. Normally the only number bases available would be base 16 (4 bits) an base 256 (8 bits). However a number bases 0 has been defined, to represent the condition where no bits of data are present. This may be used only where a level contains only one character or situation and needs no further definition. This level could have been used with the one bit slice but was not needed. Likewise for levels 3 and 6, since a minimum of 4 bits must be read, they may then represent from 1 to 16 characters.

The result of the above is that while fewer number bases are used, more control levels are needed to maintain compaction efficiency. This may readily be seen in the following Table III, which is Table I redefined for a preferred four bit data slice approach. Similarly the block flow diagram for the four bit minimum data slice is shown in FIG. 8, which similarly is FIG. 2 redefined for a preferred four bit data slice approach.

TABLE III

| Control Level Codes | | | Characters |
|---|---|---|---|
| 0000 | Shift to level | 1 | 0 |
| 0001 | '' | 2 | 2 |
| 0010 | '' | 3 | characters identical to prior record |
| 0011 | '' | 4 | 1 |
| 0100 | '' | 5 | (blank) |
| 0101 | '' | 6 | characters identical to prior characters |
| 0110 | '' | 7 | 5 |
| 0111 | '' | 8 | . |
| 1000 | '' | 9 | 7 |
| 1001 | '' | 10 | 3 |
| 1010 | '' | 11 | 8 |
| 1011 | '' | 12 | 6 |
| 1100 | '' | 13 | 4 |
| 1101 | '' | 14 | E9A-TRCDSI0,NPBF |
| 1110 | '' | 15 | GMKLUHV*/Y& ()J=X |
| 1111 | '' | 16 | No Compaction Mode |
| Level 3 Codes (base 16) | | | |
| NNNN | | | This four bit code represents the number of characters identical to corresponding characters in the prior record. Value may be from 1 to 16 where the number of characters is equal to NNNN+1. |
| Level 6 Codes (base 16) | | | |
| NNNN | | | This four bit code represents the number of characters identical to the prior character. Value may be from 1 to 16 where the number of characters is equal to NNNN+1. |
| Level 1, 2, 4, 5, 7, 8, 9, 10, 11, 12, 13 Codes (base 0) | | | |
| | | | These levels have no data bits as each level contains only one character and that is inherent in the level. |
| Level 14, 15 Codes (base 16) | | | |
| NNNN | | | This four bit code is a base 16 character to represent 1 of 16 characters in the level. |
| Level 16 Codes | | | |
| NNNNNNNN | | | This eight bit code is a base 256 character to represent 1 of 256 characters in the level. |
| 11111111 | | | One specific base 256 character designated for shift to control level. |

Applying this Table III and the four bit data slice to the four records set out above, it can be seen that the same method and apparatus apply.

For convenience, the four records to be used as examples are again set out below:
LINE 01 = (B)
LINE 02 = (DDDDDDDDD)
LINE 03 = (YYYDDDTTD)
LINE 04 = (:;#?)

Turning to the example, data is in FIFO 66, and as soon as the first entire eight bit character has been shifted through the FIFO 66 and is available via data connection 68 at the eight bit output shift register 70, coder 88 will access this character and begin to operate the compacting logic which is stored in the instruction memory or the micro code 92. In the case of the above set out example, the first character to be brought in is an L from the word "LINE." As can be seen from Table III, L is a member of level 15 compaction logic. Therefore with reference to FIG. 8, the mechanism and process of compaction, according to the present invention, is to bring in the next character, step 10, and then to check to see if the character brought in is an initial entry, step 10a. Since, in the example set out, the letter L is an initial entry, the mechanism and process, according to the present invention, then proceeds to set up this character without compaction, step 11, and to transmit the data bits to modem side FIFO, step 12. For this example, it is assumed that the logical representation of the letter L is 11010011 in a conventional base 256 system.

Specifically with respect to FIG. 7, it can be seen that coder 88 transmits the eight bits representing the letter L, by grouping them in groups of four bits and transmitting them via data connection 86 into the four bit shift register 100 on the modem side FIFO stack 102. As each four bits is provided to the FIFO 102 via data connection 93 from the input shift register 100, it assumes a data position at the bottom of modem side FIFO stack 102 where it is then shifted via data connection 104 into the four bit output shift register 106. As each clock signal comes in from the modem clock line 118, through converter 114, and via connection 108 one bit at a time is shifted out of register 106 and onto the transmit data line 110. As each four bits of the data is provided to the data line 110, the next four bits, which are waiting in the modem side FIFO stack 102, are then shifted into the four bit shift register 106.

Similarly, and again with respect to FIG. 7, as the data is provided by a data connection 86 to the four bit shift register 100, it is simultaneously provided to memory 90 to be stored in data memory 94 in the location equivalent to its distance from the start of the record. At the end of the record, the entire record is saved to provide a comparison mask for the next record, as has been explained hereinbefore. This storage of each character of the record also allows a comparison mask for the next characters, as has also been described hereinbefore.

Returning again to FIG. 8, the compaction according to the present invention now continues by checking if the system is currently in level 16 and if it is desirable to leave level 16. Since the system is in level 6 in the example started above and because level 6 is an uncompacted level, the next compaction step is to see if it is desirable to leave level 16, step 13. Since the data character currently being operated upon, i.e. L, is not a level 16 character, but a level 15 character according to Table III and the next three characters "INE" are also not level 16 characters according to Table III, it is desirable to leave level 16, and the logic then sets up the eight bit exit control code 11111111, step 14. This eight bit exit control code allows the system to leave level 16 and enter the control level of the appropriate compaction logic, for the next character.

The system then proceeds through steps 12 and 12a. At step 12a, since the control bits have been set to leave level 16, the storage is not currently in level 16, and progress is made to step 15. At step 15 the system checks to see if the current record is complete. Since it is not complete, as only the first letter has been entered, the system stores the character just processed, L into data memory 90 and proceeds back to step 10, to bring in the next character.

As indicated in step 10, the compacter then accesses the next data character, seen from the example given to be the letter I from the word "LINE". This letter is then in the form of an eight bit logic output from register 70. The system then again checks to see if this letter I is an initial entry or if the system is currently in level 16, step 10a. Since the system has progressed out of level 16, the answer is no, and the system progresses to step 17 of FIG. 8. Since the letter I the character currently operated upon, is not the same as the corresponding character in a prior record, since it is assumed that there is no prior record, and the system progresses to step 27. Since the letter I in the example given is not the same as the previous letter operated upon, the letter L, the system progresses to step 37.

The letter I is indicated by Table III as a level 14 character, so the system progresses to step 40 where necessary control bits are set up, specifically a four bit sequence consisting of 1101. The compaction logic then proceeds to step 42 where the base 16 data is set up. In this case, for the letter I, the base 8 data 1001, the binary code indicating that the letter I is the tenth position in the level 14 table. The system then continues through the process of transmitting the character, of storing the character in the data memory, and to preparing to bring in the next character, steps 12a, 12, 15, and back to 10.

Compaction level 14 requires four control bits to reach and four bits to express the character, because the expression is in number base 16. The compaction of a single character then produces a bit string 1101NNNN where the 1101 form the control bits and the NNNN are the four bits to identify one of the possible sixteen characters in level 14. From Table III, the characters represented by level 14 are:

E 9 A - T R C D S I O, N P B F

Returning again to the continuing example, the next character brought in is the letter N from the "LINE", which also has been assigned by the preferred embodiment of the compaction system and apparatus of the present invention to level 14. This character also traverses step 10, 10a, 17, and 27, and is operated upon in step 37 in a manner explained previously. Therefore, the same control logic produces the same set of control bits. However, this time the sixteen bit data portion is now 1100 to indicate that the letter N is in the thirteenth position in the level 14 table.

The system then repeats progress through steps 12, 12a, and 15, and back to step 10, as previously explained.

To this point, the output from the compaction since the compactor was entered and including the level 16 character and the level 16 exit control, and for the exemplary data entered, i.e. "LIN," is:

| 11010011 | 11111111 | 11011001 | 11011100 |
|---|---|---|---|
| L | 16 exit | I | N |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

Continuing with the example, the next data character brought into the controller is the letter E, the last letter from the word "LINE." This character also traverses step 10, 10a, 17, and 27, and is operated upon in step 37 in a manner explained previously. The E is assigned to level 14, by the preferred embodiment of the compaction technique and apparatus found in Table III, and therefore a four bit control code of 1101 is set up and this four bit control string is followed by a four bit data string of 0000 indicating that the letter E is the first entry in the table.

The system then repeats progress through steps 12, 2a, and 15, and back to step 10, as previously explained.

At this point the total output according to the comaction of the data "LINE" from the compaction acording to the present invention is:

| 11010011 | 11111111 | 11011001 | 11011100 | 11010000 |
|---|---|---|---|---|
| L | 16 exit | I | N | E |

The above presentation has been spaced for illustrave and explanatory purposes only. It will be recognized that spaces do not appear during actual transmission. Likewise, the characters represented by the biary bit string, and appearing below the bit string, are et out for purposes of explanation and illustration nly.

The next data character brought into the system is a lank, between the word "LINE" and the remaining ata. This character also traverses step 10, 10a, 17, and 7, and is operated upon in step 37 in a manner exlained previously. The blank is found in level 5, of able III, and therefore produces a four bit control ode of 0100 which is not followed by any data bits as is the only position in level 5 of Table III.

Compaction in level 5 requires four control bits to ach. No bits are used to express the data as the blank the only character contained in level 5. Therefore the ompaction of a blank produces a bit string 0100.

The system then repeats progress through steps 12, 2a, and 15, and back to step 10, as previously explained.

The next exemplary character brought in by the oder 88 is a 0. This character also traverses step 10, 0a, 17, and 27, and is operated upon in step 37 in a ianner explained previously. Since the 0 is found in vel 1, as discussed above, the operation is similar to at of the preceding character with the exception that e four control bits are 0000 to indicate the only level character, which is the 0.

The system then repeats progress through steps 12, 2a, and 15, and back to step 10, as previously explained.

The next data character brought in in the example is and again the operation is similar to that previously plained since the 1 is found in level 4. The only difrence is in the four control bits 0011 which indicate e single level 4 character, which is 1.

The next exemplary character brought in by the oder 88 is a "blank." This character also traverses ep 10, 10a, 17, and 27, and is operated upon in step 7 in a manner explained previously. The "blank," in e manner explained above, produces a compacted de of 0100.

At this point, the total output from the compaction cording to the present invention for the portion of e example assumed compacted thus far, i.e. "LINE " is

| 1010011 | 11111111 | 11011001 | 11011100 | 11010000 |
|---|---|---|---|---|
| L | 16 exit | I | N | E |
| 0100 | 0000 | 0011 | 0100 | |
| blank | 0 | 1 | blank | |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

The next data character brought in according to the example set forth above is an equals sign. This character also traverses step 10, 10a, 17, and 27, and is operated upon in step 37 in a manner explained previously. The equals sign is found in level 15, and therefore produces four bits of control code logic 1110, followed by four bits of data 1110, to indicate that the equals sign occupies the fifteenth position of level 15.

Compaction in level 15 is identical in operation to compaction in level 14, except for the characters represented. The compaction of a single character produces a bit string 1110NNNN where the 1110 are the control bits and the NNNN are the four bits to identify one of the sixteen possible characters in this group in the number base 16. The sixteen characters represented by level 15 according to the preferred embodiment of the present invention are:

GMKLUHV*/Y&()J=X

The next exemplary character brought in by controller 88 is also a blank, and the compaction logic produces an output of 0100 in the identical manner to the previous blank discussed.

The next character brought in by control logic 88 is an open parenthesis and this character has been assigned to level 15 by the preferred embodiment according to the present invention.

Thus, the open parenthesis character from the example produces a four bit control code of 1110 and a four bit data code 1011 indicating that the open parenthesis occupies a twelfth position, in order, in the characters assigned to level 15.

At this point, the total logical output from the compacter for the example data "LINE 01 = (" is:

| 11010011 | 11111111 | 11011001 | 11011100 | 11010000 |
|---|---|---|---|---|
| L | 16 exit | I | N | E |
| 0100 0000 | 0011 0100 | 11101110 0100 | 11101011 | |
| blank 0 | 1 blank | = blank | ( | |

The above presentation has been spaced for illustrative and explanatory purposes only. It will be recognized that spaces do not appear during actual transmission. Likewise, the characters represented by the binary bit string, and appearing below the bit string, are set out for purposes of explanation and illustration only.

The system then repeats progress through steps 12, 12a, and 15, and back to step 10, as previously explained.

The next data character in the example is B. This character also traverses step 10, 10a, 17, and 27, and is operated upon in step 37 in a manner explained previously. From Table III, B has been assigned, according to the preferred embodiment of the present invention, to level 14.

Thus, the B next brought in by controller 88 produces a control code of 1101 and a four bit data code of 1110 indicating its fifteenth position in the character string represented by th assigned level 14.

The system then proceeds through steps 12, 12a, 15, and back to step 10, as previously explained.

The final character in the first record of the example set out above is a close parenthesis. The close parenthesis falls in level 15, according to Table III. Thus this character, in the manner previously set out, produces a logical output 11101100 with the four bit control code of 1110 discussed above and the four bit data code of 1100 indicating the position of the close parenthesis as the thirteenth position of level 15.

At this point the total compacter output for the first record of "LINE 01 = (B)" is:

| 11010011 | 11111111 | 11011001 | 11011100 | 11010000 | 0100 | 0000 | 0011 | 0100 |
|---|---|---|---|---|---|---|---|---|
| L | 16 exit | ) | N | E | blank | 0 | 1 | blank |
|  | 11101110 | 0100 | 11101011 | 11011110 | 11101100 |  |  |  |
|  | = | blank | ( | B | ) |  |  |  |

To this point in the explanation of the present invention, only character level compaction has been performed. That is, no step 17 or step 27 compaction, as set forth in FIG. 8, has been performed; only step 37 compaction has been performed. The compaction performed, however, has reduced a record which was initially 104 bits in length to 92 bits. That is, the first record of "LINE 01 = (B)" consists of 13 characters and with a conventional representation of eight bits per character, would represent a total of 104 bits. From the total compaction output set forth above, it can be seen that only 92 bits are used to represent this data record, previously to the present invention conventionally represented by 104 bits.

The above set out compaction of the first record has contained the overhead of the exit code for leaving level 16 and has also established a prior record mask which allows greater compaction in following records. The prior record mask is stored at the end of compaction upon the first record, where step 12 is traversed, step 12a is traversed, and the system traverses step 15.

The test for record completion, step 15, is totally dependent on the type of terminal hardware with which the system of the present invention interfaces. Some terminals transmit only one record per transmission block, and the end of a record is an actual halt of data transmission. For simplicity, this is assumed to be the case for the example of this description. Other terminals, however, use special characters or sequences of characters to indicate the end of a record has occurred, and this allows multiple records to be transmitted and packed into a single transmission block. If this later technique were to be used, the compactor passes the special characters or sequences of characters along in a compacted form in the manner of ordinary data, but logic is arranged at step 15 to recognize these special characters or sequences of characters that separate the records, and thus allow each record to be used as a prior record mask.

As can be seen, since the record is now complete, it is transmitted and also saved, as in step 16, for use which can now be explained.

Returning again to the data example set out above, the second record is then ready to be brought into compacter 54 by coder 88. As can be visually seen in the simple example given, the first six characters of the second record are identical to the first six characters of the first record already processed. That is, for L to and including O, the records are identical for the first six locations in the prior record. Thus, compaction according to the present invention would proceed from step 10 of FIG. 8 through step 10a, as previously described, and stop at step 27 where it is found that a character is the same as a corresponding character in a prior record. The system then proceeds to step 20 where a four bit control code for level 3 is set up. From Table III, this control code is 0010. The system then proceeds to step 22.

Compaction level 3 is used when portions of a record repeat the corresponding portions of a prior record and the four control bits, 0010, are used to shift into level 3.

In level 3, a 4 bit count represents from 1 to 16 characters which were the same as in the prior record. The 4 bit count is expressed as a base 16 data, with 0000 representing a count of 1, 0001 a count of 2, 0010 a count of 3, 0011 a count of 4, and so on up to 1111 which represents a count of 16.

Returning to the continuing example on the four records set forth above, it had been found that the first six characters of the second record were identical to the first six characters of the prior and first record, i.e. L through and including O. Utilizing step 22 of FIG. 8, the compaction according to the present invention sets up the data as a 0101, which indicates six characters identical to the prior record.

At this point, the bit string representing the compaction output of the present invention for record two is:

| 00100101 |
|---|
| 6L3 |

The notation "6L3" indicates that six characters have been replaced by a single level three code.

The system according to FIG. 2 would then traverse step 12, 12a, 15, and return to step 10.

The next data character in the continuing example is 2, which is a level 2 character and is handled in that manner. That is, the system traverses steps 10a, 17, 27, 37, 40, 42, 12, 12a, 15, and returns to step 10. The bit string output is 0001 representing a four bit control code for level 2 which contains only the character 2.

The next four characters of the second record starting with the blank and ending with the open parenthesis are identical to the four characters in the identical position in the prior and first record. Again, level 3 is used and the system traverses steps 10, 10a, 17, 20, 22, 12, 12a, 15, and back to step 10. The bit string output is 00100011 to include the control code for level 3 (0010) and a character count of 4 (0011).

The next character of record two of the continuing example is D. This character is a level 14 character and is handled in a manner previously explained to produce a bit string of 11010111.

At this point, the compaction for record two for the data "LINE 02 = (D" is:

| 00100101 | 0001 | 00100011 | 11010111 |
|---|---|---|---|

| | | | |
|---|---|---|---|
| 6L3 | 2 | 4L3 | D |

Starting again at step 10 of FIG. 8 and with the continuing example, the next eight data characters are all D, and therefore are the same as the prior character in the current and second data record. Thus, the system traverses steps 10, 10a, and 17 and descends from step 27 into steps 30 and following to set up level 6 according to Table III.

Compaction in level 6 is used when a string of identical characters exists in the same record. Four control bits 0101 are used to compact in level 6, and entry into level 6 causes generation of a 4 bit (base 16) character count, which expresses that from 1 to 16 characters are the same as the prior character.

Returning to continuing example where eight data characters, all D exist in record two, the bit string produced would be 0101 0111. Separation is used here to show the control bits (0101), and the data in base 16 (0111).

Thus, for the eight identical characters D the system according to the present invention traversed steps 10, 10a, 17, 27, 30, 32, 12, 12a, 15, and returned to step 10.

The final data character in the second record is a close parenthesis, which as discussed above is a level 15 character. This character causes the system to then traverse steps 10, 10a, 17, 27, 37, 40, 42, 12, 12a, 15, and return to step 10 to generate a bit string of 11101100 representing the control code for level 15 and the four bit positional code for close parenthesis.

At this point, the bit string produced by the compaction according to the present invention of record two consisting of "LINE 02 = (DDDDDDDDD)" is:

| 00100101 | 0001 | 00100011 | 11010111 | 01010111 | 11101100 |
|---|---|---|---|---|---|
| 6L3 | 2 | 4L3 | D | 8L6 | ) |

The notation "8L6" indicates that eight characters have been replaced by a single level six code.

The compaction provided by the present invention with respect to record two may now be discussed. In record two, further compaction was possible in that it was possible to utilize both the prior record and the prior character masks according to the present invention. Thus, record two, as set forth above, includes 21 characters, which at eight bits per character as conventionally encoded, would result in a bit string of 168 bits. As can be seen from the final compaction of record two, through the utilization of the teachings of the present invention, this 168 bit string has been compacted to 44 bits. Further, both records one and two have created a mask which may be utilized in further compacting succeeding records.

Returning again to the data example set out above, the third record is then ready to be brought into compactor 54 by coder 88. As can be visually seen in the simple example given, the first six characters of the third record are identical to the first six characters of the second record already processed. That is, from L to and including O, the records are identical for the first six locations in the prior record. Thus, compaction according to the present invention would proceed from step 10 to FIG. 2, through step 10a, as previously described, and stop at step 17 where it is found that a character is the same as a corresponding character in a prior record. The system then proceeds to step 20 where the four bit control code for level 3 is set up. From Table III, this control code is 0010. The system then proceeds to step 22 and generates a character count of 0101.

The next data character in the continuing example is 3, which is a level 10 character and is handled in that manner. That is, the system traverses steps 10a, 17, 27, 37, 40, 42, 12, 12a, 15, and returns to step 10. The bit string output is 1001 representing a four bit control code of 1001 which represents the character 3 as the only character in level 10.

The next four characters of the third record starting with the blank and ending with the open parenthesis are identical to the four characters in the identical position in the prior and second record. Again, level 3 is used and the system traverses steps 10, 10a, 17, 20, 22, 12, 12a, 15, and back to step 10. The bit string output is 00100011 to include the control code for level 3 (0010) and the character count for 4 characters (0011).

The next character of record three of the continuing example is Y. This character is a level 15 character and is handled in a manner previously explained to produce a bit string of 11101001, to include the control code for level 15 (1110) and the base 16 positional information indicating the letter Y is the tenth positional letter in level 15 (1001).

At this point, the compaction for record three for the data "LINE 02 = (Y" is:

| 00100101 | 1001 | 00100011 | 11101001 |
|---|---|---|---|
| 6L3 | 3 | 4L3 | Y |

The next two characters in the continuing example are both Y. Since these characters are the same as the prior characters, a single level 6 output of 01010001 is generated, in the manner previously explained.

The next three characters in the example are all D. Since these characters are the same as in the prior, second record, a single level 3 output of 00100010 is generated, in the manner previously explained.

The next character is the continuing example is a T. This character is a level 14 character and an output of 11010100 is generated, in the manner previously explained.

The next character in the continuing example 5 is also a T, but this is the same as the prior character of the present record, and a level 6 output of 01010000 is generated, in the manner previously explained.

The next two characters in the continuing example are D). Since these two characters are the same as in the prior, second record, a level 3 output of 00100001 is generated, in the manner previously explained.

At this point record three is complete. The total compacted output for record three is:

| 00100101 | 1001 | 00100011 | 11101001 | 01010001 | 00100010 | 11010100 |
|----------|------|----------|----------|----------|----------|----------|
| 6L3      | 3    | 4L3      | Y        | 2L6      | 3L3      | T        |
|          |      |          |          | 01010000 | 00100001 |          |
|          |      |          |          | 1L6      | 2L3      |          |

The compaction provided by the present invention with respect to record three may now be discussed. In record three, further compaction was possible in that it was possible to utilize both the prior record and the prior character masks according to the present invention. Thus record three, as set forth above, includes 21 characters, which at eight bits per character as conventionally encoded, would result in a bit string of 168 bits. As can be seen from the final compaction of record three, through the utilization of the teachings of the present invention, this 168 bit string has been compacted to 68 bits. Further, record three has created a mask which may be utilized in further compacting succeeding records.

Record four is handled in much the same manner as the first three records, discussed above, until the characters of the semicolon, the colon, the number sign, and the question mark are reached. These four characters are used in the present description to represent level 16 logic. Although these four characters are often printable characters, the vast majority of level 16 logic characters are not printable characters.

Compaction level 16 is thus a no-compaction mode. In some instances, all of the 256 possible bit combinations are used even though most are not printable characters and therefore each of the eight bits are passed along as exactly received in the number base 256. It is also this mode of operation which guarantees that any string of characters, no matter how unusual or unprintable, can be correctly transmitted through the compactor, even though some combinations could cause an increase in record size. This level is entered by the use of control bits 1111 and therefore the first such character in a contiguous string produces a bit string 1111NNNNNNNN. Once in this mode of operation, eight specific control bits (11111111) are also required to leave the level.

Returning again to the data example set out above the fourth record is then ready to be brought into compactor 54 by controller 88. As can be visually seen in the simple example given, the first six characters of the fourth record are identical to the first six characters of the third record already processed. That is, from L to and including O, the records are identical for the first six locations in the prior record. Thus, compaction according to the present invention would proceed from step 10 of FIG. 2, through step 10a, as previously described, and stop at step 17 where it is found that a character is the same as a corresponding character in a prior record. The system then proceeds to step 20 where a four bit control code for level 3 is set up. From Table III, this control code is 0010. The system then proceeds to step 22 and generates a character count of 0101.

The next data character in the continuing example is 4, which is a level 13 character and is handled in that manner. That is, the system traverses steps 10a, 17, 27, 37, 40, 42, 12, 12a, 15, and returns to step 10. The bit string output is 1100 representing a four bit control code for level 13 which contains only the character 4.

The next four characters of the fourth record starting with the blank and ending with the open parenthesis are identical to the four characters in the identical position in the prior and third record. Again, level 3 is used and the system traverses steps 10, 10a, 17, 20, 22, 12, 12a, 15, and back to step 10. The bit string output is 00100011 to include the control code for level 3 (0010) and a character count of 4 (0011).

The next character of record four of the continuing example is ";". This character is a level 16 character and is not contained in the levels 1, 2, 4, 5, 7, 8, 9, 10, 11, 12, 13, 14, or 15. Therefore it must be a level 16 character, as is shown by reaching step 46 of FIG. 8. The control bits 1111, which signal an entry to level 16, are generated in step 50. The noncompacted input value for ";" which is 01011110 is also generated and transmitted.

At this point the compacted output from record four "LINE 04 = (;" is:

| 00100101 | 1100 | 00100011 | 1111 | 01011110 |
|----------|------|----------|------|----------|
| 6L3      | 4    | 4L3      | 16 entry | ; |

The notation "16 entry" indicates the control bits which cause an entry to level 16. This is then followed by the level 16 character, as provided to the system of the present invention.

The next character in the continuing example is a ":". This is also a level 16 character, so the compactor will remain in level 16. At the time of the last character a test was made, in step 13, to determine the desirability of leaving level 16. A lookahead was done, as was explained hereinbefore, and if the next three characters were all nonlevel 16 characters, a level 16 exit code would have been generated. This is not the case in the present continuing example; so the compactor remains in level 16 until three characters in a row are nonlevel 16 characters, or until the record is finished. In this case the record finishes first, so the remaining characters are handled in level 16.

At the end of record four the compacted code for "LINE 04 = (::#?)" is:

| 00100101 | 1100 | 00100011 | 1111 | 01011110 |
|----------|------|----------|------|----------|
| 6L3      | 4    | 4L3      | 16 entry | ; |
| 01111010 | 01111011 | 01101111 | 01011101 | 11111111 |
| :        | No.  | ?        | )        | 16 exit  |

The compaction provided by the present invention with respect to record four may now be discussed. In record four again, in compaction, it was possible to utilize both the prior record and the prior character masks according to the present invention. Thus record four as set forth above, includes 16 characters, which at eight bits per character as conventionally encoded, would result in a bit string of 128 bits. As can be seen from the final compaction of record four through the utilization of the teachings of the present invention, this 28 bit string has been compacted to 72 bits. Further record four has created a mask which may be utilized in further compacting succeeding records.

Compaction for the total example may now be examined. The following table shows the results for the four record example:

| Record | Length in bits non-compacted | Length in bits compacted | Ratio |
|---|---|---|---|
| 1 | 104 | 92 | 1.13 |
| 2 | 168 | 44 | 3.82 |
| 3 | 168 | 68 | 2.47 |
| 4 | 128 | 72 | 1.78 |
| Total | 568 | 276 | 2.06 |

It can then be seen that a substantial improvement has taken place. Although no claim is made that this example is typical data, it is data for which most currently used techniques are useless. It may also be seen that the ratio of record one may be disregarded since after one initial record the compactor may run for long periods of time with each record masking from the record ahead. Record four is also nontypical due to the unusual amount of special characters contained to illustrate a point. In general, commonly transmitted data would resemble records two and three, with similar results, but would be more compactible due to large areas of blanks in a typical printed page.

Once the continuing example and the discussion presented thus far is understood, a discussion and explanation of the present invention with regard to the four bit data slice may be continued, with respect to FIGS. 8 and 3–6.

Also, although in this particular example the alternate, 4 bit minimum data slice version achieved slightly more compaction than the optimal, one bit minimum data slice version, this would not normally occur on larger samples of more typical data. The alternate version may normally be expected to produce a 17% longer bit stream than the optimal version.

As has now basically been explained, FIG. 8 is a block diagram generally showing the logic created in coder/decoder 88 to select the number base and the control level in going from one number base to another, and to select the control level in going from one number base to another. As each character is read into the mechanism, it is stored in a temporary buffer and compaction on the record is performed in the manner shown generally in FIG. 8. The compacted data is then transmitted while new data is being read into the device, and as each record is completed, it is saved to be used as the prior record mask.

Compaction of the data always starts at level 16, and under the worst conditions or when necessary to maintain compatibility with other equipment, this level will continue to be used. Normally, a shift into the control level is made, and the control level, as explained earlier, uses four control bits to call out various compaction levels. As also explained earlier, the control strings are arranged so that frequently used compaction levels require a small number of data bits to express, and infrequently used compaction levels require a large number of bits to express.

To recapitulate and expand, in FIG. 8, assuming the compaction process to begin in level 9, another character is brought into the matrix at step 10 and, upon comparison at step 10a, a data string is created. The data string is created, as at step 11, under the base 256 and the data is stored in an output buffer, step 12. For a more detailed description of operation according to the present invention, reference is made to FIG. 6. The output storage buffer 12 has its output compared in step 12a to determine if storage is currently in level 16 and if it is, then comparison is made to the next character coming in at step 13a where it is compared to see if level 16 is the least desirable, and if the answer is no, another character is brought in, in level 16, and is applied to the output storage in the fixed code. However, if it appears that level 16 is the least desirable, another comparison is made at step 13b to determine if the compatibility allows a level other than 16, and again if the answer is no, another character is brought in, at level 16. Once it is determined that it is desirable to leave level 16 at step 13, an eight bit exit control code (11111111) is generated at step 14 and applied to output storage buffer 12. Once it is determined that level 16 is no longer desirable, the next character being brought into the matrix at step 10a will then be applied to one of the character groups to determine how it may be compacted. Thus far, the current record is complete as found in step 15 which produces a mask, step 16, resulting from saving the record.

Since the matrix is now operating at some level other than level 16, the next character is compared at step 17 and if the character is the same as in the corresponding prior record, a control code of 0010 control bits is established at step 20. A four bit character count is then generated at step 22. These bits are then stored in the output buffer, step 12, with the control remaining in the control level, and the matrix is now ready to receive another character.

Assuming at this point that, within the record, a number of identical characters exist and are brought in at steps 10 and 10a, the matrix will recognize the string of identical characters by a comparison step 27 and 0101 are generated by a step 30. These four control bits are used to shift into level 6 where a four bit character count is generated in step 32. It will also be understood that the characters are stored in the output buffer, step 12, and the matrix is then ready to receive additional characters.

After completing the two steps of compaction, 17 and 27, just described without obtaining a "yes" output, a comparison is then made of the characters to determine in which of the groups for levels 1, 2, 4, 5, 7, 8, 9, 10, 11, 12, 13, 14, and 15 the characters belong, as established in step 37. Assuming the next character is compared to those of the group to be stored in a given level at step 40, a control level signal represented by a 4 bit code is generated, and the character is encoded by either 0 bits or 4 bits as found in step 42, with the data being stored in the output buffer, step 12. After compaction of a single character, return to the control level is automatic and requires no control bits to return operation to the control level.

Returning again to FIG. 8, upon finding that a character, upon comparison, does not become encoded at one of the bases which is less than the fixed base such as base 256, the character will appear as a level 16 character as shown in step 46. Because the character is found to exist while in a control level rather than at the level 16, and further not being compactible, control bits 1111 are encoded at a step 50 which permits the character to be encoded in the fixed base 256 as found in step 11 and stored in the output buffer, step 12, in the fixed base code rather than being compacted.

As in the optimal system, the alternate system using more than a single data bit slice also utilized the simple lookahead described above. Further, it is unlikely that the alternate system would ever require the complex lookahead. A lookahead which is desirable is to use the automatic exit from level 16 as used by all the other levels. In this approach, a level 16 character generates a four bit level 16 control code, the system provides an output of one noncompacted character, and the system then automatically returns to the control level with no level 16 exit code required.

Decompaction of the four records compacted utilizing a four bit data slice will not be discussed in detail since, as has been set out and explained in great detail with respect to the single bit data slice, decompaction is merely the inverse of compaction. Thus, with an understanding, and appreciation of the foregoing, a detailed explanation of decompaction of the compacted data utilizing the four data bit approach is deemed unnecessary.

Another alternate approach according to the present invention is to change the location of the characters in the tables. It can now be seen that this change does not cause a variance of the procedure or the apparatus in any way but may allow for a higher degree of compaction in specific applications. For example, a bank, which has a high incidence of numbers will move numbers in the more efficient levels, while a publishing house, which has a low incidence of numbers, will move common alphabetic characters into the more efficient levels. Such a minor alteration of the present invention, as stated, in no way affects the basic teachings presented here and, in fact, are envisioned to tailor the present invention to specific applications.

As a further and quite detailed example of minor alterations of the present invention for particular applications, another alternate approach to specifically tailor the method and apparatus according to the present invention can now be explained. The specific application is to support central processor to terminal transmissions between an IBM system 360 or 370 central processor and certain terminals, such as terminals models 2770, 2780, 3780, 2701, 2703, 3704, 3705, and 20, all manufactured by International Business Machines, models 70, 71, 74, and 78 as manufactured by Data 100 Incorporated, and model 1270 as manufactured by Memorex. Further, transmission may be to any HASP type work station, which may include almost any programmable International Business Machines system. This application is limited to the protocols used on the above named central processors and terminals and only on the EBCDIC version of the International Business Machine Binary Sychronous Communication Technique, as defined in IBM publication GA 27-3004 and other associated IBM documents. The specific configuration to be described and explained will also support other terminals which emulate the above set out terminals, however.

In providing for this specific application, it has been found that the four bit data slice, described in detail above with respect to Table III, would be appropriate for the reasons set out above. It was further found that certain alterations should be made solely for the purposes of the particular application. No limitation to this particular application is intended, and it serves to illustrate the flexibility of the method and apparatus according to the present invention. The alterations made are set forth in the following Table IV.

TABLE IV

| Control Level Codes | | Characters |
|---|---|---|
| 1101 | Shift to level 1 | 0 |
| 1100 | " 2 | 2 |
| 1110 | " 3 | characters identical to prior record or to prior character |
| 1011 | " 4 | 1 |
| 1010 | " 5 | (blank) |
| 1111 | " 6 | idle control character |
| 1001 | " 7 | S |
| 0100 | " 8 | A |
| 0110 | " 9 | 7 |
| 0111 | " 10 | 3 |
| 0011 | " 11 | 8 |
| 0101 | " 12 | E |
| 1000 | " 13 | 4 |
| 0001 | " 14 | FBPN(OISDCR-9.6T |
| 0010 | " 15 | ESC YW,K/*HUL)MG DLE SYN PAD |
| 0000 | " 16 | No Compaction Mode |

Level 3 Codes (base 16)
NNNN This four bit code represents the number of characters which were either identical to similarly positioned characters in the prior record or identical to the prior character according to the following list:

```
0000   6 characters identical to prior character
0001   5              ,,
0010   4              ,,
0011   3              ,,
0100   2              ,,
0101  12 characters identical to prior record
0110  11              ,,
0111  10              ,,
1000   9              ,,
1001   8              ,,
1010   7              ,,
1011   6              ,,
1100   5              ,,
1101   4              ,,
1110   3              ,,
1111   2              ,,
```

Level 6 Codes (base 0)
This level has no data bits as it contains only a control code

TABLE IV-continued

| Control Level Codes | Characters |
| --- | --- |
| | used by the compactor to idle the line at anytime when data is not available quickly enough from the terminal or central processor. |
| Level 1, 2, 4, 5, 7, 8, 9, 10, 11, 12, 13 Codes (base 0) | |
| | These levels have no data bits as each level contains only one character and that is inherent in the level. |
| Level 14, 15 Codes (base 16) | |
| NNNN | This four bit code is a base 16 character to represent 1 of 16 characters in the level. |
| Level 16 Codes | |
| NNNN NNNN | This eight bit code is a base 256 character to represent 1 of 256 characters in the level. |

Table IV shows the changes made to the general case or theoretical approach of the four bit data slice, as set forth in Table III, in order to implement the practical application indicated immediately above. From Table IV, it can be seen that levels 1, 2, 4, 5, 7, 9, 10, 11, and 13 have not been altered or changed except that the particular control codes described in Table III to reach these levels have been reordered in Table IV, in order to provide a faster recognition at the receiving end of a transmission line.

Further changed are levels 8 and 12 which each have switched a character with one character out of level 14. That is, in level 8, the only character contained is now A, rather than a period. In level 12, the only character contained is now E, rather than the number 6. This change is made to increase compaction somewhat on alphabetic records, at the expense of decreasing compaction on numeric records. Further, control codes were also reordered in these levels.

Levels 14 and 15 are functionally the same as before, but seven new characters have been added to these levels as follows:

6 . W E S C D L E S Y N P A D

The first two characters of these new characters were lowered from higher levels 8 and 12 as set forth in Table III while the remaining five characters were raised from level 16. Of the five characters raised from level 16, the last four were raised to level 15 because they are important control codes used in this specific application. In order to accomodate these last five characters in level 15, for this particular practical application, five lesser used characters were lowered to level 16. These characters are:

V & J = X.

Level 16 remains the same as before except for a control code reordering and one other change. As set out above, in utilizing the four bit data slice, it is desirable to use a level 16 entry code, but not a level 16 exit code. In the example of Table IV, level 16 then returns to a control level after each character, as do the other levels, rather than requiring an exit code, as has been described as an option above.

In order to allow a wide range of interface and line speeds desirable for this application, in that this application is intended to interface with various terminals and central processors, a special idle control character was also added. This is a control character used only to fill line time when a gap is caused by too wide a difference between the line speed and the interface speed. That is, if the line speed is not exactly compatible with interface speed, with either speed being greatly in excess of the other, this control character is used. Again, to accommodate this special character, it was necessary to again adapt the method and apparatus according to the present invention, and the adaptation made was to use level 6 for the special character and to combine the functions of the former levels 3 and 6.

Therefore, in this specific application, level 3 defines either a prior record match or a prior character match. In order to effect the above, the particular count following the level 3 control code then defines which type and how many characters match. Specifically, a count of 0000 signifies six characters identical to a prior character, a count of 0001 signifies five characters identical to a prior character, a count of 0010 signifies four characters identical to a prior character, and so on up to a count of 0100 which signifies only two characters identical to a prior character. Higher counts are then utilized to signify that certain characters are identical to similarly positioned characters of the prior record. For example, a count of 0101 signifies 12 characters are identical or the same as similarly positioned characters in the prior record, a count of 0110 signifies that 11 characters of the current record are identical or the same as similarly positioned characters in the prior record, and so on to a count of 1111 which signifies only two characters of the current record are identical or the same as similarly positioned characters of the prior record.

It may then be readily seen from Table IV that, while the number of characters which may be expressed is changed, the control codes have changed, the levels have been altered, and the actual bit strings for both the control codes and the counts have changed from that previously described, the changes made are merely adaptations for a specific application and are within readily envisioned alterations and changes in the method and apparatus according to the present invention.

Table IV then illustrates a technique as modified for a particular application, as indicated. Further modifications will not be explained, as they are considered too numerous, and it is believed apparent with the preceding description and explanation that the method and apparatus according to the present invention is readily adaptable to various particular applications.

Decompaction utilizing a four bit data slice according to Table IV will also not be discussed in detail since, as has been set out and explained in great detail with respect to the single bit data slice, decompaction is merely the inverse of compaction. Thus, with an understanding and appreciation of the foregoing, a detailed explanation of decompaction of the compacted data utilizing the four data bit approach according to Table IV is deemed unnecessary.

Thus, the complete compaction and decompaction of four records has been shown in detail as an illustrative embodiment of three types of operation according to the present invention, a single bit data slice, a four bit data slice theoretical, general approach, and a four bit data slice particular, practical approach. With this explanation of operation in mind, an explanation of preferred apparatus according to the present invention may be explained with reference to FIGS. 9–26. First, the block diagramatic FIGS. 9–14 will be explained from a general operating standpoint. The precise physical connections between all parts will not be indicated by the block diagrammatic FIGS. 9–14; however, the basic operation of a method and apparatus according to the present invention will be explained. The precise physical interconnection of electrical components forming a preferred embodiment of the four bit data slice practical approach embodiment, will then be explained with reference to FIGS. 15–26.

With respect to FIG. 9, this Figure shows an expansion of memory 90 of FIG. 7. Specifically, instruction memory 92 is shown along with data memory 94 and input/output memory 96, all interconnected with the eight bit, parallel data bus 86 discussed above. Specifically with respect to FIG. 9, data bus 86 provides data to instruction memory 92 through an input 900 and receives data from instruction memory 92 through an output 902. Similarly, data memory 94 receives data from bus 86 through an input 904 and provides data to bus 86 through an output 906. Similarly, input/output memory 96 receives data from bus 86 through an input 908 and provides data to bus 86 through an output 910.

FIG. 9 then includes the addition of memory address decoder 912 between the entry of eight bit parallel data bus 86 into memory 90 and inputs 900 and 904 to instruction memory 92 and data memory 94, respectively. In particular, memory address decoder 912 receives data from data bus 86 through an input 914 and provides data to bus 86 and thus to instruction memory 92 and data memory 95 through an output 915.

Memory address decoder 912 then intercepts addresses in logical form upon bus 86, and determines the page of memory and the byte of the page in memory that the particular address intercepted refers to. Timing on the data bus 86 determines whether an instruction refers to a page or byte within a page, as will be discussed in detail with reference to FIGS. 15–26 hereinafter. Since similar logic is used whether or not an instruction is being requested from instruction memory 92 or data is being requested from data memory 94, only one memory address decoder is required.

In the preferred embodiment discussed hereinafter, instruction memory 92 is preferably a read-only memory (ROM) which in the preferred embodiment is an eight by 1280 bit memory, which is equivalent to five pages. Similarly, the preferred embodiment of data memory 94 is a random access memory (RAM) which is eight by 256 bits long, which is equivalent to one page of data.

FIG. 9 further includes an input/output (I/O) address decoder 916 situated between the entry of data bus 86 into memory 90 and input 908 of I/O memory 96. I/O address decoder 916 then receives data from bus 86 through an input 918 and provides data to bus 86 and input 908 of I/O memory 96 through an output 920.

I/O address decoder 916 is arranged to search for one of the 32 input/output addresses. As one of the specific addresses is intercepted and decoded, it provides access to I/O memory 96 and will cause addressing of the corresponding byte in I/O memory 96 to be provided to data bus 86 through output 910. In the preferred embodiment to be discussed hereinafter with respect to FIGS. 15–26, the preferred configuration of I/O memory 96 is a ROM which is eight by 256 bits long, or 256 bytes long, which is equivalent to one page. Thus, whenever I/O address decoder 916 intercepts an appropriate address, it is decoded into one of the 256 possible combinations addressing a particular data byte within the ROM forming I/O memory 96 and causes the contents of that data byte in the ROM forming I/O memory 96 to be immediately provided to data bus 86 through output 910. The use of I/O memory 96 in the preferred embodiment is then as an extremely fast table lookup device utilizing a one instruction table lookup routine.

With respect to FIG. 10, this Figure shows an expansion of coder/decoder 88 of FIG. 7. In particular, the eight bit parallel data bus is seen as first traversing bus drivers 1000 which provide for practical current, timing, and voltage requirements on the bus and for the remainder of the blocks described. It will of course be recognized that bus drivers 1000 may not be necessary if the remaining blocks described may operate without enhanced current, timing, or voltage capabilities, or have internal apparatus for the providing of enhancement of current, or timing, or voltage capabilities for proper transmission on data bus 86.

Connected then to data bus 86 on the interior side of bus drivers 1000 is an instruction address register or program counter 1002 having a data connection 1004 to data bus 86, a memory address register 1006 having a data connection 1008 to data connection 86, and arithmetic and logic unit 1009 having a data connection 1010 with data bus 86, and an accumulator 1012 having a data connection 1014 with data bus 86 and a further data connection 1016 with arithmetic and logic unit 1009, a general purpose register 1018 having a data connection 1020 to data bus 86, a return stack of registers 1022 having a data connection 1024 to data bus 86, an instruction decoder register 1026 having a data connection 1028 with data bus 86, an I/O address register 1030 having a data connection 1032 with data bus 86, and a condition flag register 1034 having a data connection 1036 to data bus 86.

All interrelationships with data bus 86 are shown diagramatically and not precisely. The portions of coder/decoder 88 shown are the main portions, and all do have access to data bus 86. Additional portions of coder/decoder 88 will be shown and explained with respect to the detailed, four bit data slice, practical embodiment disclosed with respect to FIGS. 15–26.

Instruction address register 1002, in the practical preferred embodiment, is a one by eight bit register which generates or contains the high order byte and the low order byte for the instruction address. At the beginning of each instruction in the micro code, these two bytes are transmitted via data connection 1004 to data bus 86, one after the other, in order to set up and properly condition the addressing logic into the memories as described hereinbefore with respect to FIG. 9. This transmission of the high order byte and the low order byte then produces the instruction itself from instruction memory 92 which returns along data bus 86 at a different time interval.

The first byte of this instruction is gated by appropriate timing into instruction decoder register 1026, which in the preferred practical embodiment is a one by eight bit register which determines the type of inruction stored within it. Instruction decoder 1026 so determines if more bytes of instruction are necessary since a given instruction may be one, two, or three bytes in length. Instruction decoder 1026 also sets up conditions the appropriate gates, to be discussed in detail further hereinafter with respect to FIGS. 15-26, so that subsequent instruction bytes are provided to the correct logic, or data bytes are provided to the appropriate apparatus, or data transfers between various registers are appropriately made.

In addition to address register 1002 discussed above, return stack 1022 is used to hold various different addresses, which may be used at differing intervals in the program. In particular, in the preferred practical embodiment, return stack 1022 is a set of sixteen eight bit registers used in pairs in the same manner as instruction address register 1002. The registers forming return stack 1022 are configured and used as a first and last out register to allow jumps in the microcode to thus allow large areas of common coding.

Memory address register 1006, in the practical embodiment, is comprised of another pair of eight bit registers. These registers also address memory 90, but instead of addressing memory during instruction access time, memory address register 1006 accesses memory during data access time. This will become clearer upon an explanation of the detailed embodiment of FIGS. 5-26.

Memory address registers 1006 may be used to remove data from data memory 94 for usage by coder/decoder 88 or to restore data to memory 90 from coder/decoder 88. Similarly to instruction address register 1002, memory address registers 1006 hold a high order byte which addresses the page of memory and a low order byte which addresses the specific cell of memory.

I/O address register 1030 gives the compaction device according to the present invention the capability of addressing up to 32 various peripheral devices which can also be connected to data bus 86. In the preferred practical embodiment, these 32 possible devices are organized to a maximum of eight input devices and 24 output devices. However, for the preferred practical embodiment, only 13 of the 32 devices have been utilized, 5 input devices and 8 output devices.

After an instruction has been accessed by the address in instruction address register 1002, by having been provided to data bus 86, provided to memory 90, decoded by memory address decoder 912, accessed a particular page and byte in instruction memory 92, caused the particular instruction to be provided by instruction memory 92 to data bus 86 via output 902, the necessary data is brought into coder/decoder 88 as part of the instruction or from data memory 94. At this time, generally the various arithmetic and logical instructions are to be performed upon data on bus 86 by means of arithmetic and logic units 1008. Arithmetic and logical unit 1008, in the preferred practical embodiment, is an eight bit arithmetic register which can add, subtract, do various logical operations such as OR, AND, exclusive OR, and both left and right shift operations. Arithmetic and logical unit 1008 always delivers its results to accumulator 1012 which, in the preferred practical embodiment to be discussed, is another eight bit register designed for holding various temporary results.

In addition to being the recipient of all arithmetic and logical operations from arithmetic and logical unit 1008, accumulator 1012 is also the recipient of all input/output commands, and is the device which holds the data to be provided to the input/output blocks 50 and 52 upon an output command.

In addition to accumulator 1012, general purpose register 1018 may be used to temporarily store data, or as counters, or for a number of other purposes. In the preferred practical embodiment, general purpose register 1018 is comprised of four eight bit registers.

Lastly with respect to FIG. 10, condition flag register 1034 is, in the preferred practical embodiment, four bits of flags which are set as a result of a number of various arithmetic and logical operations, such as compare, AND, subtract, and other well known conditions. This register is normally set as a result of operation performed in arithmetic and logical unit 1008, although certain instructions referencing the general purpose registers may also set some of the condition flags. The condition flags would then be tested, and logical decisions are made in a micro-code according to the particular conditions set, as is well known by those skilled in the art.

Figure 11:
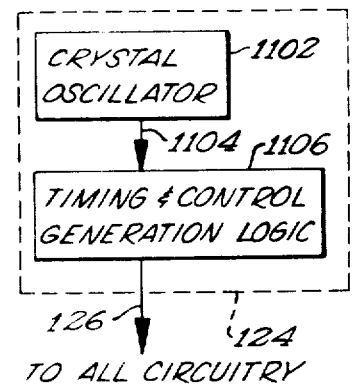

With respect to FIG. 11, this Figure shows an expansion of timing and control block 124 of FIG. 7. Specifically, FIG. 11 includes a crystal oscillator 1102 interconnected by a data connection 1104 with timing and control generation logic, designated 1106. The timing and control generation logic 1106 will be discussed further hereinafter with respect to FIGS. 15-26. Logic connection 126 then extends from timing and control generation logic 1106 to the remainder of the circuitry, as again will be discussed further hereinafter with respect to FIGS. 15-26.

With respect to FIG. 12, this Figure shows an expansion of input/output control 128 of FIG. 7. Specifically, I/O timing and control 128 is seen to include an input from data connection 86 to eight bit parallel bus drivers 1202. Similar comments may be made with respect to bus drivers 1202 as have been made with respect to bus drivers 1000 of FIG. 10. Bus drivers 1202 are interconnected via logic connection 1204 with I/O latches 1206. As seen, I/O latches 1206 include data connections 130-1 to a portion of controller side converter 56 and 130-4 to a portion of modem side converter 114.

Input/output control 128 further includes a clock generator 1208 and a special timing block 1210 providing special timing and control for controller side FIFO 66. Clock generator 1208 and special timing block 1210 then have logic outputs 1212 and 1214, respectively, which are interconnected to form logic connection 130-2.

Input/output control 128 also includes a further special timing block 1216 providing special timing and control for the modem side FIFO 102. Special timing block 1216 includes an output 1218 terminating in logic connection 130-3.

Thus, input/output control 128 generates many special timing and control signals used by controller side FIFO 66 and modem side FIFO 102, as will be explained in detail with reference to FIGS. 15-26. Input/output control 128 also generates the clock which is used by the controller side FIFO 66. Input/output control 128 also includes a series of I/O latches 1206 and provides control signals to controller side converter 56 and modem side converter 114 in order to provide a connection between I/O latches 1206 and the environment outside of the compaction device of the present invention.

Figure 13:
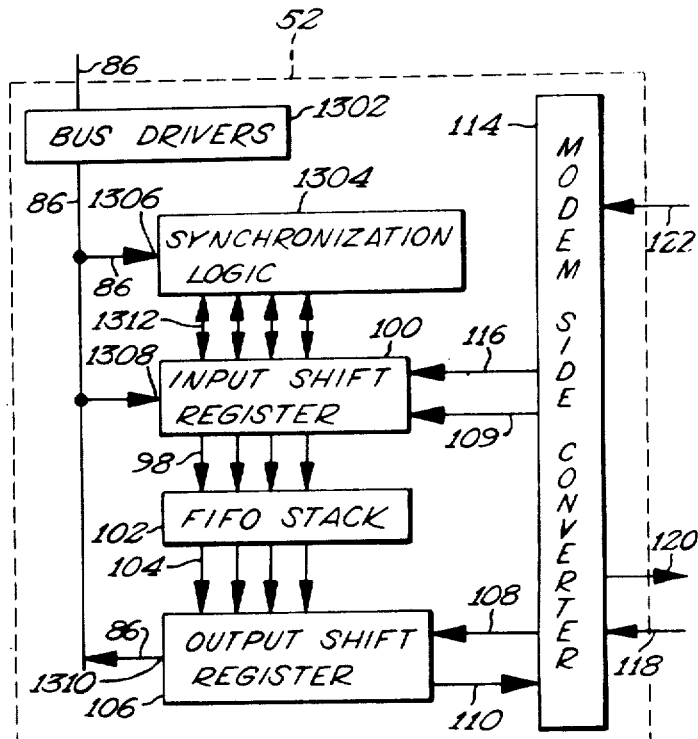

With respect to FIG. 13, this Figure shows an expansion of input/output block 52 of FIG. 7. Specifically, eight bit, parallel data bus or connection 86 is shown as interconnecting with block 52 and specifically with bus drivers 1302 therein. Comments similar to those comments made with respect to bus drivers 1000 of FIG. 10 apply again to bus drivers 1302 of FIG. 13. In FIG. 13, a more exact representation of the data path is shown, rather than the stylized general approach shown in FIG. 7. In particular, data bus or connection 86 is seen to provide a four bit parallel input to synchronization logic 1304 via four bit input 1306. Data connection 86 is further seen to provide an eight bit parallel data connection to input shift register 100 via eight bit input 1308 and accept a four bit parallel output from output shift register 106 and specifically from four bit parallel output 1310 thereof.

Further, a four bit parallel data connection 1312 is provided between synchronization logic 1304 and input shift register 100 for purposes which will be explained further with respect to FIGS. 15–26.

The remaining numeration of FIG. 13 is applicable from the explanation given above with respect to FIG. 7.

Again with respect to the preferred practical embodiment, synchronization logic register 1304 is a one by four bit register which may be loaded by coder/decoder 88. Input shift register 100 may also be loaded in parallel by coder/decoder 88 via data connection 86 or in serial by modem side converter 114 via data connection 116.

FIFO stack 102, in the preferred practical embodiment, is a register commonly known as a data silo. In the preferred practical embodiment, FIFO 102 includes 128 four bit registers which stack data in on a first in, first out basis. At the bottom register of this data silo is an output shift register 106, also four bits wide so that this output shift register 106 may be unloaded in parallel to data bus 86 or unloaded serially back to modem side converter 114, as by data connection 110.

The modem side converter 114, in the preferred practical embodiment is nothing more than a voltage converter which converts the 0 and the plus five voltage logic signals of the preferred practical embodiment to the minus 12 and plus 12 voltage signals which are generally utilized in communications.

Figure 14:
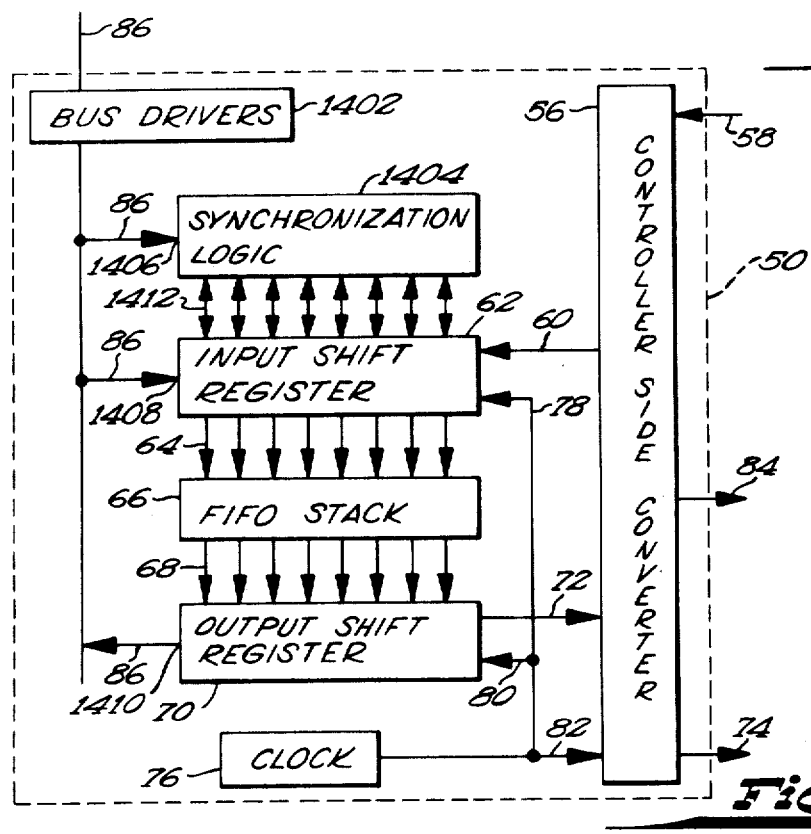

With respect to FIG. 14, this Figure shows an expansion of input/output block 50 of FIG. 7. Specifically, eight bit, parallel data bus or connection 86 is shown as interconnecting with block 50 and specifically with bus drivers 1402 therein. Comments similar to those comments made with respect to bus drivers 1000 of FIG. 10 apply again to bus drivers 1402 of this FIG. 14. In FIG. 14, the more exact representation of the data path is shown, rather than the stylized general approach shown in FIG. 7. In particular, data bus or connection 86 is seen to provide an eight bit parallel input to synchronization logic 1404 via eight bit input 1406. Data connection 86 is further seen to provide an eight bit parallel data connection to input shift register 62 via eight bit input 1408, and accept an eight bit parallel output from output shift register 70 and specifically from eight bit parallel output 1410 thereof. Further, an eight bit parallel data connection 1412 is provided between synchronization logic 1404 and input shift registers 62 for purposes which will be explained further with respect to FIGS. 15–26.

The remaining numeration of FIG. 14 is applicable from the explanation given above with respect to FIG. 7.

Again with respect to the preferred practical embodiment, synchronization logic register 1404 is a one by eight bit register which may be loaded by coder/decoder 88. Input shift register 62 may also be loaded in parallel by coder/decoder 88 via data connection 86 or in serial by controller side converter 56 via data connection 60.

FIFO stack 66, in the preferred practical embodiment, is a register commonly known as a data silo. In the preferred practical embodiment, FIFO 66 includes 64 eight bit registers, which stack data on a first in, first out basis. At the bottom of this data silo is output shift register 70, also eight bits wide, so that this output shift register 70 may be unloaded in parallel to data bus 86 via output 1410 or unloaded serially back to controller side converter 56, as by data connection 72.

Basic operation of apparatus according to the present invention can now be explained with respect to FIGS. 1–14. Assuming the system is operating in a compaction mode, and with reference to the basic system of FIG. 1, data provided to the system via terminal A, for example, is transmitted to line controller B in an eight bit parallel fashion and converted by line controller B into an eight bit serial logic representation. This bit serial logic is then provided to compaction device C by line controller B. Thus, data is transmitted to controller side converter 56 via data connection 58.

The data then traverses converter 56, which alters the voltage levels as discussed above, and is transmitted via connection 60 to input shift register 62.

Data input shift register 62 is then compared, in parallel, against a pattern previously stored in synchronization register 1404. When the two patterns match, and a synchronous condition is reached, the data in input shift register 62 is transmitted via data connection 64 into FIFO stack 66.

The exact manner in which FIFO 66 logic operates depends on whether or not the device is in a transmit or receive mode. In the transmit mode discussed above where data is received from the controller side converter 56 and into shift register 62, the output of input shift register 62 is provided in parallel, eight bits at a time, into FIFO 66. At the bottom of FIFO 66, the first eight bits is transmitted, in parallel, into output shift register 70 where it is held until it is accessed by coder/decoder 88 via the eight bit data bus 86. As one eight bit data character is removed from output shift register 70, another eight bit data character is transferred from the bottom of FIFO 66, in parallel, and into output shift register 70. As each eight bit character is removed from output shift register 70 by coder/decoder 88, the eight bit character is then available for processing within compactor 54 of the present invention, and for transmission to the modem side FIFO 102.

That is, the data removed from output shift register 70 is processed through the micro-code control logic into a compacted form according to the method and apparatus disclosed above at least with respect to FIGS. 1–7. That is, coder/decoder 88 accesses instruction memory 92 and data memory 94 and performs the steps set forth in FIGS. 2–6 and described above. As the compacted form of the data is created, it is stored in a parallel form in input shift register 100 of input/output block 52. In this mode, input shift register 100 operates as a four bit register rather than an eight bit register. Each four bits, in the order provided to input shift register 100, is communicated to modem side FIFO 102 via data connection 98.

Modem side FIFO 102, in this mode, is utilized as a register four bits wide by 128 bits deep. At the bottom of FIGO 102, each four bits are consecutively provided to output shift register 106 via data connection 104. Each four bit character is then clocked in a serial fashion, one bit at a time, via data connection 110 through modem side converter 114, and to modem D via data connection 120.

Clocking out to the modem D is accomplished through an external clock received via connection 118. This external clock normally originates from a communications device, such as modem D. As will be discussed in relation to the detailed preferred, practical embodiment of the present invention described in connection with FIGS. 15-26, modem side FIFO 102 is similar to controller side FIFO 66 except that modem side FIFO 102 also includes input/output latches which make it possible to read information received from modem side converter 114 and to send information out to modem side converter 114 to be passed on to the communication medium.

Thus, basic operation of the compaction apparatus and method of the present invention have now been described with respect to a transmit mode. Operation of the system is slightly altered during a receive mode of operation, as follows:

In the receive mode, data is provided to modem side converter 114 via connection 122 in a serial binary form, bit by bit. Data traverses modem side converter 114 and is provided via connection 116 to input shift register 100. Data within input shift register 100 is compared four bits at a time with data prestored and held in sychronization register 1304 until a match in the data within synchronization register 1304 and input shift register 100 is reached. When a match or synchronous condition is reached, the four bits of data are transferred from input shift register 100 into modem side FIFO 102, four bits at a time in parallel. Each succeeding four bits of information received is likewise transferred from input shift register 100 via data connection 98 into modem side FIFO 102.

Data drops to the bottom of modem side FIFO 102, is transferred via connection 104 to output shift register 106, again four bits at a time in a parallel fashion, and is accessed from output shift register 106 via coder/decoder 88.

Coder/decoder 88 then decompacts and processes the data through utilization of the techniques set forth above at least in connection with FIGS. 1-8 within compaction device 54. After the data has been decompacted, the appropriate eight bit, for example, character representation extracted from data memory 94, is then transferred to controller side FIFO 66 in a parallel form and again processed through controller side FIFO 66 and into output shift register 70. From output shift register 70, the eight bit character representation is now clocked, bit by bit, in serial format, via data connection 72, through controller side converter 56, and to line controller B.

It is to be noted that, on the controller side interface, clock 76 provides the control, whereas on the modem side, the clock was provided externally. This is not necessary, although it is conventional in order to provide correct timing with the modem and to appear transparent to the modem and line controller.

That is, the compaction device and methods according to the present invention are performed in a manner which looks like a modem to the controller B and which looks like a controller to the modem D, and thus provides a transparent interface between the two, i.e. an interface which does not appear to be present. It is in this way that the technique and apparatus of the present invention can perform the compaction and decompaction function without affecting any of the normal control procedures between a controller and a modem on a transmission line.

It is then to be noted that the present invention provides compaction and decompaction of data, as received, without storing or destroying the timing relationships of the communications system whatever. Further, it is to be noted that the data is completely reconstituted, and no portions of the data are deleted or missed. It is then a primary advantage of the apparatus and method according to the present invention that compaction and decompaction may be performed in a manner which in no way interrupts, alters, changes, delays, or degrades transmission.

A discussion of the preferred, practical embodiment of the present invention, as set out in FIGS. 15-26 and utilizing the four bit data slice and the particular application of the method according to the present invention as described in connection with Table IV, can now be described in detail and explained.

In FIGS. 15-26, certain of the particular apparatus set out and described is designed only to support an enhanced version with multiple coder/decoders 88, extra memories, such as memory 90, and a control console. Since this circuitry and apparatus is not essential to operation of the practical and preferred embodiment according to the present invention, but only to provide an enhanced version, it will be identified and described only briefly.

Also in connection with the description of FIGS. 15-26, the interconnection between figures has been identified by alphanumeric designations, abbreviations, or acronyms which yield information beyond that which could be provided by a mere numeration of the connections. Thus, the origin of a connection on a particular figure is indicated by the alphanumeric designation upon the incoming schematic line, representing a wire connection, and various factual data about the signal are contained in the acronym applied. The acronym, the full meaning of the term, the figure in which the acronym originates or is created by the circuitry of FIGS. 15-26, and the other figures in which the acronym will appear are set out on Table V, following the description of FIGS. 15-26.

It will also be noted that the logic diagrams set out in FIGS. 15-26 are drawn in accordance with ANSI standard number Y32.14, 1973, using the specially shaped symbols set out therein.

Further, the particular apparatus represented within FIGS. 15-26, as by the number attached to the apparatus, the particular name of the apparatus, the manufacturer, if relevant, and the manufacturer's number or value of the particular part are set out in Table VII following the description and explanation of FIGS. 15-26.

It will further be noted that pin numbers of the various parts indicated in Table VII are indicated on the drawings 15-26 for the convenience of describing, understanding, and following the description and explanation of FIGS. 15-26.

Figure 15:
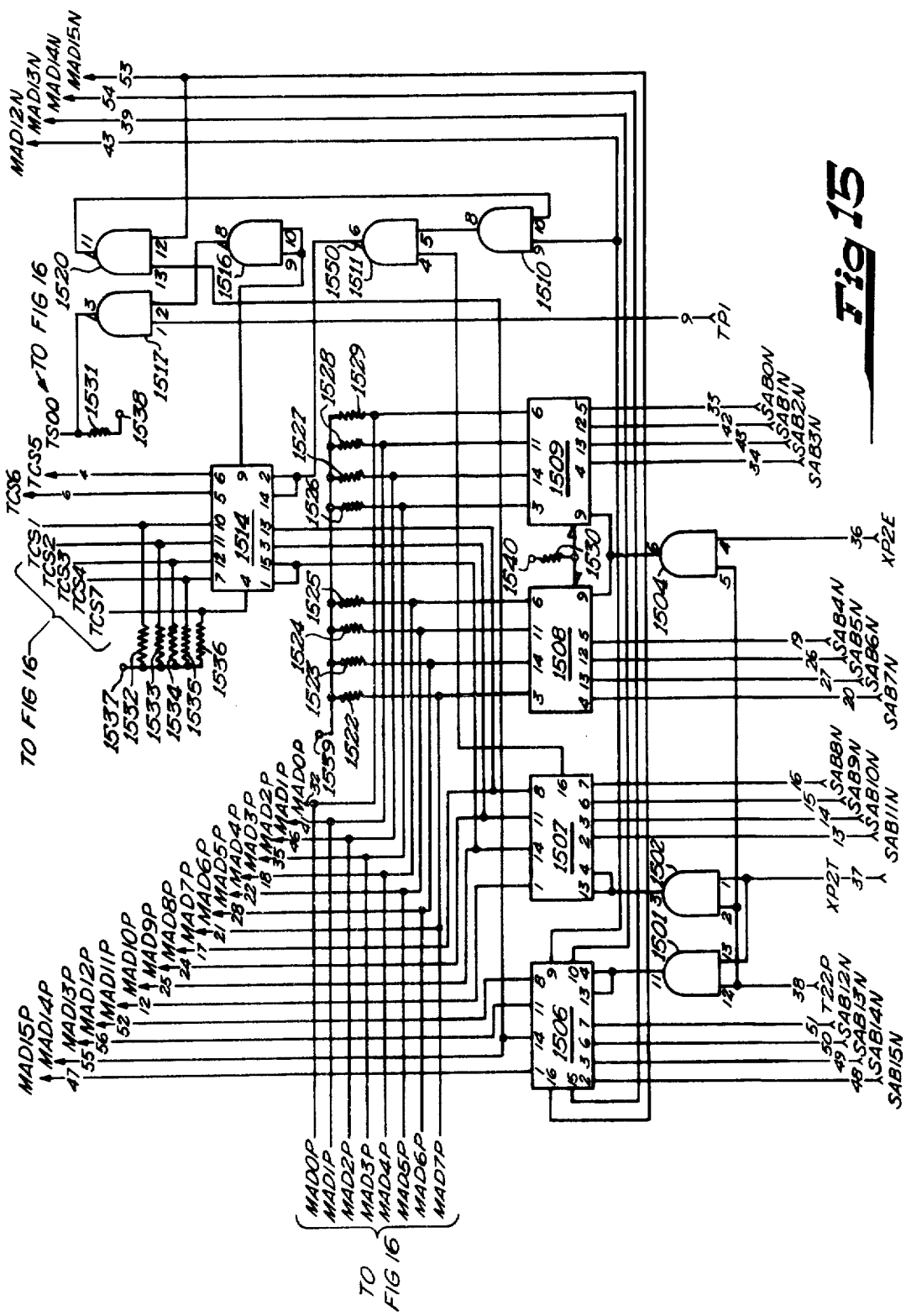
FIGS. 15 to 26 show schematic representations of preferred apparatus according to the present invention, organized by the functional block diagrams shown in FIGS. 7 and 9 to 14, with FIGS. 15 and 16 referring to FIGS. 2, 7, 8, and 9, FIG. 17 referring to FIGS. 2, 7, 8, and 10, FIGS. 18 and 19 referring to FIGS. 2, 7, 8, and 11, FIGS. 20, 21, and 22 referring to FIGS. 2, 7, 8, and 12, FIGS. 23 and 24 referring to FIGS. 2, 7, 8, and 13, and FIGS. 25 and 26 referring to FIGS. 2, 7, 8, and 14.
Figure 16:
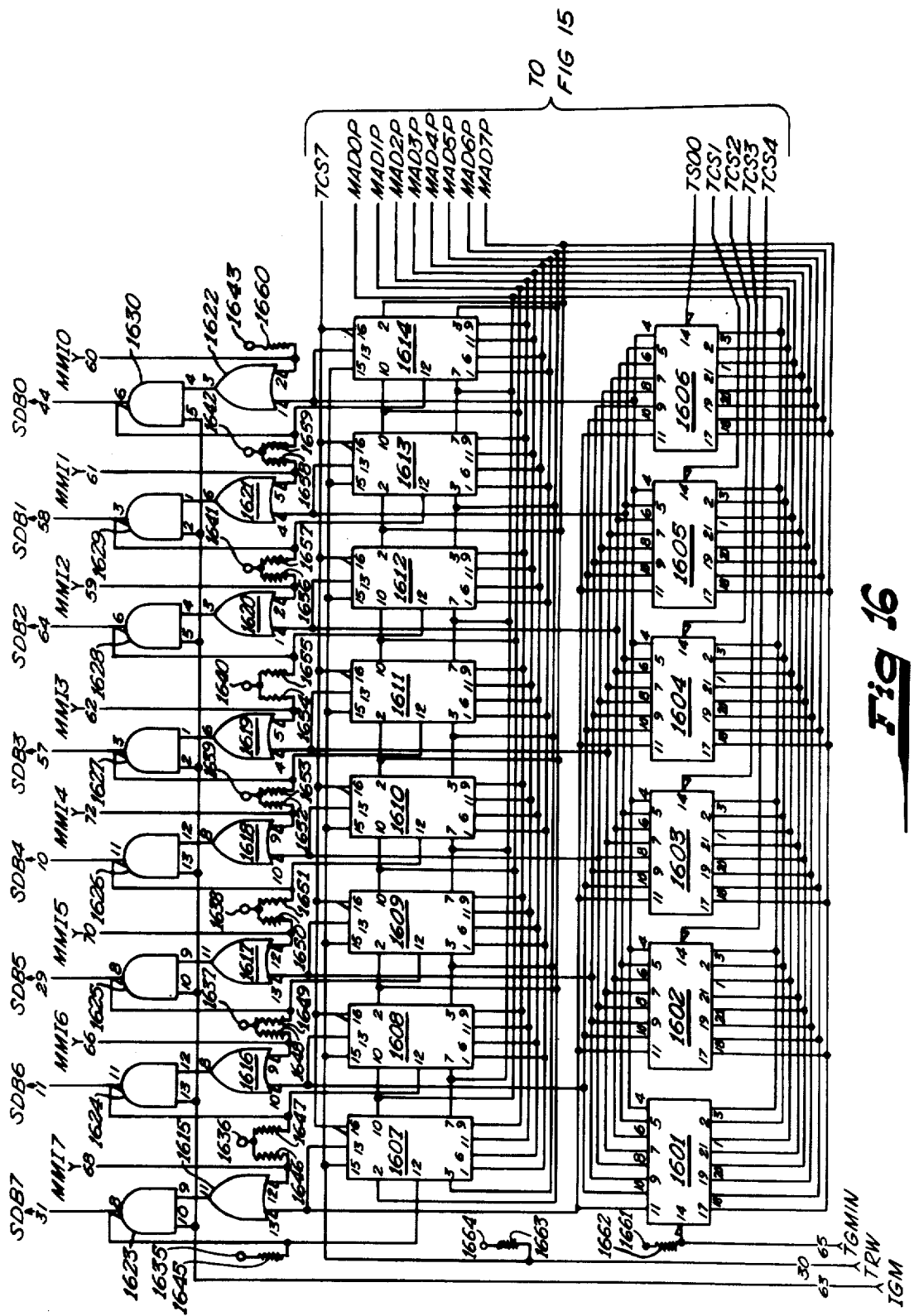

With specific regard to FIGS. 15 and 16, these Figures represent an expansion of memory 90 as shown in FIGS. 7 and 9. In particular, instruction memory 92, data memory 94, and memory address decoder 912, which includes the overall memory system address register and the addressing decoding logic, are shown in FIGS. 15 and 16.

In FIG. 15, the overall memory system address register or memory address decoder 912 as shown in FIG. 9 is contained in quadruple latch chips 1606–1509 and 1514. The address to address memory register 912 as shown in FIG. 9 is intercepted from the parallel data bus 86 through the input address register, comprising circuit 1738–1741 described hereinafter in reference to FIG. 17. Conventional timing arrangements are provided through AND gates 1501, 1502 and 1504.

Figure 17:
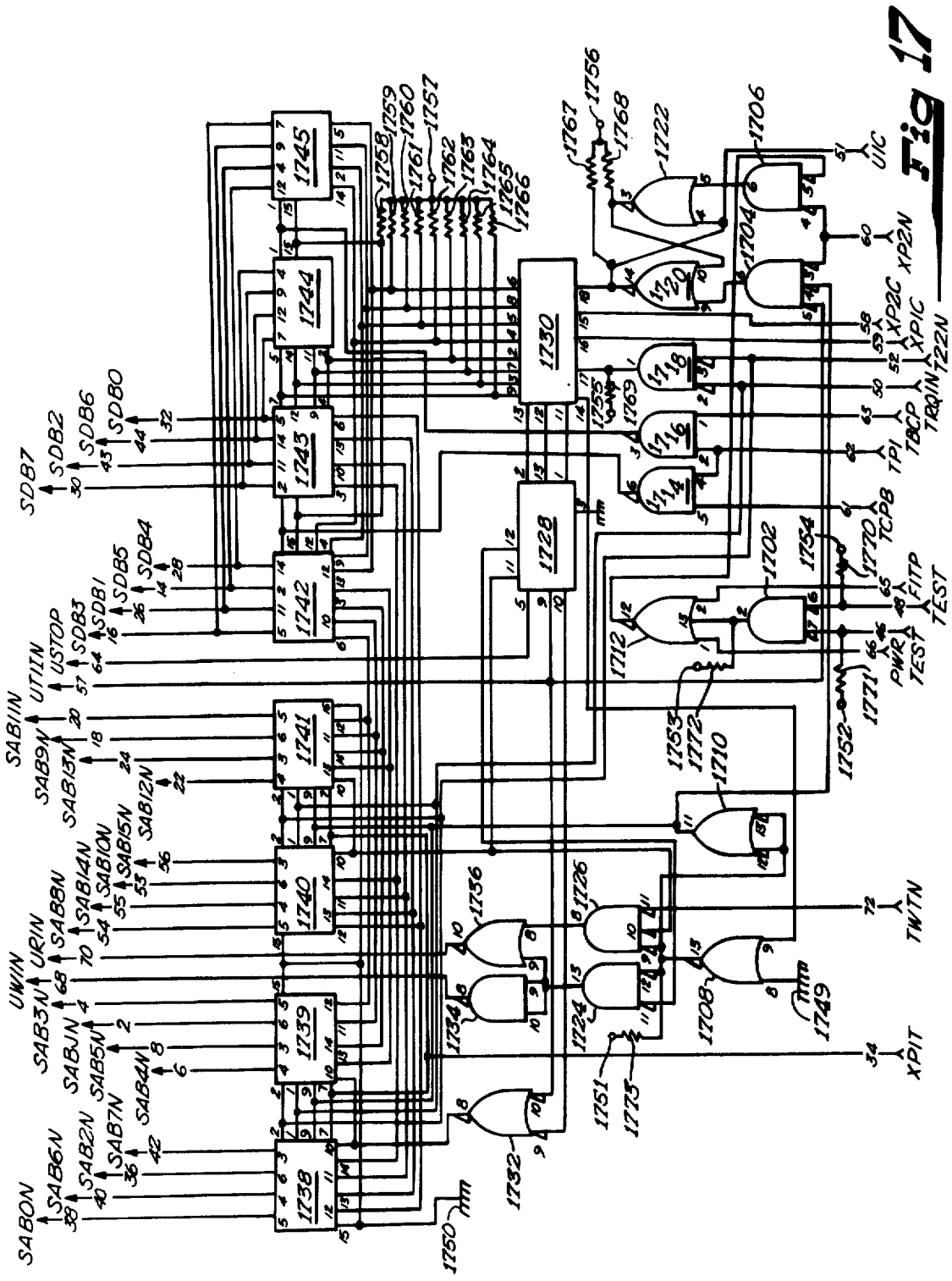

Decoding of the memory address occurs in AND gates 1510, 1511, and 1520, and further address decoding occurs in decoder circuit 1514, whose outputs are used to select the various memory pages. AND gates 1516 and 1517 perform further address decoding to select page zero in the instruction memory 92. Latches 1506–1509, which is effect form a duplicate second rank register for the input address registers, 1738–1741 described in connection with FIG. 17, are necessary only in an enhanced system with multiple coder/decoders 88, as explained above.

Resistors 1522–1529 are connected to a source of positive voltage, in the preferred embodiment, at terminal 1539 and these resistors are used as "pull up" resistors to assure an adequate high level to the MOS circuits used for instruction memory 92, data memory 92, and I/O memory 96 described in connection with FIG. 16. Resistors 1532-1536 connected to a positive source of voltage, in the preferred embodiment, at terminal 1537, are for similar purposes, as is resistor 1531 which is connected to a positive source of voltage, in the preferred embodiment, at terminal 1538. Resistor 1530 is connected to a positive source of voltage, in the preferred embodiment, at terminal 1540 and is used as an inactive logic high input to latch circuits 1508 and 1509.

Since the apparatus of FIG. 15 is interconnected in the complex fashion clearly set out in the drawing of FIG. 15, including interconnections between pin numbers for the various circuits and apparatus and interconnections between the apparatus described with respect to FIG. 15 and the remaining figures, as indicated by the numeric and alphanumeric interconnection designations, no further detailed description is included here.

With respect to FIG. 16, memory element 1601, in the preferred embodiment a MOS ROM, comprises input/output memory 96 of FIGS. 7 and 9. Further, memory elements 1602–1606 comprise instruction memory 92 of FIGS. 7 and 9, and in the preferred embodiment are also MOS ROM elements. Memory 94 of FIGS. 7 and 9 are embodied in memory element 1607–1614 of FIG. 16, and in a preferred embodiment consist of MOS RAM circuits. Resistor 1662, connected to terminal 1661, and resistor 1663, connected to terminal 1664, and in the preferred embodiment with both terminals connected to a positive source of voltage, are used as "pull-up" resistors to insure adequate high levels of input to pin 14, the select line, of ROM circuit 1601. Resistor 1663, connected to terminal 1664, is also used in a similar fashion as a "pull-up" to pins 15, the read-write terminals of RAM circuits 1607–1614.

OR gates 1615–1622 serve to multiplex inputs from an auxiliary external memory onto the parallel data bus 86, and are thus necessary only in an enhanced system with an auxiliary memory. AND gates 1623–1630 are parallel data bus drivers which serve as buffer amplifiers to gate memory data onto the parallel data bus 86. Terminals 1635–1643 are, in the preferred embodiment, connected to a positive source of voltage and to resistors 1645–1660 which are again used as "pull-up" resistors to insure that undriven auxiliary memory input lines or the undriven parallel data bus will return to an inactive high state.

Since the apparatus of FIG. 16 is interconnected in the complex fashion clearly set out in the drawing of FIG. 16, including the interconnections between pin numbers for various circuits and apparatus and the interconnections between the apparatus described with respect to FIG. 16 and the remaining figures, as indicated by the numerical and alphanumerical interconnections described, no further detailed description is included here.

It can now be appreciated that FIGS. 15 and 16 represent memory 90 as shown in FIGS. 7 and 9 except for I/O address decoder 916 which will be described hereinafter in FIG. 18.

With respect to FIG. 17, this figure shows the logic circuitry comprising the preferred, practical embodiment of coder/decoder 88 of FIGS. 7 and 10. FIG. 17 then shows a large scale integration (LSI) MOS circuit 1730. This LSI circuit contains instruction address register 1002, memory address register 1006, arithmetic and logic unit 1009, accumulator 1012, general purpose register 1018, return stack 1022, a portion of instruction decoder 1026, I/O address 1030, and condition flags 1034 which are identified and described in connection with FIG. 10. The various internal states of this LSI circuit are decoded in decoder circuit 1728, which provides further instruction decoding and timing information to control transfers onto the parallel data bus 86 of the system according to the present invention. OR gates 1720 and 1722 together with their respective "pull-up" resistors 1767 and 1768 as returned to terminal 1756, a positive voltage in the preferred embodiment, comprise a flip-flop circuit which stores an initialization restart command to the coder/decoder 88 of the present invention. This flip flop is set by AND gates 1706 which gate is in turn clocked by clock phase 2 described below in reference to FIG. 18, and gated by OR gate 1712, which includes three inputs. One of the inputs to OR gate 1712, to pin 1, is used to start coder/decoder 88 at the time power is applied to the system through power-up start circuitry gates 1814, 1826, and 1842, described hereinafter with reference to FIG. 18. A second input to OR gate 1712, or pin 2, is driven by AND gate 2108, again described hereinafter with reference to FIG. 21. A third input to OR gate 1712, on pin 13, is driven by AND gate 1702 in conjunction with its "pull-up" resistor 1772 connected to terminal 53, and again in the preferred embodiment to a positive source of voltage. This AND gate 1702 is used only for connection to an external console, thus is used for an enhanced system, and thus is not necessary in the basic system.

Resistor 1771, connected to terminal 1752 and thus in the preferred embodiment to a positive source of voltage, and resistor 1770, similarly connected by means of terminal 1754, are used to return the inputs of AND gate 1702 in the event that an external console is not connected.

The flip-flop circuits 1720-1722 are cleared by AND gate 1704, which is in turn clocked by clock phase 2 described below in reference to FIG. 18, and gated by a signal from decoder circuit 1728 and by a synchroniation signal from LSI circuit 1730 through inverters 1708 and 1710. Resistor 1773 connected to terminal 751, and in the preferred embodiment to a positive source of voltage, is a "pull-up" resistor for open collector inverter 1708.

AND gate 1718, with its associated "pull-up" resistor 769 connected to terminal 1755, and in the preferred embodiment to a positive source of voltage, is used to inhibit operation of coder/decoder 88 in the event that other coder/decoders 88 are used in an enhanced system where several coder/decoders 88 are contending for the parallel data bus 86, and thus AND gate 1718 is only necessary in an enhanced system.

Translation of voltage and current levels from the parallel data bus 86 to those levels used by LSI circuit 1730 is accomplished by bus driver circuits 1742-1745, which are gated by AND gate 1714 and 1716. These bus driver circuits, comprise the preferred, practical embodiment of bus drivers 1000 as described in connection with FIG. 10.

"Pull-up" resistors 1759-1766 connected to terminal 757, in the preferred embodiment connected to a positive source of voltage, provide further enhancement of the voltage levels to LSI circuit 1730. Resistor 758, also connected to terminal 1757 is a "pull-up" for terminals 15 of bus driver circuits 1742-1745.

The quadruple latch circuits 1738-1741 comprise the input address register to address decoding logic such as memory address decoder 912 of FIG. 9, and latch circuit 1738-1741 are used to prestore memory addresses gated from parallel data bus 86 for loading into the system address register at the appropriate time determined by control functions within the present invention. Thus, input address register comprised by latch circuits 1738-1741 correspond to input 918 as described above in connection with FIG. 9. Address data to this input address register is gated at the appropriate time by signals from decoder 1728 through OR gate 732, and by a synchronization signal from LSI circuit 1730 through inverters 1708 and 1710.

Figure 18:
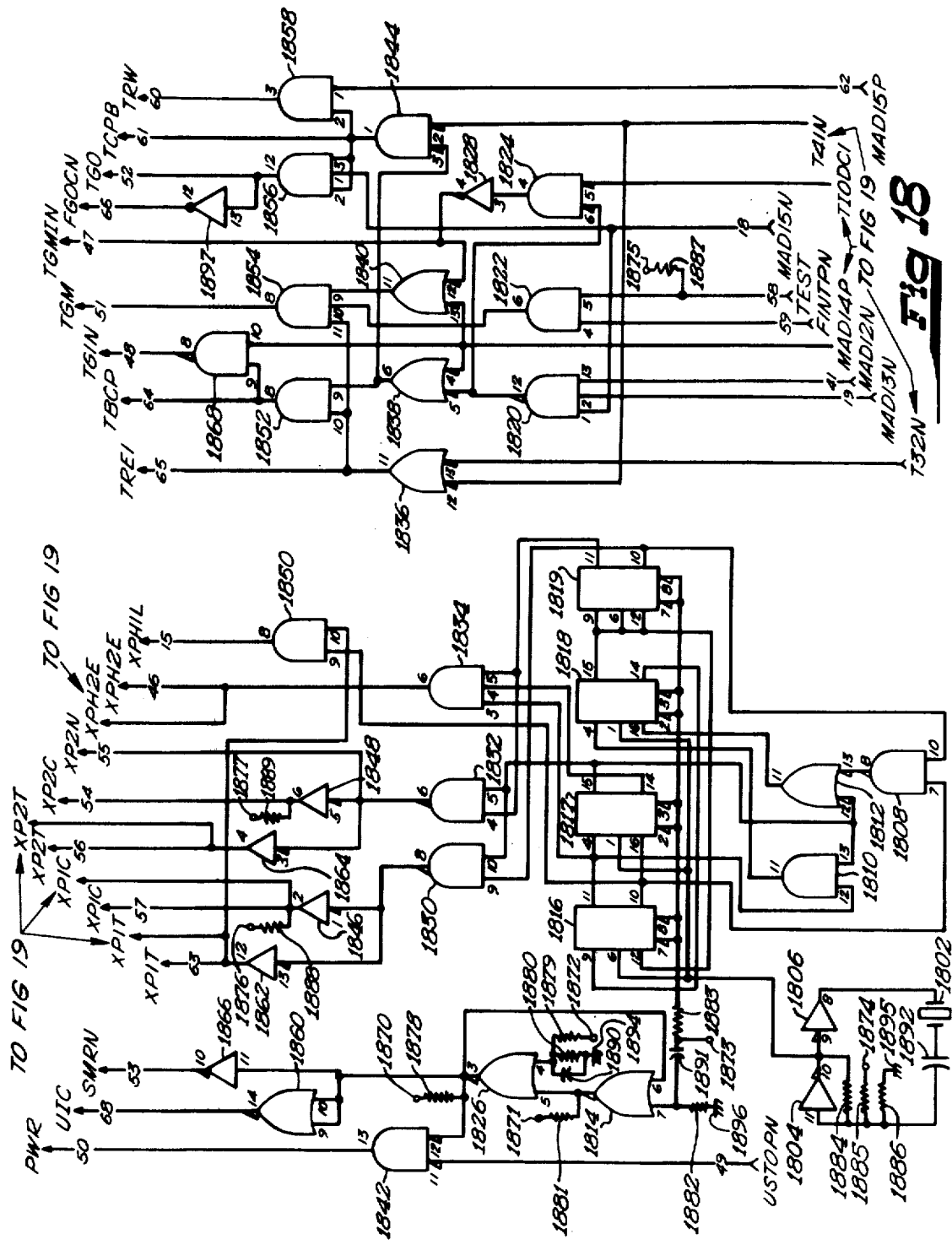
Figure 19:
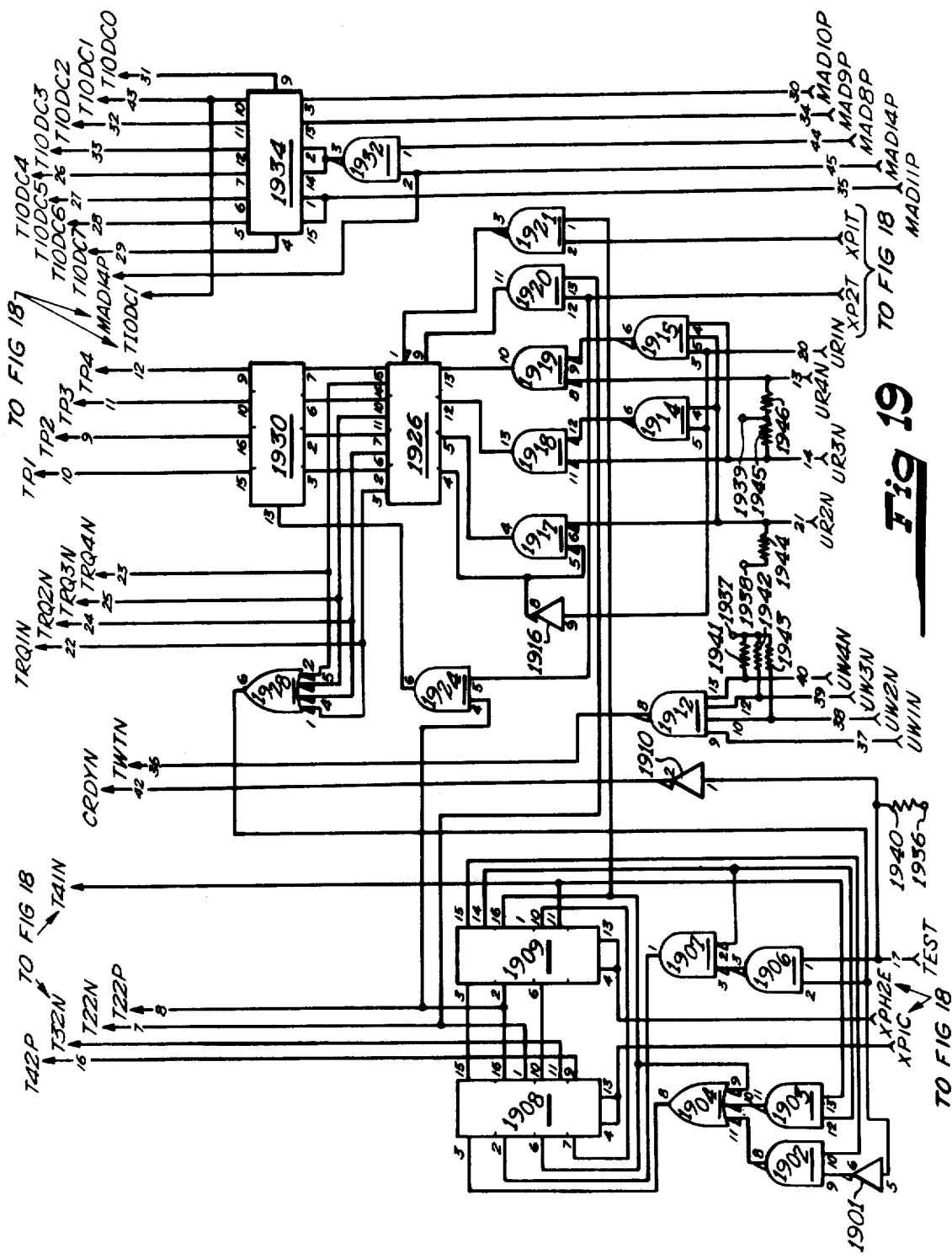

The logic network including AND gates 1724, 1726 and 1734, and OR gate 1736 generate request signals to the timing and control section of the present invention, as set forth in FIGS. 18 and 19, and these AND gates are necessary only in the event of an enhanced system using multiple coder/decoders 88. Thus, this logical network would not be necessary in the implementation of a basic model.

Thus, since the apparatus of FIG. 17 is interconnected in a complex fashion clearly set out in the drawings of FIG. 17, including interconnections between pin numbers for the various circuits and apparatus and interconnections between apparatus described with respect to FIG. 17 and remaining figures, as indicated by the numerical and alphanumerical interconnections designated, no further detailed description is included here.

With respect to FIGS. 18 and 19, these figures show the timing and control logic forming a practical, preferred embodiment of timing and control 124 of FIGS. 1 and 11 and I/O address decoder 916 of FIG. 9.

The basic timing source for the system is the crystal oscillator 1102 of FIG. 11, and consisting of 8.57 MHz crystal 1802, capacitor 1892, inverters 1804 and 1806, and resistor 1884 connected to the junction of inverters 1804 and 1806, resistor 1885 connected to terminal 1874, and resistor 1886 connected to ground, designated 1895. Terminal 1874 in the preferred embodiment is connected to a source of positive voltage. The output of oscillator 1102 is then divided in the scale of 11 counter comprised by flip-flops 1816-1819 and the counter control logic AND gates 1808 and 1810 and OR gate 1812 to a frequency of 779 KHz. The output of this counter is then decoded into clock phases by AND gate 1830 which is amplified in inverters 1862 and 1846 to provide phase 1, by AND gate 1832 which is amplified in inverters 1864 and 1848 to provide phase 2, by AND gate 1834 to provide an early phase 2, and by AND gate 1850 to provide a late phase 1. Resistors 1888 and 1889, connected to terminals 1876 and 1877, respectively, provide the high level signals to drive LSI MOS circuit 1730 of FIG. 17.

OR gates 1814 and 1826, together with the resistive capacitive network 1882, 1883, and 1891, the resistive, capacitive network 1879, 1880, and 1890, together with terminals 1872 and 1873 comprise a power on start flip flop which generates a short pulse as power to the system is turned on. This short pulse signal is amplified in inverters 1860 and 1866 to provide a system master reset signal. AND gate 1842 senses an internal stop state in the coder/decoders 88 and provides a start signal to initialize and begin all operations of coder/decoder 88. Resistor 1881 and its associated terminal 1871 and resistor 1878 and its associated terminal 1870 provide "pull-up" operation to the open collectors of OR gates 1814 and 1826. Resistor 1887 connected to supplied terminal 1875 is used in connection with an enhanced version of the present invention with an external console input, to gate 1822 in order to pull it up or urge it to the inactive high state when the console is not connected.

OR gate 1836 provides a read enable signal for reading memory and for input operations. This read enable signal together with AND gate 1820 and OR gate 1838 drive AND gate 1852 which switches the coder/decoder 88 bus driver circuits 1000, as expressed preferably as circuits 1742-1745, to the receive state. AND gate 1868 also uses this signal to gate data and status inputs.

The logical network consisting of AND gates 1822 and 1854 along with OR gate 1840 provides a memory gating signal to allow data to pass from the memory to the coder/decoder 88. AND gate 1844 switches the coder/decoder 88 bus driver circuits 1742-1745 to the transmit state, and AND gate 1856 and inverter 1896 gate output data and command information. AND gate 1858 provides a write signal to data memory. AND gate 1824 and inverter 1828 are driven by input/output decoder circuit 1934, discussed hereinafter in connection with FIG. 19, and comprise input/output address decoder 916 described hereinabove in connection with FIG. 9.

In FIG. 19, the main timing chain for the system is contained in quadruple latch chips 1908 and 1909. The proper starting of this timing chain is assured by the logical network consisting of circuits 1901 to 1904. A request for input/output or a memory operation from request register 1926 through OR gate 1928 triggers advancement of the timing chain through AND gates 1906 and 1907.

Further, the inverter 1910 amplifies a ready signal from an external console, if one is desired, and thus is used only in the enhanced version of the present invention. The AND gate 1912 and the logical network consisting of gates 1914-1919 comprise a priority arbitration network which, again, is used only with an enhanced system according to the present invention in which multiple coder/decoder 88 are utilized. This network provides inputs to request register 1926 whose second rank is permit register 1930. Signal inputs which are not used in the basic system are forced to the inactive high state by "pull-up" resistors 1940, connected to terminal 1936, resistors 1941-1943, connected to terminal 1937, resistor 1944, connected to terminal 1938, and resistors 1945 and 1946, connected to terminal 1939. The presence of a request is sensed in OR gate 1928, and the request register 1926 is clocked by AND gate 1920 and cleared by AND gate 1921. The permit register 1930 is also clocked by AND gate 1924.

Decoder 1934 is used to provide input/output decoding to the input/output memory 96 of FIGS. 7 and 9 and also to an external console, if present in an enhanced system. Further decoding to this circuit is provided by AND gate 1932. Thus, decoder 1934 functions as I/O address decoder 916, in conjunction with AND gate 1932.

Since the apparatus of FIGS. 18 and 19 is interconnected in the complex fashion clearly set out in the drawings of FIGS. 18 and 19, including interconnections between pin numbers for various circuits and apparatus within the figures and interconnections between apparatus described with respect to FIGS. 18 and 19 and the remaining figures, as indicated by the numerical and alphanumerical interconnections described, no further detailed description is included here.

Figure 20:
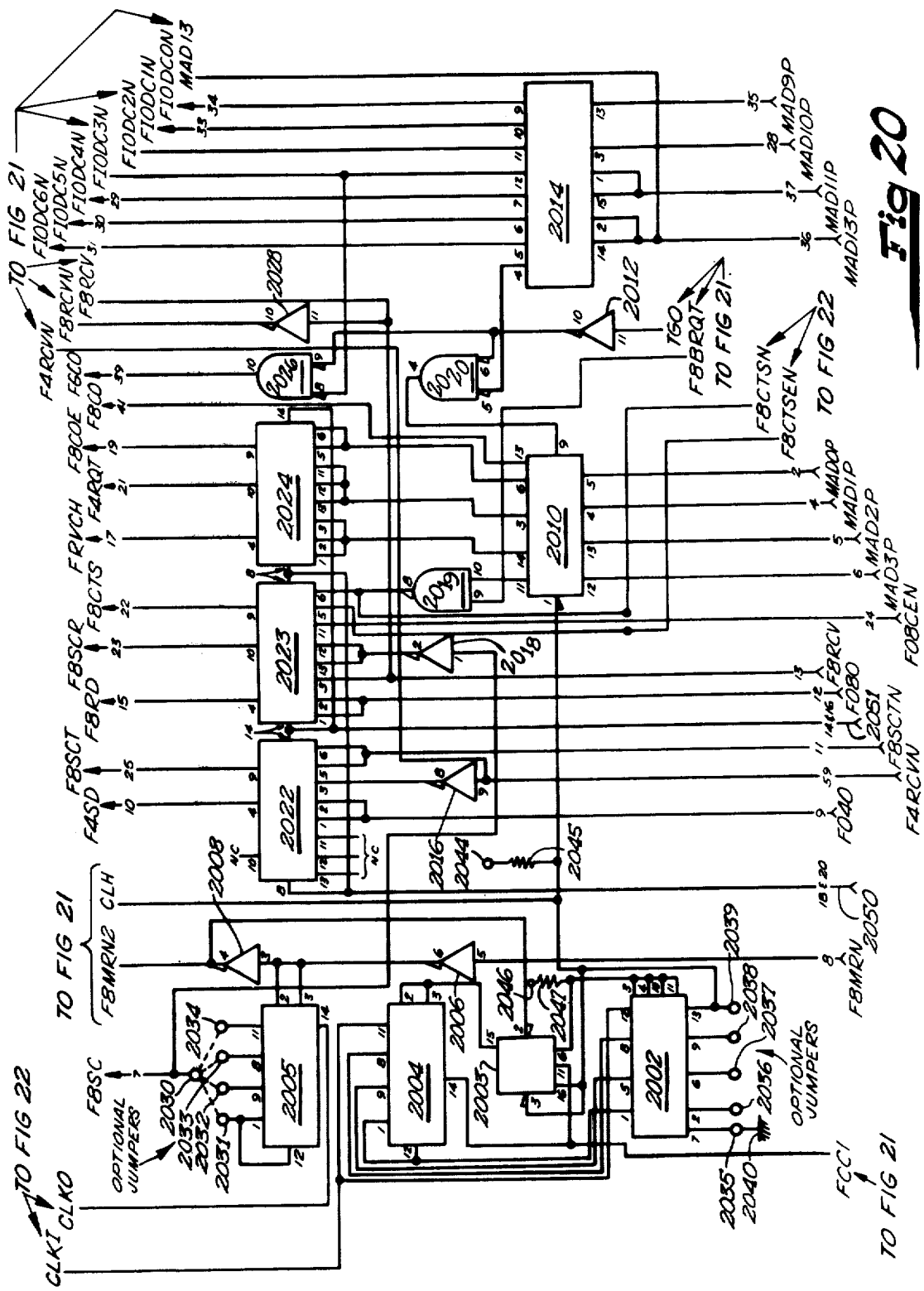
Figure 21:
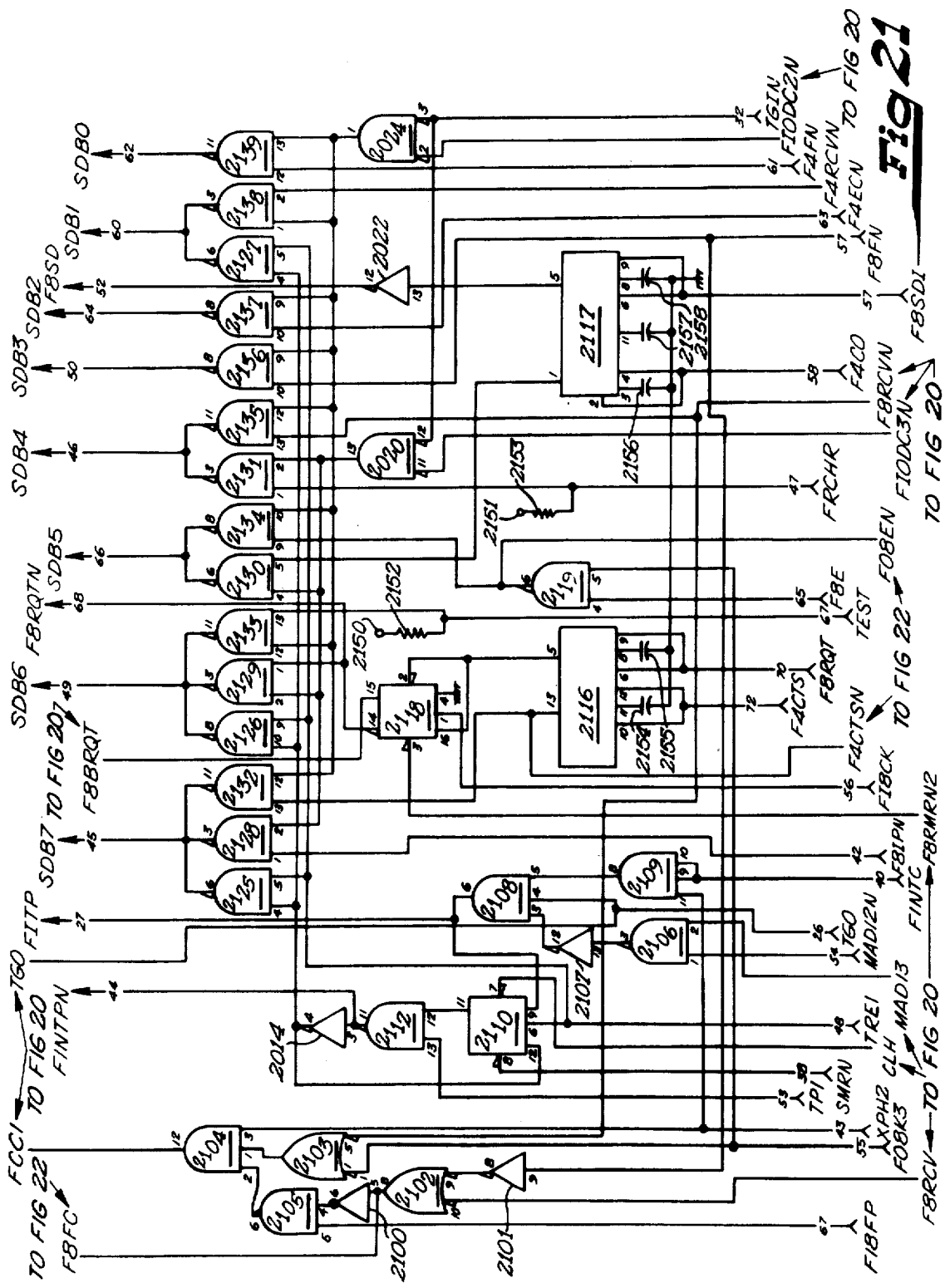
Figure 22:
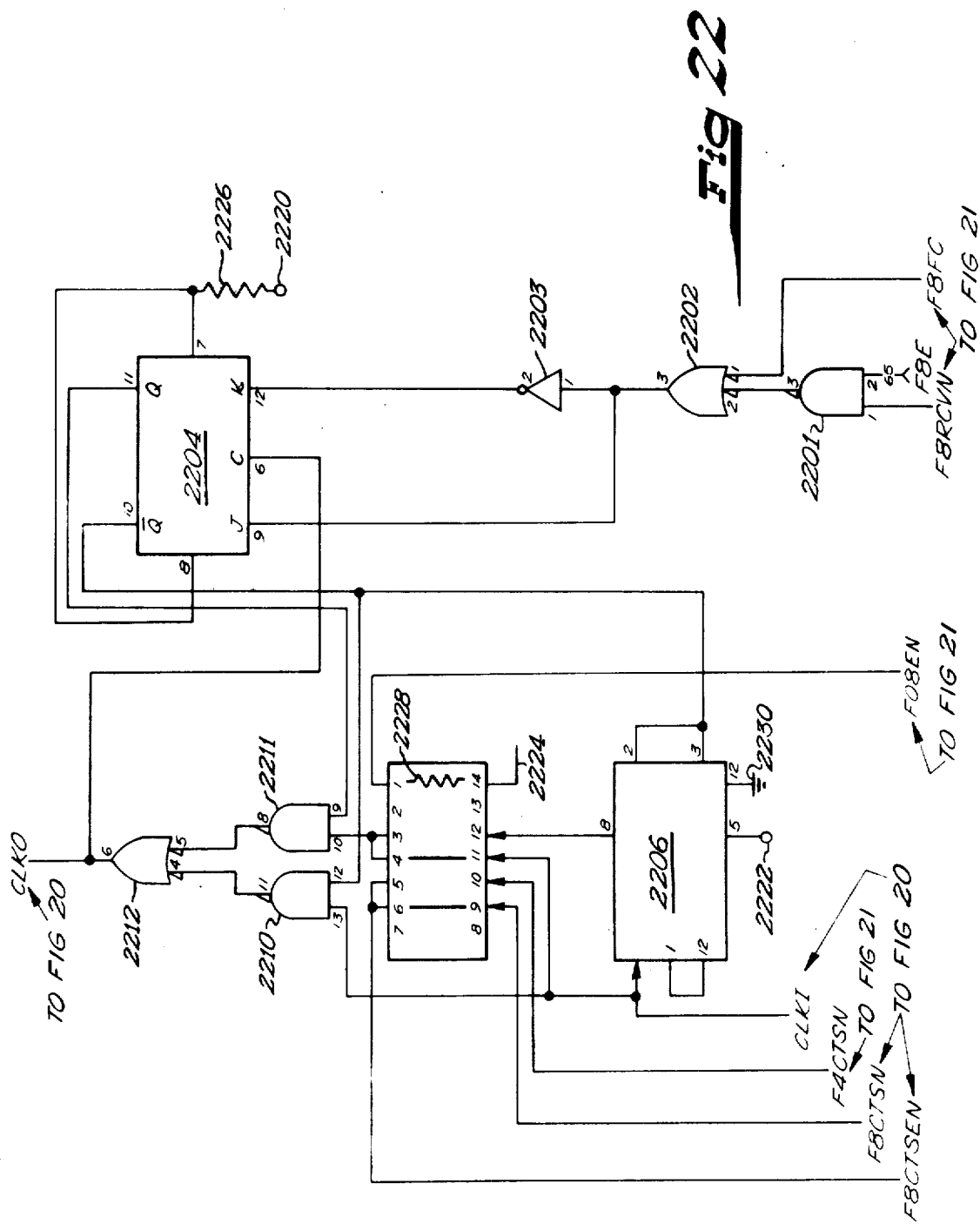

With respect to FIGS. 20, 21, and 22, these figures show I/O control logic forming a preferred, practical embodiment of input/output control 128 shown in FIGS. 7 and 12.

In FIG. 20, the serial clocking signals to controller side converter 56 are generated in elements 2002-2005. Counters 2004 and 2005 divide the system clock, as generated at 779 KHz according to the description of FIG. 18, to a frequency below 40 KHz acceptable by the drive being controlled. Comparator 2002 and flip-flop 2003 are used to strap counter 2004 for precise adjustment of the output frequency. This adjustment is accomplished by optional jumpers connected between connection 2030 and one of the connections 2031-2034 and by optional jumpers connected between connections 2036-2038 and connection 2035, which is grounded at ground connection 2040, or connection 2039. For example, the clock frequency generated in FIG. 18 is 779 KHz, and by the connection between junction points 2030 and 2032, and a connection between junction points 2035, 2037, and 2038, and a connection between junction points 2036 and 2039, the frequency of clock generator 1208 is adjusted to be 19.47 KHz.

Inverters 2006 and 2008 amplify the master reset signal generated by the power up circuitry of FIG. 18 and clear this clock to insure proper start of conditions. Start-stop control to this clock is provided in the logical network consisting of gates 2101-2104, described in connection with FIG. 21 hereinafter.

The EIA levels to the modem and the controller are provided by EIA output converters 2022-2024, which correspond to converters 56 and 114 as described in connection with FIGS. 7 and 12. These converters are driven by the I/O latches 2010, which correspond to I/O latches 1206 in FIG. 12, and proper signal levels are obtained through inverters 2016 and 2018. AND gate 2019 inhibits the controller side clear to send signal when the controller request to transmit signal is turned off or not present. The required drive voltages to these converters are supplied by terminals 50, connected to a negative supply in the preferred embodiment, and terminal 51, connected to a positive supply in the preferred practical, embodiment. The I/O latches 2010 are gated by AND gate 2020. I/O decoding occurs in decoder 2014, and output control information is gated by AND gate 2026. Timing for this AND gate 2026 is provided in inverter 2012. Inverter buffer 2028 buffers the receive condition signal to provide the necessary fan out or current capabilities.

Further with respect to FIG. 20, resistor 2045 connected to voltage supply terminal 2044, receiving a positive five volts in the preferred embodiment, provides a positive five volt "pull up" to inputs on circuits 2010 and 2003 and 2002, and resistor 2047, connected to a similar terminal 2046, provides a "pull-up" to circuit 2002.

With reference to FIG. 21, an input/output restart condition is detected by logical network 2106-2109, which is used to set the input/output restart flip-flop 2110. This restart signal is combined with permit information in AND gate 2112 and inverter 2114 and is used to set the coder/decoder restart flip-flop 1720-1722 and gate the necessary restart instructions onto the data bus 86 through bus drivers 2125-2127. System status information is provided to data bus 86 through bus drivers 2128-2139, and EIA converters 2116 and 2117 change input data levels to the proper logic levels for gating onto data bus 86 through bus drivers 2132, 2129, 2130.

Noise on the input data signals to converters 2116 and 2117 is filtered by capacitors 2154-2158, as is conventional.

Flip-flop 2118 delays the input request-to-transmit signal by one serial clock period to prevent premature clearing of the shift register 2501-2502.

Bus drivers 2128-2131 are gated by AND gate 2120, and bus drivers 2132-2139 are gated by AND gate 2124. Inverter 2122 inverts the controller side send data signal to the proper level. AND gate 2119 provides an output to coder/decoder 88 when both FIFO 66 and output shift register 70 of FIG. 14 are empty.

Signals which are not used in the basic system are returned to an inactive, logic high level by "pull-up" resistors 2152 connected to terminal 2150, and 2153 connected to terminal 2151.

Logic network 2100-2105 provides start/stop control to the clock counter 2002-2008 to prevent transferring data into or out of FIFO stack 66 when it is full or empty, respectively.

With respect to FIG. 22, a variable speed controller side serial clock may be selected by means of option block 2208. This option block allows the connection of extra stages in counter 2206 in order to drive clock counter 2002-2005, described in connection with FIG. 20, at a lower frequency. Normal or variable speed block options are multiplexed through AND gates 2210 and 2211 and OR gate 2212. The slow speed condition, when selected, is gated in logical network 2201–2203 and buffered in flip-flop 2204 to insure proper wave shape of the slow clock signal.

Unused input to flip-flop 2204 is again returned to an inactive, logic high through resistor 2226 connected to terminal 2220. Resistor 2228, connected to terminal 2224, provides a "pull-up" for AND gate 2119.

Since the apparatus of FIGS. 20, 21, and 22 is interconnected in the complex fashion clearly set out in the drawings of FIGS. 20, 21, and 22, including interconnections between pin numbers for the various circuits and apparatus and interconnections between the apparatus described with respect to these figures and the remaining figures, as indicated by the numerical and alphnumerical interconnections described, no further detailed description is included here.

Figure 23:
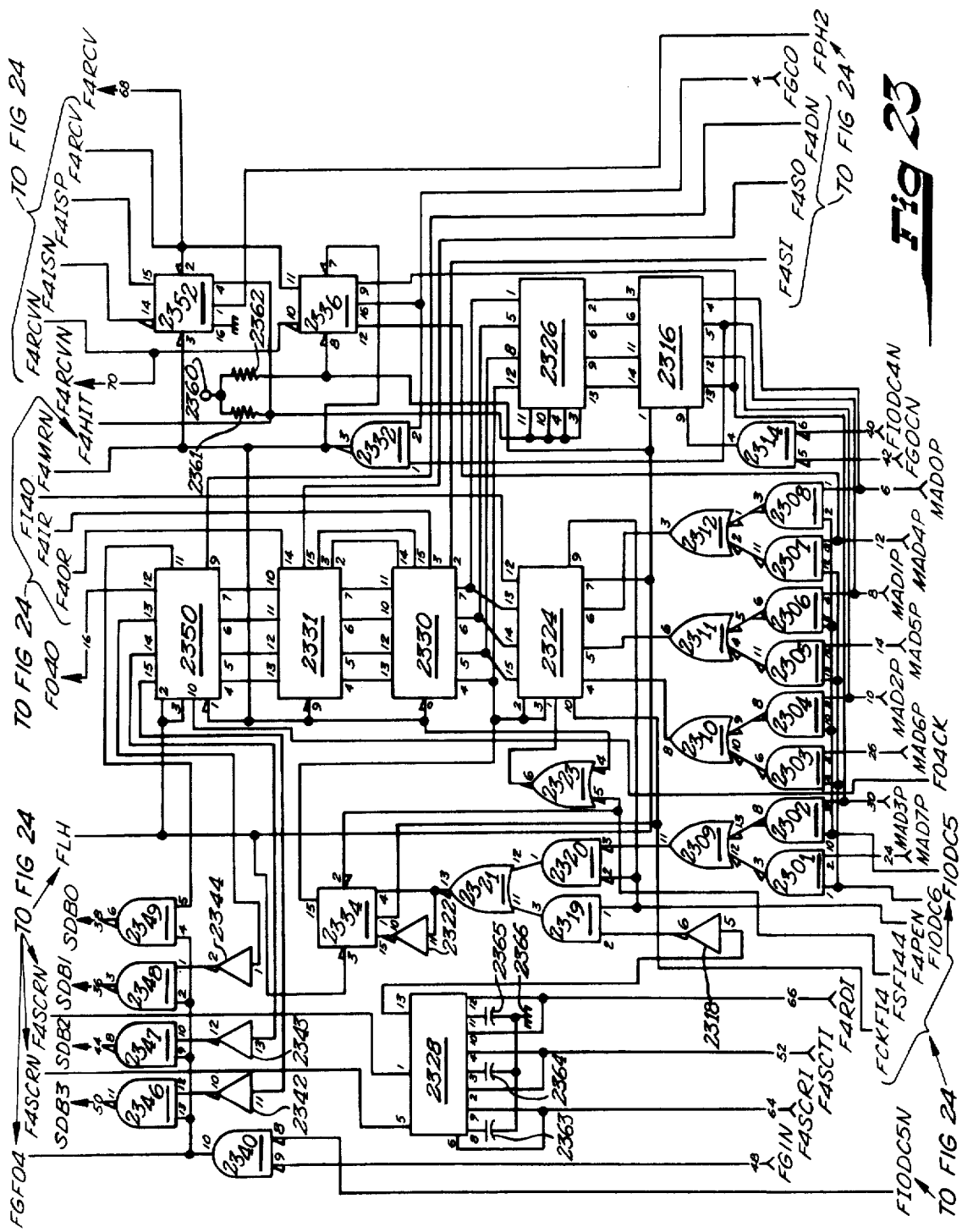
Figure 24:
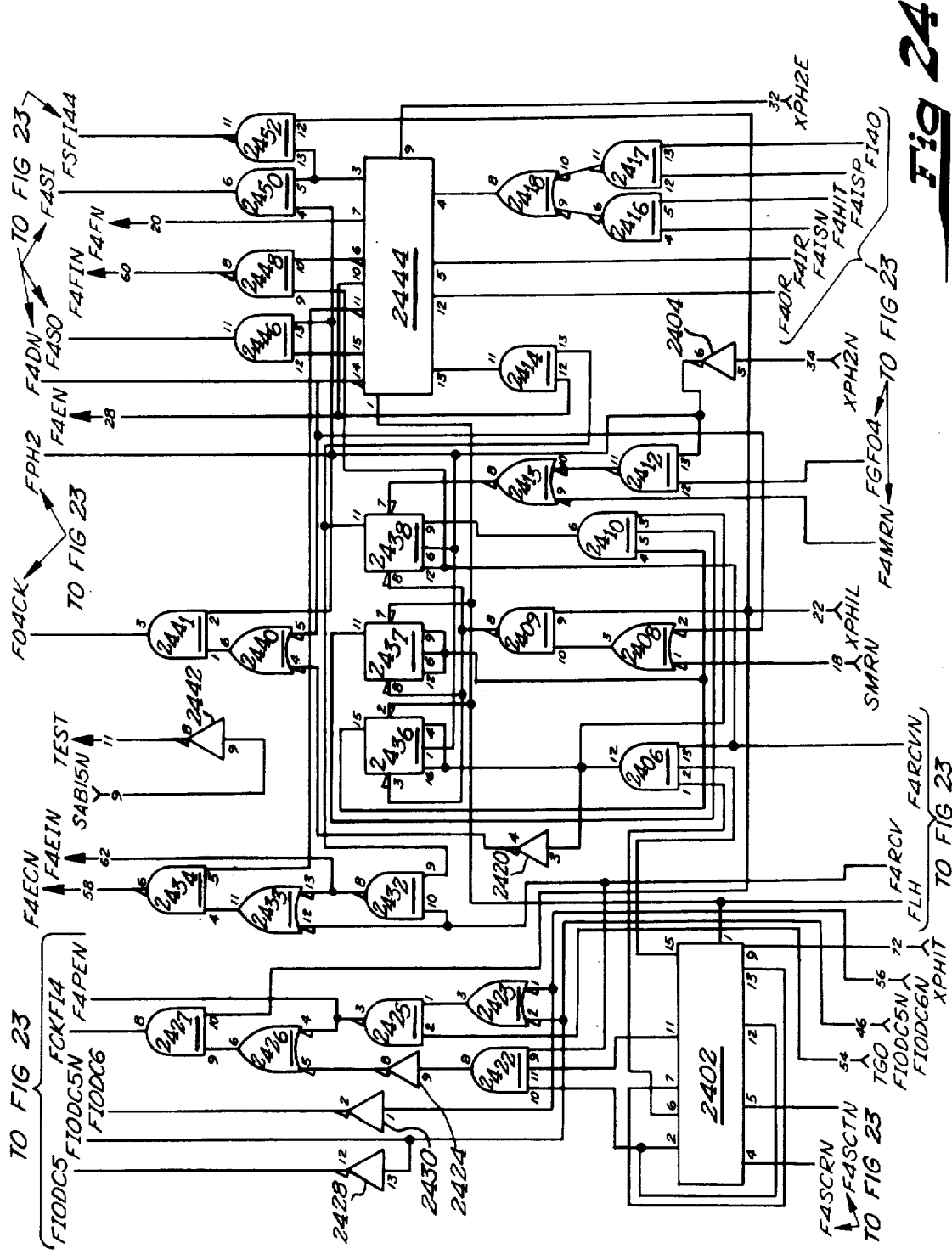

With respect to FIGS. 23 and 24, these figures show the logic circuitry forming a preferred, practical embodiment of input/output device 52 of FIGS. 7 and 13.

In FIG. 23, modem side FIFO 102 is shown as including FIFO circuits 2330 and 2331. The input shift register 100, as shown in FIGS. 7 and 13, is designated 2324 in FIG. 23, and output shift register 106 of FIGS. 7 and 13 is designated 2350 in FIG. 23. Gates 2301–2312 comprise a multiplexer to the input shift register 2324 to allow a selection of either the lower order four bits or the higher order four bits when transferring data from parallel data bus 86 to FIFO 2330 in an output mode.

EIA converter 2328 converts signal levels on the modem side serial clock receive, serial clock transmit, and read data signals, in a manner explained hereinbefore. Input signals to converter 2328 are filtered by capacitors 2363–2365.

Data input to coder/decoder 88 from the modem side output shift register 106 is inverted in inverters 2342–2344, and gated onto data bus 86 through bus drivers 2346–2349, comprising bus drivers 1302 of FIG. 13. Bus drivers 2346–2349 are under the control of AND gate 2340. Gates 2318–2322 provide an input to flip-flop 2334 which is a one bit extension of input shift register 2324. Parallel or serial mode of the input shift register is controlled by OR gate 2323. Quadruple latch circuit 2316 stores the synchronization code and forms synchronization logic unit 1304 of FIG. 13. Quadruple latch circuit 2316 is gated by AND gate 2314, and a comparison between the contents of quadruple latch circuit 2316 and the contents of input shift register 2324 is made in comparator 2326.

Resistor 2361 and its associated terminal 2360, provide "pull-up" to the open collector outputs of comparator 2326. When comparison is achieved, the in-synchronization flip-flop 2352 is set. The receive/transmit status of the modem side FIFO 102 is indicated by the content of flip-flop 2336. AND gate 2332 provides a master reset signal to this receive flip-flop 2336, as well as to FIFO circuits 2330 and 2331 and output shift register 2350.

Inputs to the circuits of FIGS. 23 and 24 are "pulled up" by resistor 2362 and terminal 2360, connected to positive five volts in the preferred embodiment of the present invention.

In FIG. 24, quadruple latch circuit 2402 is used as a sequential circuit to recover both the leading edge and the trailing edge pulses from the modem side serial clock receive and serial clock transmit signals. The logic network consisting of gates 2422–2427 combines this information with output commands and a clock signal to generate clock pulses to the modem side input shift register 100, as shown in FIGS. 7 and 13. AND gate 2425 in this network also provides a parallel enable signal to input shift register 100 to allow loading of parallel input information. Inverters 2428 and 2430 are used to invert input/output decoder 2014 active-low signals described above to the active-high levels required by multiplexer AND gates 2301–2308. The logic network 2432–2434 is used to provide the empty condition status signal for the modem side FIFO 102 and to generate the empty restart signal from the modem side FIFO 102 to the coder/decoder 88. The modem side output shift register 106 is clocked by logic network 2406, 2420, and 2440–2441.

Flip-flops 2436–2438 comprise a counter which counts the number of shifts in the modem side output shift register 106, as shown in FIGS. 7 and 13. This counter comprised by flip-flops 2436–2438 is clocked by system clock, phase 2, through inventer 2404, and cleared by logic gates 2408 and 2409. The counter is enabled by AND gate 2406, and can be preset to indicate full status by gates 2412 and 2413. AND gate 2410 also forms a part of the counter logic.

Quadruple latch 2444 is used to store status information for the modem side input/output circuitry 52 and command information to FIFO 102 and shift registers 100 and 106 as shown in FIGS. 7 and 13. AND gate 2446 provides a shift out signal to FIFO 102, and AND gate 2450 provides a shift in signal to modem side FIFO 102. AND gate 2448 generates a modem side FIFO 102 full reset signal to coder/decoder 88, and AND gate 2452 is used to preset input shift register 100, flip-flop 2334.

AND gate 2414 combines shift count information from counter 2436–2438 and FIFO 102 not empty status information to initiate a command to transfer data from FIFO 102 to the output shift register 106, which is buffered in latch 2444. Logic network 2416–2418 senses when input shift register 100 is full, and initiates a signal to transfer data from input shift register 100 to FIFO 102. This signal is also buffered in latch 2444.

Inverters 2442 provide a signal to an externally attached console, which is used only in an enhanced system, and is not necessary in the basic embodiment described here.

Since the apparatus of FIGS. 23 and 24 is interconnected in the complex fashion clearly set out in the drawings of FIGS. 23 and 24, including interconnections between pin numbers for various circuits and apparatus and interconnections between the apparatus described with respect to FIGS. 23 and 24 and the remaining figures, as indicated by numerical and alphanumerical interconnection designations, no further detailed description is included here.

Figure 25:
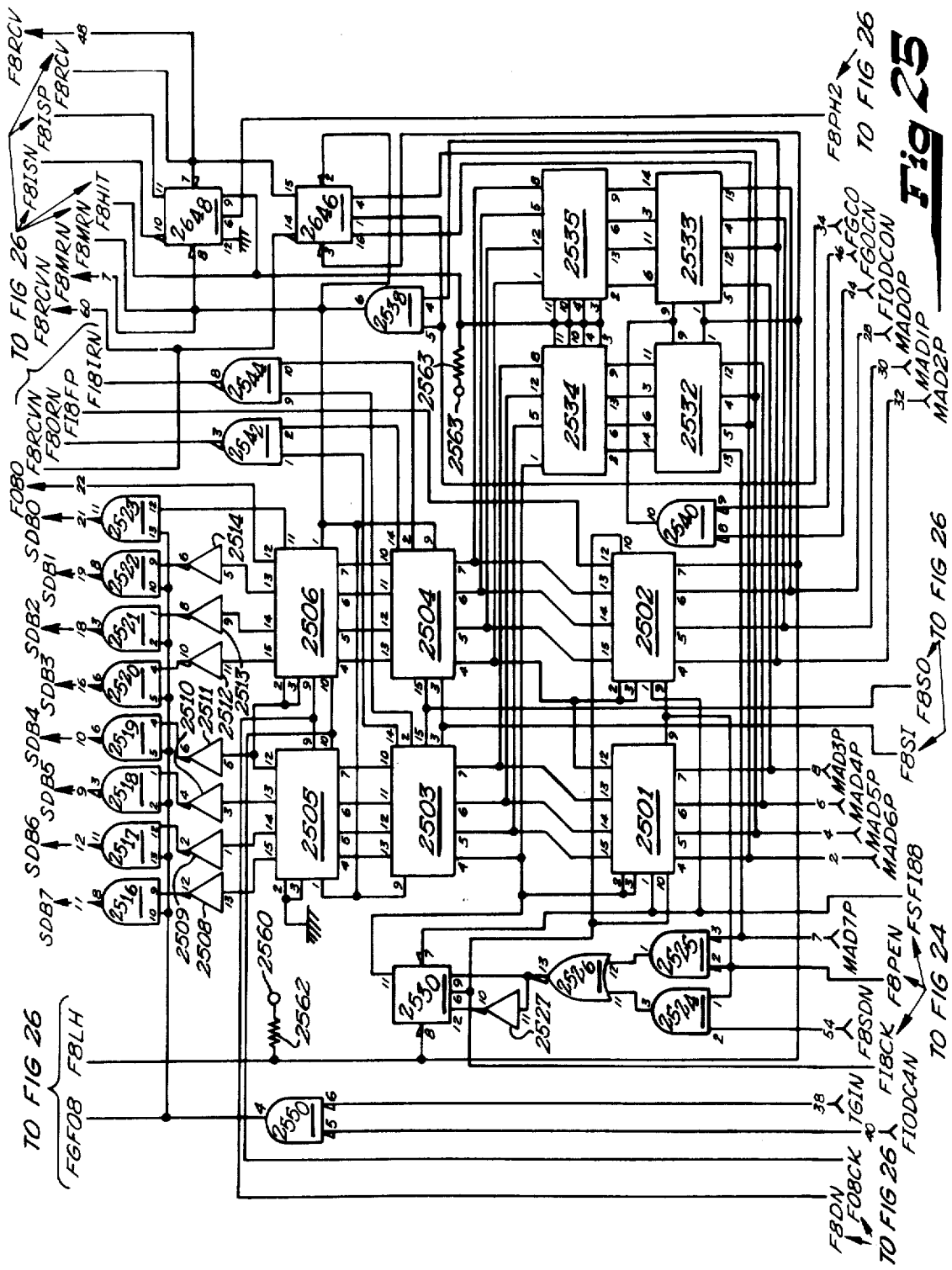
Figure 26:
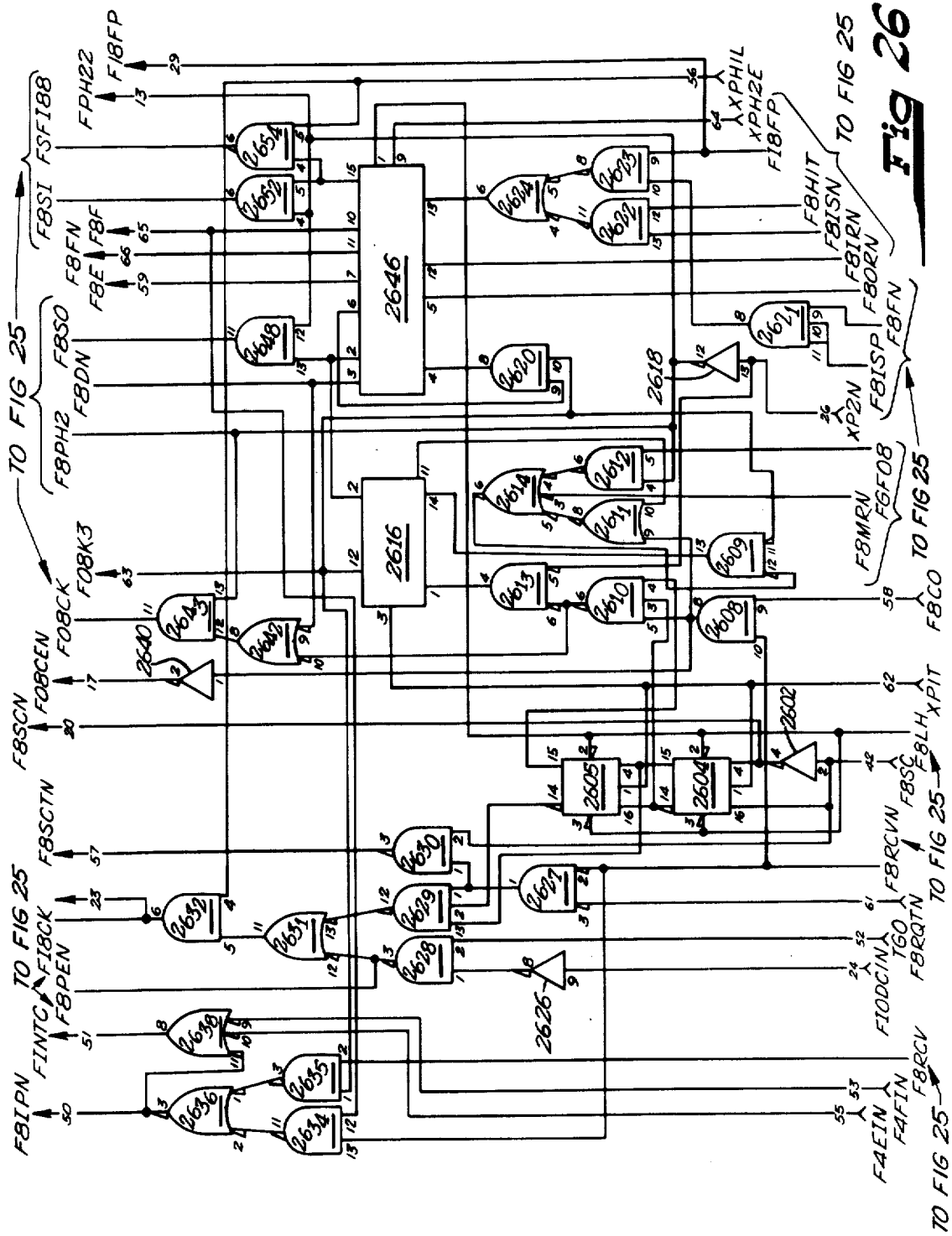

With respect to FIGS. 25 and 26, these figures show logic circuitry forming a preferred, practical embodiment of input/output block 50 of FIG. 7 and FIG. 14.

In FIG. 25, controller side FIFO 66 comprises FIFO circuits 2503 and 2504. Shift registers 2501 and 2502 together with flip-flop 2530 comprise input shift register 62 of FIGS. 7 and 14. Shift registers 2505 and 2506 comprise output shift register 70 of FIGS. 7 and 14. Inverters 2508–2514 invert signals from output shift register 70 to the proper levels for gating onto data bus 86 through bus drivers 2516–2523, comprising bus drivers 1402 of FIG. 14. Bus drivers 2516–2523 are clocked by AND gate 2550.

The logic network 2524-2527 forms an input multiplexer used to gate controller side send-data or output-data into the highest order flip-flop 2530 of input shift register 62. AND gates 2542 and 2544 provide FIFO output request and input request data to indicate the empty or full status of controller side FIFO 66.

Latches 2532 and 2533 contain the synchronization code and form synchronization logic 1404 of FIG. 14. Latches 2532 and 2533 are gated by AND gate 2540, and the contents of these latches are compared with the contents of input shift register 62, in the form of registers 2501 and 2502, in comparators 2534 and 2535.

Resistor 2563 in connection with terminal 2561 again forms a "pull-up" for the open collector outputs of comparators 2534 and 2535 in a manner described hereinbefore. When comparison is achieved, the in synchronization flip-flop 2548 is set.

AND gate 2538 is used to generate a master reset signal to the in synchronization flip-flop 2548, and to controller side FIFO 66, circuits 2503-2504, and its corresponding output shift register 70, circuits 2505-2506.

Flip-flop 2546 contains the receive/transmit status of controller side FIFO 66. Further, unused inputs to the circuits in FIGS. 25 and 26 are returned to the inactive, logic high state by resistor 2562 connected to terminal 2560, and thus to a positive five volt potential in the preferred embodiment.

In FIG. 26, logic network 2634-2636 provides a restart signal from controller side FIFO 66 to coder/decoder 88, and OR gate 2638 provides restart condition status signals to coder/decoder 88. The logic network 2626-2632 forms clocking signals to controller side input shift register 62, and AND gate 2630, in this network, furnishes the controller side converter serial-clock-transmit signal.

Flip-flops 2604 and 2605, which are driven by controller side serial clock through inverter 2602, form a sequential circuit which recovers the leading edge and the trailing edge pulses from the controller side serial clock. The controller side input shift register 62 is clocked through logic gates 2642 and 2643.

AND gate 2608 is used to enable controller side output shift register 70 clocking and also controller side serial-clock-receive signals through inverter 2640 when the EIA status register 2010, described in connection with FIG. 20, contains a true carrier-on flag. This flag indicates to the controller that received data is available from output shift register 70.

Counting of the number of shifts in the output shift register 70 occurs in counter 2616 which is driven by the logical network 2608-2614.

Quadruple latch 2646 contains controller side FIFO 66 status information, and latch 2646 is used to generate commands for shifting information within controller side FIFO 66. AND gate 2648 provides the shift-out signal and AND gate 2652 provides the shift-in signal to controller side FIFO 66. AND gate 2654 is used to set the highest order flip-flop 2530, described in connection with FIG. 25, of the input shift register 62.

AND gate 2620 monitors counter 2616 and the status bit in latch 2646 which indicates that controller side FIFO 66 is not empty. Further, AND gate 2620 generates a signal which permits transfer of data within controller side FIFO 66 into output shift register 70. This signal from AND gate 2620 is buffered in latch 2646.

Transfer from input shift register 62 to controller side FIFO 66 is initiated by logic network 2621-2624, which is again buffered by latch 2646. Inverter 2618 is used as an amplifier for system clock phase 2.

Since the apparatus of FIGS. 25 and 26 is interconnected in the complex fashion clearly set out in the drawings of FIGS. 25 and 26, including interconnections between pin numbers for various circuits and apparatus and interconnections between apparatus described with respect to FIGS. 25 and 26 and the remaining figures, as indicated by the numerical and alphanumerical interconnections described, no further detailed description is included here.

TABLE V

GLOSSARY OF INTERCONNECTION ABBREVIATIONS FOR FIGURES 15-26

| TERM | FULL MEANING OF TERM | FIG. ORIG. | OTHER FIGURES |
|---|---|---|---|
| MAD0P to | MEMORY ADDRESS BIT 0 POSITIVE | 15 | 16, 18-21, 23, 25 |
| MAD15P | MEMORY ADDRESS BIT 15 POSITIVE | 15 | 16, 18-21, 23, 25 |
| MAD12N to | MEMORY ADDRESS BIT 12 NEGATIVE | 15 | 18, 21 |
| MAD15N | MEMORY ADDRESS BIT 15 NEGATIVE | 15 | 18, 21 |
| TS00 | TIMING SELECT 00 | 15 | 16 |
| TCS1 to | TIMING CHIP SELECT 1 | 15 | 16 |
| TCS7 | TIMING CHIP SELECT 7 | 15 | 16 |
| SAB0N to | SYSTEM ADDRESS BUS 0 NEG | 17 | 15 |
| SAB15N | SYSTEM ADDRESS BUS 15 NEG | 17 | 15 |
| TP1 | TIMING PERMIT 1 | 19 | 15, 17, 21 |
| XPH2E | XTAL CLOCK PHASE 2 EARLY | 18 | 15, 19, 24, 26 |
| XP2T | XTAL CLOCK PHASE 2 TO TIMING | 18 | 15, 19, 21 |
| T22P | TIMING STATE 22 POSITIVE | 19 | 15 |
| SDB0 to | SYSTEM DATA BUS BIT 0 | 17 | 16, 21 |
| SDB7 | SYSTEM DATA BUS BIT 7 | 17 | 16, 21 |

TABLE V - CONTINUED

| TERM | FULL MEANING OF TERM | FIG. ORIG. | OTHER FIGURES |
|---|---|---|---|
| MMI0 to | MEMORY MULTIPLEXOR INPUT BIT 0 | 16 | |
| MMI7 | MEMORY MULTIPLEXOR INPUT BIT 7 | 16 | |
| TGMIN | TIMING GATE MEMORY IN NEGATIVE | 18 | 16 |
| TRW | TIMING READ/WRITE | 18 | 16 |
| TGM | TIMING GATE MEMORY | 18 | 16 |
| UW1N | CPU WAIT #1 NEG | 17 | 19 |
| UR1N | CPU REQUEST #1 NEG | 17 | 19 |
| UT1IN | CPU INTERNAL STATE T1I NEG | 17 | |
| USTOPN | CPU INTERNAL STATE STOP NEG | 17 | 18 |
| XP1T | XTAL CLOCK PHASE 1 TO TIMING | 18 | 17, 19, 24, 26 |
| TWTN | TIMING WAIT CONDITION NEG | 19 | 17 |
| PWR | POWER INTERRUPT CONDITION | 18 | 17 |
| FITP | FIFO INTERRUPT | 21 | 17 |
| TCPB | TIMING CP TO BUS | 18 | 17 |
| TBCP | TIMING BUS TO CP | 18 | 17 |
| TRQ1N | TIMING REQUEST REG BIT 1 NEG | 19 | 17 |
| T22N | TIMING STATE 22 NEG | 19 | 17 |
| XP1C | XTAL CLOCK PHASE 1 to CPU | 18 | 17, 19 |
| XP2C | XTAL CLOCK PHASE 2 TO CPU | 18 | 17 |
| XP2N | XTAL CLOCK PHASE 2 NEG | 18 | 17, 24 |
| UIC | CPU INTERRUPT CLEAR | 18 | 17 |
| SMRN | SYSTEM MASTER RESET NEG | 18 | 24 |
| XPH1L | XTAL CLOCK PHASE 1 LATE | 18 | 24, 26 |
| TREI | TIMING READ ENABLE INPUT | 18 | 21 |
| TGIN | TIMING GATE INPUT | 18 | 21, 23, 25 |
| TGO | TIMING GATE OUTPUT | 18 | 20, 21, 24, 26 |
| T32N | TIMING STATE 32 NEG | 19 | 18 |
| FINTPN | FIFO INTERRUPT IN PROGRESS NEG | 21 | 18 |
| TIODC1 | TIMING I/O DECODER 1 | 19 | 18 |
| T41N | TIMING STATE 41 NEG | 19 | 18 |
| T42P | TIMING STATE 42 POS | 19 | |
| CRDYN | CONSOLE READY NEG | 19 | |
| TRQ2N to | TIMING REQUEST REG BIT 2 NEG | 19 | |
| TRQ4N | TIMING REQUEST REG BIT 4 NEG | 19 | |
| TP2 to | TIMING PERMIT 2 | 19 | |
| TP4 | TIMING PERMIT 4 | 19 | |
| TIODC0 to | TIMING I/O DECODER 0 | 19 | |
| TIODC7 | TIMING I/O DECODER 7 | 19 | |
| UW2N | CPU WAIT #2 NEG | | 19 |
| UW4N | CPU WAIT #4 NEG | | 19 |
| UR2N | CPU REQUEST #2 NEG | | 19 |
| UR4N | CPU REQUEST #4 NEG | | 19 |
| CLKI | F8 CLOCK COUNTER INPUT | 20 | 22 |
| F8SC | F8 SERIAL CLOCK | 20 | 26 |
| F8MRN2 | F8 MASTER RESET NEG #2 | 20 | 21 |
| CLH | CONTROL LOGIC HIGH | 20 | 21 |
| F4SD | F4 SEND DATA (EIA OUTPUT) | 20 | MODEM (Fig. 1) |
| F8SCT | F8 SERIAL CLOCK TRANSMIT (EIA OUTPUT) | 20 | CONTROLLER (Fig. 1) |
| F8RD | F8 READ DATA (EIA OUTPUT) | 20 | CONTROLLER (Fig. 1) |
| F8SCR | F8 SERIAL CLOCK RECEIVE (EIA OUTPUT) | 20 | CONTROLLER (Fig. 1) |
| F8CTS | F8 CLEAR TO SEND (EIA OUTPUT) | 20 | CONTROLLER (Fig. 1) |
| F8CO | F8 CARRIER ON | 20 | 26 |
| FGCO | FIFO GATE CONTROL OUT | 20 | 23, 25 |
| F4RCVN | F4 RECEIVE STATE NEG | 23,25 | 20, 21, 24, 26 |
| F8RCVN | F8 RECEIVE STATE NEG | 20 | 21, 22 |
| F8RCV | F8 RECEIVE STATE | 25 | 20, 21, 26 |
| FGOCN | FIFO GATE OUTPUT CONTROL NEG | 20 | 23, 25 |
| FIODC0N to | FIFO I/O DECODE BIT 0 NEG | 20 | 21, 23, 24, 25, 26 |
| FIODC6N | FIFO I/O DECODE BIT 6 NEG | 20 | 21, 23, 24, 25, 26 |

TABLE V - CONTINUED

| TERM | FULL MEANING OF TERM | FIG. ORIG. | OTHER FIGURES |
|---|---|---|---|
| FCC1 | FIFO CLOCK CONTROL SIGNAL 1 | 21 | 20 |
| F8MRN | F8 MASTER RESET NEG | 25 | 20, 26 |
| CLKO | F8 CLOCK COUNTER OUTPUT | 22 | 20 |
| -12VDC | -12 VOLTS DC POWER | POWER SUPPLY | 20, 25 |
| FO40 | F4 OUTPUT SHIFT REG BIT 0 | 23 | 20 |
| F8SCTN | F8 SERIAL CLOCK TRANSMIT NEG | 26 | 20 |
| +12VDC | +12 VOLTS DC POWER | POWER SUPPLY | 20 |
| FO80 | F8 OUTPUT SHIFT REG BIT 0 | 25 | 20 |
| FO8CEN | F8 OUT SHIFT REG CLOCK ENABLE NEG | 26 | 20 |
| F8RQTN | F8 REQUEST TO TRANSMIT NEG | 21 | 26 |
| F8SD | F8 SEND DATA | 21 | 25 |
| FO8K3 | F8 OUT SHIFT REG COUNTER BIT 3 | 26 | 21 |
| FINTC | FIFO INTERRUPT CONDITION | 26 | 21 |
| F8IPN | F8 INTERRUPT IN PROGRESS NEG | 26 | 21 |
| FI8CK | F8 INPUT SHIFT REG CLOCK | | 21 |
| F4CTS | F4 CLEAR TO SEND (EIA INPUT) | MODEM (Fig. 1) | 21 |
| F4RQT | F4 REQUEST TO TRANSMIT (EIA OUTPUT) | 20 | MODEM (Fig. 1) |
| F8COE | F8 CARRIER ON (EIA OUTPUT) | 20 | CONTROLLER (Fig. 1) |
| F8RQT | F8 REQUEST TO TRANSMIT (EIA INPUT) | CONTROLLER (Fig. 1) | 21 |
| FO8EN | F8 OUTPUT SHIFT REG EMPTY NEG | 21 | 22 |
| FRCHR | FIFO REV CHANNEL RECEIVER | | 21 |
| F4CO | F4 CARRIER ON (EIA INPUT) | MODEM (Fig. 1) | 21 |
| F8SDI | F8 SEND DATA INPUT (EIA INPUT) | CONTROLLER (Fig. 1) | 21 |
| F8FN | F8 FIFO FULL NEG | 26 | 21 |
| F4ECN | F4 EMPTY CONDITION NEG | 24 | 21 |
| F4FN | F4 FIFO FULL NEG | 24 | 21 |
| F8E | F8 FIFO EMPTY | 26 | 21, 22 |
| F8CTSN | F8 CLEAR TO SEND NEG | 20 | 22 |
| F8CTSEN | F8 CLEAR TO SEND ENABLE NEG | 22 | 20 |
| F4CTSN | F4 CLEAR TO SEND NEG | 21 | 22 |
| FSCEN | FIFO SLOW CLOCK ENABLE NEG | 21 | 22 |
| FGFO4 | FIFO GATE F4 OUTPUT SHIFT REG | 23 | 24 |
| F4SCRN | F4 SERIAL CLOCK RECEIVE NEG | 23 | 24 |
| F4SCTN | F4 SERIAL CLOCK TRANSMIT NEG | 23 | 24 |
| F4LH | F4 LOGIC HIGH | 23 | 24 |
| F4OR | F4 FIFO OUTPUT REQUEST | 23 | 24 |
| F4IR | F4 FIFO INPUT REQUEST | 23 | 24 |
| FI40 | F4 INPUT SHIFT REGISTER BIT 0 | 23 | 24 |
| F4MRN | F4 MASTER RESET NEG | 23 | 24 |
| F4HIT | F4 SYNCHRONIZATION HIT | 23 | 24 |
| F4ISN | F4 IN SYNCHRONIZATION NEG | 23 | 24 |
| F4ISP | F4 IN SYNCHRONIZATION POS | 23 | 24 |
| F4RCV | F4 RECEIVE STATUS | 23 | 24 |
| F4SCRI | F4 SERIAL-CLOCK RECEIVE (EIA INPUT) | MODEM (Fig. 1) | 23 |
| F4SCTI | F4 SERIAL-CLOCK TRANSMIT (EIA INPUT) | MODEM (Fig. 1) | 23 |
| F4RDI | F4 READ-DATA (EIA INPUT) | MODEM (Fig. 1) | 23 |
| FCKFI4 | FIFO CLOCK F4 INPUT SHIFT REGISTER | 24 | 23 |
| FSFI44 | FIFO SET F4 INPUT SHIFT REG BIT 4 | 24 | 23 |
| F4PEN | F4 INP SHIFT REG PARALLEL ENABLE NEG | 24 | 23 |
| FO4CK | F4 OUTPUT SHIFT REG CLOCK | 24 | 23 |
| F4SI | F4 FIFO SHIFT IN | 24 | 23 |
| F4SO | F4 FIFO SHIFT OUT | 24 | 23 |

TABLE V - CONTINUED

| TERM | FULL MEANING OF TERM | FIG. ORIG. | OTHER FIGURES |
|---|---|---|---|
| 4DN | F4 FIFO DUMP NEG | 24 | 23 |
| PH2 | FIFO PHASE 2 | 24 | 23 |
| IODC5 | FIFO I/O DECODER OUTPUT 5 | 24 | 23 |
| IODC6 | FIFO I/O DECODER OUTPUT 6 | 24 | 23 |
| 4EIN | F4 EMPTY INTERRUPT | 24 | 26 |
| 8BRQT | F8 BUFFERED REQUEST TO TRANSMIT | 21 | 20 |
| 4EN | F4 EMPTY NEG | 24 | |
| 4FIN | F4 FULL INTERRUPT | 24 | 26 |
| GFO8 | FIFO GATE F8 OUTPUT SHIFT REG | 25 | 26 |
| 8LH | F8 LOGIC HIGH | 25 | 26 |
| 8ORN | F8 FIFO OUTPUT REQUEST NEG | 25 | 26 |
| I8FP | F8 INPUT SHIFT REG FULL POS | 25 | 26 |
| 8IRN | F8 FIFO INPUT REQUEST NEG | 25 | 26 |
| 8HIT | F8 SYNC CODE HIT | 25 | 26 |
| 8ISN | F8 IN-SYNC NEG | 25 | 26 |
| 8ISP | F8 IN-SYNC POS | 25 | 26 |
| 8DN | F8 FIFO DUMP NEG | 26 | 25 |
| O8CK | F8 OUTPUT SHIFT REG CLOCK | 26 | 25 |
| I8CK | F8 INPUT SHIFT REG CLOCK | 26 | 25 |
| 8PEN | F8 INP SHIFT REG PARALLEL ENABLE NEG | 26 | 25 |
| SFI88 | F8 INP SHIFT REG SET BIT 8 | 26 | 25 |
| 8SI | F8 FIFO SHIFT IN | 26 | 25 |
| 8SO | F8 FIFO SHIFT OUT | 26 | 25 |
| 8SCN | F8 SERIAL CLOCK NEG | 26 | |
| 8PH2 | F8 PHASE 2 | 26 | 25 |
| 8F | F8 FIFO FULL | 26 | |

Some abbreviations as used in the above Table V are:
"FIFO" indicates a first in first out register.
"I/O" indicates input/output.
"NEG" indicates NEGATIVE.
"CPU" and "CP" indicate circuit 1730.
"REG" indicates REGISTER.
"XTAL" indicates CRYSTAL.
"F4" refers to modem side FIFO 102.
"F8" refers to controller side FIFO 66.
"F14" refers to modem side input shift register 100.
"F18" refers to converter side input shift register 62.
"F04" refers to modem side output shift register 106.
"F08" refers to converter side output shift register 70.

Further, as is now obvious, the term or acronym itself listed in the left most column, the full meaning of the term is in the next column, the figure in which the signal originates is in the next column, and other figures in which the signal may be found are listed in the right most column.

Next, Table VI indicates the interconnections between the electrical connections indicated in FIGS. 1-26, aside from those interconnections which are indicated upon the figures themselves. It will then be noted that each electrical connection not indicating a specific interconnection with a connection of an adjacent figure, with a like applied acronym, includes a two digit number either at the interconnection termination inserted within the interconnection, and inserted thus for no electrical purpose but only for the purposes of illustration. The latter two digit interconnection designations then provide the remaining interconnections for the electronic circuit shown in FIGS. 15-26 according to the following Table VI where signal names are set out in the left most columns, and interconnections are set out in the next two columns to the right of the signal acronyms.

As set out in Table VI, the designation J1 refers to the logical circuitry shown in FIGS. 9, 15 and 16. The designation J2 refers to the logical circuitry shown in FIGS. 10 and 17. The designation J3 refers to the logical circuitry shown in FIGS. 11, 18, and 19. The designation J4 refers to the logical circuitry shown and set out in FIGS. 12, 20, 21, and 22. The designation J5 refers to the logical circuitry shown in FIGS. 13, 23, and 24. The designation J6 refers to the logical circuitry set out in FIGS. 14, 25, and 26. The designation J-7 refers to an empty test socket, not shown.

Therefore, by way of example, the initial entries to Table VI indicates a connection under the acronym SDB4 where the connection is to emanate from J1-10, which is the circuitry shown in FIGS. 9, 15, and 16 and extend to the electrical connection J2-28, which is the circuitry as found in FIGS. 10 and 17. For the specific example, is is found that the 10 designated interconnection emanates from AND gates 1626 of FIG. 16, and is then interconnected to circuit 1742 on FIG. 17.

Thus, Table VI indicates the totality of interconnections between the circuitry set forth in FIGS. 15-16, aside from those interconnections indicated directly on the figures. These figures also include interconnections to a path of transmission of data, as indicated in FIG. 1. Thus, certain interconnections are made to a modem, in the preferred embodiment example, such as modem D of FIG. 1. Further, certain connections are required to a line controller, in the preferred embodiment shown in FIG. 1, such as to line controller B. These interconnections are not included in the associated TABLE VI, but are clearly indicated on the drawings of FIGS. 15-26 and the remaining figures, and may be specifically seen from Table V, where it is indicated that selected signals originate in certain figures, as indicated, and appear also in FIG. 1, where a connection to a modem or controller is indicated. Since the purpose and termination of these interconnections are indicated by Table V, and since these interconnections to the modem and controller are the normal interconnections to be made between a modem and a controller, with the compaction device of the present invention merely interrupting these connections and acting as a transparent interface, as discussed above, and since these interconnections to modem and controllers are well known to those skilled in the art, no further discussion of these signals is deemed necessary.

TABLE VI

| | | | |
|---|---|---|---|
| T22N | J3- 7 | TO | J2-52 |
| T22P | J3- 8 | | J1-38 |
| TP2 | J3- 9 | | J1- 8 |
| TP1 | J3-10 | | J2-62 |
| | J1- 9 | | J2-62 |
| | J3-10 | | J4-53 |
| XPH1L | J3-15 | | J5-22 |
| | J5-22 | | J6-56 |
| TRQ1N | J3-22 | | J2-50 |
| TWTN | J3-36 | | J2-72 |
| XPH2E | J3-46 | | J1-36 |
| | J3-46 | | J5-32 |
| | J5-32 | | J6-64 |
| | J3-48 | | J4-32 |
| | J4-32 | | J6-38 |
| | J6-38 | | J5-48 |
| PWR | J3-50 | | J2-66 |
| TGM | J3-51 | | J1-63 |
| TGO | J3-52 | | J4-26 |
| | J4-26 | | J5-54 |
| | J5-54 | | J6-52 |
| SMRN | J3-53 | | J5-18 |
| | J3-53 | | J4-38 |
| XP2N | J3-55 | | J5-34 |
| | J5-34 | | J6-26 |
| | J3-55 | | J2-60 |
| XP2T | J3-56 | | J1-37 |
| | J3-56 | | J4-43 |
| XP1C | J3-57 | | J2-59 |
| TRW | J3-60 | | J1-30 |
| XP1T | J3-63 | | J2-34 |
| | J3-63 | | J5-72 |
| | J5-72 | | J6-62 |

TABLE VI CONTINUED

| | | | |
|---|---|---|---|
| TRCP | J3-64 | TO | J2-63 |
| TRE1 | J3-65 | | J4-48 |
| TGM1N | J3-47 | | J1-65 |
| XP2C | J3-54 | | J2-58 |
| TCPB | J3-61 | | J2-61 |
| FGOCN | J3-66 | | J5-42 |
| | J5-42 | | J6-46 |
| UIC | J3-68 | | J2-51 |
| -9VDC | J4-20 | TO | J5-13 |
| | J5-13 | | J6-14 |
| FO40 | J5-16 | TO | J4- 9 |
| F4FN | J5-20 | | J4-61 |
| F4ECN | J5-58 | | J4-63 |
| F4FIN | J5-60 | | J6-53 |
| F4EIN | J5-62 | | J6-55 |
| F4RCUN | J5-70 | | J4-59 |
| F8SC | J4- 7 | TO | J6-40 |
| F10DC4N | J4-29 | | J5-40 |
| | J5-40 | | J6-40 |
| F10DC5N | J4-30 | | J5-46 |
| F10DC6N | J4-31 | | J5-56 |
| F10DC1N | J4-33 | | J6-24 |
| F10DCON | J4-34 | | J6-44 |
| FGCO | J4-39 | | J5- 4 |
| | J5- 4 | | J6-34 |
| F8RQTN | J4-68 | | J6-61 |
| F1TP | J4-27 | | J2-65 |
| F1NTPN | J4-44 | | J3-59 |
| F8CO | J4-41 | | J6-58 |
| F8SD | J4-52 | | J6-54 |
| +10VDC | J4-14 | | Power Supply +10 |
| | J4-14 | | J4-16 |
| SAB3N | J2- 4 | TO | J1-34 |
| SAB2N | J2-36 | | J1-43 |
| SAB1N | J2- 2 | | J1-42 |
| SABON | J2-38 | | J1-33 |
| SAB11N | J2-20 | | J1-13 |

TABLE VI CONTINUED

| | | |
|---|---|---|
| SAB10N | J2-53 | J1-14 |
| SAB9N | J2-18 | J1-15 |
| SAB8B | J2-54 | J1-16 |
| SAB7N | J2-42 | J1-20 |
| SAB5N | J2- 8 | J1-26 |
| SAB4N | J2- 6 | J1-19 |
| SAB15N | J2-56 | J1-48 |
| | J2-56 | J5- 9 |
| SAB14N | J2-55 | J1-49 |
| SAB13N | J2-24 | J1-50 |
| SAB12N | J2-22 | J1-51 |
| USTOPN | J2-64 | J3-49 |
| UW1N | J2-68 | J3-37 |
| UR1N | J2-70 | J3-20 |
| SAB6N | J2-40 | J1-27 |
| SDB4 | J1-10 TO J2-28 |
| | J2-28 | J4-46 |
| | J4-46 | J6-10 |
| SDB6 | J1-11 | J2-44 |
| | J2-44 | J4-49 |
| | J4-49 | J6-12 |
| MAD11P | J1-12 | J3-35 |
| | J3-35 | J4-37 |
| MAD8P | J1-17 | J3-44 |
| MAD9P | J1-24 | J3-34 |
| | J3-34 | J4-35 |
| SDB5 | J1-29 | J4-66 |
| | J4-66 | J6- 9 |
| | J6- 9 | J2-14 |
| SDB7 | J1-31 | J2-30 |
| | J2-30 | J4-45 |
| | J4-45 | J6-11 |
| MAD10P | J1-25 | J3-30 |
| | J3-30 | J4-28 |
| SDB0 | J1-44 | J2-32 |
| | J2-32 | J4-62 |
| | J4-62 | J5-38 |
| | J5-38 | J6-21 |
| MAD14P | J1-55 | J3-45 |
| SDB3 | J1-57 | J2-16 |
| | J2-16 | J4-50 |
| | J4-50 | J5-50 |
| | J5-50 | J6-16 |
| SDB1 | J1-58 | J2-26 |
| | J2-26 | J4-60 |
| | J4-60 | J5-36 |
| | J5-36 | J6-19 |
| SDB2 | J1-64 | J2-43 |
| SDB2 | J2-43 TO J4-64 |
| | J4-64 | J5-44 |
| | J5-44 | J6-18 |
| MAD4P | J1-18 | J5-12 |
| | J5-12 | J6- 6 |
| MAD7P | J1-21 | J5-24 |
| | J5-24 | J6-36 |
| MAD5P | J1-22 | J5-14 |
| | J5-14 | J6- 4 |
| MAD6P | J1-28 | J5-26 |
| | J5-26 | J6- 2 |
| MAD0P | J1-32 | J4- 2 |
| | J4- 2 | J5- 6 |
| | J5- 6 | J6-28 |
| MAD3P | J1-35 | J4- 6 |
| | J4- 6 | J5-30 |
| | J5-30 | J6- 8 |
| MAD13N | J1-39 | J3-19 |
| MAD12N | J1-40 | J3-41 |
| | J3-41 | J4-54 |
| MAD1P | J1-41 | J4- 4 |
| | J4- 4 | J5- 8 |
| | J5- 8 | J6-30 |
| MAD2P | J1-46 | J4- 5 |
| | J4- 5 | J5-10 |
| | J5-10 | J6-32 |
| MAD15P | J1-47 | J3-62 |
| MAD15N | J1-53 | J3-18 |
| MAD13P | J1-56 | J4-36 |

TABLE VI CONTINUED

| | | | |
|---|---|---|---|
| -9VDC | J1- 2 | | Power Supply -9 |
| | J1- 2 | | J2-39 |
| | J2-39 | | J4-18 |
| | J4-18 | | J4-20 |
| MAD0 | J7-53 | TO | J6-28 |
| MAD1 | J7-54 | | J6-30 |
| MAD2 | J7-55 | | J6-32 |
| MAD3 | J7-56 | | J6- 8 |
| MAD4 | J7-57 | | J6- 6 |
| MAD5 | J7-58 | | J6- 4 |
| MAD6 | J7-59 | | J6- 2 |
| MAD7 | J7-60 | | J6-36 |
| MAD8 | J7-61 | | J3-44 |
| MAD9 | J7-62 | | J4-35 |
| MAD10 | J7-63 | | J4-28 |
| MAD11 | J7-64 | | J4-37 |
| MAD12 | J7-65 | | J1-52 |
| MAD13 | J7-66 | | J4-36 |
| MAD14 | J7-67 | | J3-45 |
| MAD15 | J7-68 | | J3-62 |
| SDB0 | J7- 5 | | J6-21 |
| SDB1 | J7- 6 | | J6-19 |
| SDB2 | J7- 7 | | J6-18 |
| SDB3 | J7- 8 | | J6-16 |
| SDB4 | J7- 9 | | J6-10 |
| SDB5 | J7-10 | | J6- 9 |
| SDB6 | J7-11 | | J6-12 |
| SDB7 | J7-12 | | J6-11 |
| PERM1N | J7-14 | | GND |
| CRENP | J7-20 | | J3-17 |
| C1NTN | J7-30 | | J2-48 |
| C1NTPN | J7-31 | | J3-58 |
| IODC0 | J7-32 | | J3-31 |
| IODC1 | J7-33 | | J3-43 |
| IODC2 | J7-34 | | J3-32 |
| IODC3 | J7-35 | | J3-33 |
| IODC4 | J7-36 | | J3-26 |
| IODC5 | J7-37 | TO | J3-27 |
| IODC6 | J7-38 | | J3-28 |

TABLE VI CONTINUED

| | | | |
|---|---|---|---|
| IODC7 | J7-39 | | J3-29 |
| FPH22 | J7-42 | | J6-13 |
| T22C | J7-43 | | J3- 8 |
| T42C | J7-44 | | J3-16 |
| CT1I1 | J7-50 | | J2-57 |
| USTOPN | J7-51 | | J2-64 |
| TRE1 | J7-52 | | J3-65 |
| SAB15 | J7-28 | | J5-11 |
| CPS1N | J7-46 | | J2-46 |
| | | | |
| F8MRN | J6- 7 | TO | J4- 8 |
| F080 | J6-22 | | J4-12 |
| FI8CK | J6-23 | | J4-56 |
| F8RCV | J6-48 | | J4-13 |
| F8IPN | J6-50 | | J4-42 |
| F8SCTN | J6-57 | | J4-11 |
| F08EN | J6-59 | | J4-65 |
| F08K3 | J6-63 | | J4-55 |
| F8FN | J6-66 | | J4-51 |
| F08CEN | J6-17 | | J4-24 |
| FINTC | J6-51 | | J4-40 |

Table VII may now be explained. Table VII sets forth the complete list of instructions which are stored in memory 90 and in particular in ROM instruction memory 92 and ROM I/O memory 96 of FIGS. 7, 9, and 16. In particular, the program listing of Table VII is set out in five columns, repeated twice across the page, unless a single five column representation is set out. The first column includes four digits, the first two of which set out an address which defines the particular ROM in which the eight bits of logic are stored. The next two digits indicate in which of the 256 locations in the particular preferred memory circuit the eight bits of logic are stored. For examle, the designation 00 indicates circuit 1606 of FIG. 16; the designation 01 indicates memory circuit 1605 of FIG. 16; the designation 02 indicates memory circuit 1604 of FIG. 16; the designation 03 indicates memory circuit 1603 of FIG. 16. Memory circuit 1602 of FIG. 16 is not currently used, except for test, and is intended for an enhanced system.

Further, I/O memory 96 of FIG. 7 and 9 and memory circuit 1501 of FIG. 16 is lastly indicated in Table VII with the designation 00, also. Since circuit 1501 performs as I/O memory only, this dual use of designation 00 causes no difficulty.

Within each memory circuit, i.e. 1602–1605 of instruction memory 92 or 1601 of I/O memory 96, 256 unique locations are allowed by the preferred circuit used, as will be set out hereinafter in Table VIII. Thus, the last two digits of the left-most column indicate the storage location in the ROM circuitry. The next column consists of a decimal point followed by two hexadecimal digits, eight bits in total logic, which is stored in the location indicated. As is well documented by the instruction manual for the microprocessor 1730, a single microcode instruction may consist of one, two, or three eight bit groupings in one, two, or three successive addresses.

The first two columns are the only columns containing information required for the operation of the present invention. The next three columns contain information as an aid to the preparation and understanding of the microcode listing. The information in the second column, in fact completely describes the microcode necessary for operating according to the present invention, and by referencing the manual published by the manufacturer of the microprocessor circuit 1730, the microcode listing may be completely decoded and understood. However, for ease of understanding of the present invention, the right most three columns have been included.

The right most three columns are an easily read interpretation of the microcode listing. They define the operation and function of a mcirocode instruction in a more readable form. In particular, the third column contains a symbol which may be used to refer to the location indexed more easily than using its hexadecimal, base 16, address. Since comparatively few locations need to be referred to during the assembly process, this column is vacant in many locations. The fourth column contains the memonic for the microcode istruction.

The fifth and last column is the address field, which is useful in connection with all microcode instructions which are more than eight bits in length. This column may contain a symbol for a location, which normally references a symbol found in the third column, or may contain an absolute hexadecimal description used as a part of the instruction. The use of this field in also defined in the instruction manual for the microprocessor 1730.

The only differences from the instructions as set forth in the manual for microprocessor 1730 and the above are with respect to the memonics, which vary from those used in the instruction manual as follows: the designation IC is used in place of the manual designation IN; the designation DE is used in place of the manual designation DC; and the designation EX is used in place of the manual designation XR. Also, one added memonic instruction is included in Table VII, i.e. DC, which is used to define a constant which is stored in the ROM and generates eight bits of logic equal to whatever pattern exists in the address field. In addition, three other instructions are included in the listing of the memonics in Table VII, but are used to control the assembly process only and do not generate any microcode. Thus, these "instructions" are not actual instructions, but aids, and these are: EQU which is used to define the location of a symbol which has been assembled at a different time; OGN which is used to define the starting location of the assembly; and END which ends the assembly.

Further, when resort is had to the documentation accompanying microprocessor circuit 1730, care must be taken to adjust the number bases when necessary. The listing of Table VII is assembled according to hexacimal, base 16, notation entirely for all addressing, instructions, and other numerical values. The microprocessor documentation accompanying circuit 1730 generally shows all numerical values in binary or decimal base 10. Conversion from hexadecimal to binary or decimal base 10 is clearly within the skill of the art.

TABLE VII

| | | | | |
|---|---|---|---|---|
| 0000 | .2F | | OGN | 0000 |
| 0000 | .2F | IB0 | EQU | 01A7 |
| 0000 | .2F | CS3 | EQU | 02FE |
| 0000 | .2F | CS4 | EQU | 0253 |
| 0000 | .2F | DS5 | EQU | 03A5 |
| 0000 | .2F | RX0 | EQU | 0181 |
| 0000 | .2F | TX0 | EQU | 0163 |
| 0000 | .2F | TS0 | EQU | 0100 |
| 0000 | .2F | DI0 | EQU | 0230 |
| 0000 | .2F | DF1 | EQU | 0202 |
| 0000 | .2F | CC2 | EQU | 0255 |
| 0000 | .2F | CS0 | EQU | .0293 |
| 0000 | .2F | DF2 | EQU | 0303 |
| 0000 | .C0 | | LAA | |
| 0001 | .C0 | | LAA | |
| 0002 | .46 | | CAL | CR2 |
| 0003 | .93 | | | |
| 0004 | .00 | | | |
| 0005 | .44 | | JMP | IB0 |
| 0006 | .A7 | | | |
| 0007 | .01 | | | |
| 0008 | .E0 | | LEA | |
| 0009 | .45 | | INP2 | |
| 000A | .0A | | RRC | |
| 000B | .C4 | | LAE | |
| 000C | .03 | | RFC | |
| 000D | .44 | | JMP | CC3 |
| 000E | .03 | | | |
| 000F | .00 | | | |
| 0010 | .30 | | ICL | |
| 0011 | .61 | | OUT20 | |
| 0012 | .45 | | INP2 | |
| 0013 | .24 | | NDI | 04 |
| 0014 | .04 | | | |
| 0015 | .49 | | INP4 | |
| 0016 | .43 | | JFZ | CS3 |
| 0017 | .FE | | | |
| 0018 | .02 | | | |
| 0019 | .BA | | CPC | |
| 001A | .2B | | RTZ | |
| 001B | .44 | | JMP | CS3 |
| 001C | .FE | | | |
| 001D | .02 | | | |
| 001E | .FF | | DC | FF |
| 001F | .FF | | DC | FF |
| 0020 | .30 | | ICL | |
| 0021 | .61 | | OUT20 | |
| 0022 | .45 | | INP2 | |
| 0023 | .24 | | NDI | 04 |
| 0024 | .04 | | | |
| 0025 | .49 | | INP4 | |
| 0026 | .43 | | JFZ | CS4 |
| 0027 | .53 | | | |
| 0028 | .02 | | | |
| 0029 | .3F | | CPM | |

TABLE VII CONTINUED

| | | | |
|---|---|---|---|
| 002A | .2B | | RTZ |
| 002B | .44 | | JMP CS4 |
| 002C | .B3 | | |
| 002D | .02 | | |
| 002E | .FF | | DC FF |
| 002F | .FF | | DC FF |
| 0030 | .61 | | ØUT20 |
| 0031 | .53 | | ØUT11 |
| 0032 | .31 | | DEL |
| 0033 | .03 | | ICB |
| 0034 | .0B | | RFZ |
| 0035 | .44 | | JMP DS5 |
| 0036 | .A5 | | |
| 0037 | .03 | | |
| 0038 | .DE | | LDL |
| 0039 | .36 | | LLI F6 |
| 003A | .F6 | | |
| 003B | .F8 | | LMA |
| 003C | .30 | | ICL |
| 003D | .F8 | | LMD |
| 003E | .30 | | ICL |
| 003F | .C7 | | LAM |
| 0040 | .80 | | ADA |
| 0041 | .60 | | JTC TX0 |
| 0042 | .6B | | |
| 0043 | .01 | | |
| 0044 | .70 | | JTS RX0 |
| 0045 | .81 | | |
| 0046 | .01 | | |
| 0047 | .47 | | INP3 |
| 0048 | .80 | | ADA |
| 0049 | .70 | | JTS TS0 |
| 004A | .00 | | |
| 004B | .01 | | |
| 004C | .46 | RS0 | CAL CR0 |
| 004D | .96 | | |
| 004E | .00 | | |
| 004F | .3E | | LMI 40 |
| 0050 | .40 | | |
| 0051 | .06 | | LAI 48 |
| 0052 | .48 | | |
| 0053 | .57 | | ØUT13 |
| 0054 | .61 | DX0 | ØUT20 |
| 0055 | .4B | | INP5 |
| 0056 | .61 | | ØUT20 |
| 0057 | .4B | | INP5 |
| 0058 | .3C | | CPI F3 |
| 0059 | .F3 | | |
| 005A | .68 | | JTZ DX2 |
| 005B | .62 | | |
| 005C | .00 | | |
| 005D | .3C | | CPI FE |
| 005E | .FE | | |
| 005F | .48 | | JFZ FBD |
| 0060 | .75 | | |
| 0061 | .00 | | |
| 0062 | .61 | DX2 | ØUT20 |
| 0063 | .4B | | INP5 |
| 0064 | .3C | | CPI F2 |
| 0065 | .F2 | | |
| 0066 | .48 | | JFZ FBD |
| 0067 | .75 | | |
| 0068 | .00 | | |
| 0069 | .61 | | ØUT20 |
| 006A | .4B | | INP5 |
| 006B | .3C | | CPI F3 |
| 006C | .F3 | | |
| 006D | .68 | | JTZ DX3 |
| 006E | .82 | | |
| 006F | .00 | | |
| 0070 | .3C | | CPI FE |
| 0071 | .FE | | |
| 0072 | .68 | | JTZ DX3 |
| 0073 | .82 | | |
| 0074 | .00 | | |
| 0075 | .06 | FBD | LAI 06 |
| 0076 | .06 | | |
| 0077 | .57 | | ØUT13 |
| 0078 | .57 | | ØUT13 |
| 0079 | .06 | | LAI FF |
| 007A | .FF | | |
| 007B | .5B | | ØUT15 |
| 007C | .06 | | LAI 48 |
| 007D | .48 | | |
| 007E | .57 | | ØUT13 |
| 007F | .44 | | JMP DX2 |
| 0080 | .62 | | |
| 0081 | .00 | | |
| 0082 | .36 | DX3 | LLI FF |
| 0083 | .FF | | |
| 0084 | .F8 | | LMA |
| 0085 | .3C | | CPI FE |
| 0086 | .FE | | |
| 0087 | .06 | | LAI 01 |
| 0088 | .01 | | |
| 0089 | .5F | | ØUT17 |
| 008A | .06 | | LAI 32 |
| 008B | .32 | | |
| 008C | .48 | | JFZ DN0 |
| 008D | .30 | | |
| 008E | .02 | | |
| 008F | .53 | DF0 | ØUT11 |
| 0090 | .53 | | ØUT11 |
| 0091 | .16 | | LCI 40 |
| 0092 | .40 | | |
| 0093 | .44 | | JMP DF1 |
| 0094 | .02 | | |
| 0095 | .C2 | | |
| 0096 | .36 | CR0 | LLI F8 |
| 0097 | .F8 | | |
| 0098 | .C7 | | LAM |
| 0099 | .0A | | RRC |
| 009A | .03 | | RFC |
| 009B | .2E | CR2 | LHI 07 |
| 009C | .07 | | |
| 009D | .36 | | LLI F8 |
| 009E | .F8 | | |
| 009F | .3E | | LMI 00 |
| 00A0 | .00 | | |
| 00A1 | .36 | | LLI FF |

TABLE VII CONTINUED

| | | | |
|---|---|---|---|
| 00A2 .FF | | | |
| 00A3 .3E | | LMI | F3 |
| 00A4 .F3 | | | |
| 00A5 .36 | | LLI | F5 |
| 00A6 .F5 | | | |
| 00A7 .26 | | LEI | 40 |
| 00A8 .40 | | | |
| 00A9 .FC | CR4 | LME | |
| 00AA .31 | | DEL | |
| 00AB .48 | | JFZ | CR4 |
| 00AC .A9 | | | |
| 00AD .00 | | | |
| 00AE .06 | | LAI | CD |
| 00AF .CD | | | |
| 00B0 .44 | | JMP | CR5 |
| 00B1 .D9 | | | |
| 00B2 .00 | | | |
| 00B3 .16 | CCA | LCI | 40 |
| 00B4 .40 | | | |
| 00B5 .36 | | LLI | 0C |
| 00B6 .0C | | | |
| 00B7 .C8 | CC0 | LEA | |
| 00B8 .43 | | INP1 | |
| 00B9 .A0 | | NDA | |
| 00BA .50 | | JFS | CC2 |
| 00BB .55 | | | |
| 00BC .02 | | | |
| 00BD .5D | C40 | ØUT15 | |
| 00BE .D1 | C42 | LCB | |
| 00BF .F9 | | LMB | |
| 00C0 .30 | | ICL | |
| 00C1 .C6 | | LAL | |
| 00C2 .3C | | CPI | F6 |
| 00C3 .F6 | | | |
| 00C4 .23 | | RTC | |
| 00C5 .36 | | LLI | 06 |
| 00C6 .06 | | | |
| 00C7 .07 | | RET | |
| 00C8 .FF | | DC | FF |
| 00C9 .FF | | DC | FF |
| 00CA .FF | | DC | FF |
| 00CB .FF | | DC | FF |
| 00CC .FF | | DC | FF |
| 00CD .61 | CF0 | ØUT20 | |
| 00CE .49 | | INP4 | |
| 00CF .46 | CF1 | CAL | CS0 |
| 00D0 .98 | | | |
| 00D1 .02 | | | |
| 00D2 .0D | CF3 | RST1 | |
| 00D3 .46 | CF4 | CAL | CC0 |
| 00D4 .B7 | | | |
| 00D5 .00 | | | |
| 00D6 .44 | | JMP | CF0 |
| 00D7 .CD | | | |
| 00D8 .00 | | | |
| 00D9 .51 | CR5 | ØUT10 | |
| 00DA .59 | | ØUT14 | |
| 00DB .36 | | LLI | F9 |
| 00DC .F9 | | | |
| 00DD .F8 | | LMA | |
| 00DE .07 | | RET | |
| 00DF .FF | | DC | FF |
| 00E0 .3C | DF6 | CPI | FF |
| 00E1 .FF | | | |
| 00E2 .0B | | RFZ | |
| 00E3 .36 | DF7 | LLI | 05 |
| 00E4 .05 | | | |
| 00E5 .61 | | ØUT20 | |
| 00E6 .49 | | INP5 | |
| 00E7 .61 | | ØUT20 | |
| 00E8 .46 | | CAL | DF2 |
| 00E9 .0B | | | |
| 00EA .03 | | | |
| 00EB .44 | | JMP | DF7 |
| 00EC .E3 | | | |
| 00ED .00 | | | |
| 00EE .FF | | DC | FF |
| 00EF .FF | | DC | FF |
| 00F0 .60 | CH0 | JTC | C42 |
| 00F1 .BE | | | |
| 00F2 .00 | | | |
| 00F3 .3C | | CPI | 2F |
| 00F4 .2F | | | |
| 00F5 .0B | | RFZ | |
| 00F6 .36 | CH1 | LLI | 00 |
| 00F7 .00 | | | |
| 00F8 .61 | | ØUT20 | |
| 00F9 .49 | | INP4 | |
| 00FA .46 | | CAL | CC0 |
| 00FB .B7 | | | |
| 00FC .00 | | | |
| 00FD .44 | | JMP | CH1 |
| 00FE .F6 | | | |
| 00FF .00 | | | |
| 0100 .00 | | END | |
| 0100 .00 | | ØGN | 0100 |
| 0100 .00 | CR0 | EQU | 0096 |
| 0100 .00 | CH0 | EQU | 024B |
| 0100 .00 | CCA | EQU | 00B3 |
| 0100 .00 | CF0 | EQU | 00CD |
| 0100 .00 | IB0 | EQU | 0005 |
| 0100 .06 | TS0 | LAI | 30 |
| 0101 .30 | | | |
| 0102 .57 | | ØUT13 | |
| 0103 .06 | | LAI | 0A |
| 0104 .0A | | | |
| 0105 .5F | | ØUT17 | |
| 0106 .36 | | LLI | F9 |
| 0107 .F9 | | | |
| 0108 .3E | | LMI | 00 |
| 0109 .00 | | | |
| 010A .46 | | CAL | CR0 |
| 010B .96 | | | |
| 010C .00 | | | |
| 010D .36 | | LLI | F8 |
| 010E .F8 | | | |
| 010F .3E | | LMI | 80 |
| 0110 .80 | | | |
| 0111 .61 | TS11 | ØUT20 | |
| 0112 .49 | | INP4 | |
| 0113 .61 | | ØUT20 | |
| 0114 .49 | | INP4 | |

TABLE VII CONTINUED

| | | | |
|---|---|---|---|
| 0115 .3C | | CPI | 32 |
| 0116 .32 | | | |
| 0117 .43 | | JFZ | FBC |
| 0118 .61 | | | |
| 0119 .01 | | | |
| 011A .45 | | INP2 | |
| 011B .80 | | ADA | |
| 011C .70 | | JTS | TS3 |
| 011D .2D | | | |
| 011E .01 | | | |
| 011F .47 | | INP3 | |
| 0120 .24 | | NDI | 10 |
| 0121 .10 | | | |
| 0122 .48 | | JFZ | TS4 |
| 0123 .31 | | | |
| 0124 .01 | | | |
| 0125 .36 | | LLI | FF |
| 0126 .FF | | | |
| 0127 .C7 | | LAM | |
| 0128 .3C | | CPI | FE |
| 0129 .FE | | | |
| 012A .68 | | JTZ | TS4 |
| 012B .31 | | | |
| 012C .01 | | | |
| 012D .36 | TS3 | LLI | F9 |
| 012E .F9 | | | |
| 012F .3E | | LMI | 80 |
| 0130 .80 | | | |
| 0131 .45 | TS4 | INP2 | |
| 0132 .02 | | RLC | |
| 0133 .40 | | JFC | TS4 |
| 0134 .31 | | | |
| 0135 .01 | | | |
| 0136 .61 | CX0 | OUT20 | |
| 0137 .49 | | INP4 | |
| 0138 .3C | | CPI | 32 |
| 0139 .32 | | | |
| 013A .68 | | JTZ | CX0 |
| 013B .36 | | | |
| 013C .01 | | | |
| 013D .C8 | | LBA | |
| 013E .36 | | LLI | F9 |
| 013F .F9 | | | |
| 0140 .C7 | | LAM | |
| 0141 .80 | | ADA | |
| 0142 .06 | | LAI | 23 |
| 0143 .23 | | | |
| 0144 .60 | | JTC | CX31 |
| 0145 .49 | | | |
| 0146 .01 | | | |
| 0147 .06 | | LAI | 2E |
| 0148 .2E | | | |
| 0149 .5D | CX31 | OUT16 | |
| 014A .5B | | OUT15 | |
| 014B .5D | | OUT16 | |
| 014C .5B | | OUT15 | |
| 014D .5D | | OUT16 | |
| 014E .5B | | OUT15 | |
| 014F .5D | | OUT16 | |
| 0150 .5B | | OUT15 | |
| 0151 .5D | | OUT16 | |
| 0152 .5B | | OUT15 | |
| 0153 .5D | | OUT16 | |
| 0154 .5B | | OUT15 | |
| 0155 .5D | | OUT16 | |
| 0156 .5B | | OUT15 | |
| 0157 .C1 | | LAB | |
| 0158 .60 | | JTC | CN0 |
| 0159 .43 | | | |
| 015A .02 | | | |
| 015B .46 | | CAL | CCA |
| 015C .B3 | | | |
| 015D .00 | | | |
| 015E .44 | | JMP | CF0 |
| 015F .CD | | | |
| 0160 .00 | | | |
| 0161 .06 | FBC | LAI | 06 |
| 0162 .06 | | | |
| 0163 .57 | | OUT13 | |
| 0164 .57 | | OUT13 | |
| 0165 .06 | | LAI | 30 |
| 0166 .30 | | | |
| 0167 .57 | | OUT13 | |
| 0168 .44 | | JMP | TS11 |
| 0169 .11 | | | |
| 016A .01 | | | |
| 016B .36 | TX0 | LLI | F6 |
| 016C .F6 | | | |
| 016D .DF | | LDM | |
| 016E .30 | | ICL | |
| 016F .F7 | | LLM | |
| 0170 .45 | TX11 | INP2 | |
| 0171 .24 | | NDI | 21 |
| 0172 .21 | | | |
| 0173 .C3 | | LAD | |
| 0174 .23 | | RTZ | |
| 0175 .47 | | INP3 | |
| 0176 .24 | | NDI | 40 |
| 0177 .40 | | | |
| 0178 .48 | | JFZ | TX11 |
| 0179 .70 | | | |
| 017A .01 | | | |
| 017B .45 | | INP2 | |
| 017C .24 | | NDI | 20 |
| 017D .20 | | | |
| 017E .44 | | JMP | TX2 |
| 017F .C5 | | | |
| 0180 .01 | | | |
| 0181 .36 | RX0 | LLI | F6 |
| 0182 .F6 | | | |
| 0183 .DF | | LDM | |
| 0184 .30 | | ICL | |
| 0185 .F7 | | LLM | |
| 0186 .47 | RX11 | INP3 | |
| 0187 .80 | | ADA | |
| 0188 .70 | | JTS | IB0 |
| 0189 .05 | | | |
| 018A .00 | | | |
| 018B .80 | | ADA | |
| 018C .70 | | JTS | RX2 |

TABLE VII CONTINUED

```
018D  .9F
018E  .01
018F  .45         INP2
0190  .24         NDI    24
0191  .24
0192  .2C         EXI    24
0193  .24
0194  .48         JFZ    RX2
0195  .9F
0196  .01
0197  .45         INP2
0198  .24         NDI    24
0199  .24
019A  .2C         EXI    24
019B  .24
019C  .63         JTZ    IB0
019D  .05
019E  .00
019F  .45   RX2   INP2
01A0  .24         NDI    0C
01A1  .0C
01A2  .C3         LAD
01A3  .2B         RTZ
01A4  .44         JMP    IX11
01A5  .36
01A6  .01
01A7  .A8   IB1   EXA
01A8  .5F         OUT17
01A9  .36         LLI    F8
01AA  .F8
01AB  .C7         LAM
01AC  .A5         NDH
01AD  .F8         LMA
01AE  .06         LAI    06
01AF  .06
01B0  .57         OUT13
01B1  .57         OUT13
01B2  .06         LAI    FF
01B3  .FF
01B4  .5B         OUT15
01B5  .A8         EXA
01B6  .F0         LLA
01B7  .F8         LMA
01B8  .30         ICL
01B9  .F8         LMA
01BA  .30         ICL
01BB  .F8         LMA
01BC  .30         ICL
01BD  .F8         LMA
01BE  .30         ICL
01BF  .F8         LMA
01C0  .30         ICL
01C1  .F8         LMA
01C2  .44         JMP    003B
01C3  .3B
01C4  .00
01C5  .63   TX2   JTZ    TX11
01C6  .70
01C7  .01
01C8  .06   CE0   LAI    2F
```

```
01C9  .2F
01CA  .C0         LAA
01CB  .C0         LAA
01CC  .0D         RST1
01CD  .5D         OUT16
01CE  .0D         RST1
01CF  .5B         OUT15
01D0  .0D         RST1
01D1  .5B         OUT15
01D2  .0D         RST1
01D3  .C0         LAA
01D4  .45   CE2   INP2
01D5  .24         NDI    04
01D6  .04
01D7  .63         JTZ    CE3
01D8  .E3
01D9  .01
01DA  .45         INP2
01DB  .24         NDI    04
01DC  .04
01DD  .68         JTZ    CE3
01DE  .E3
01DF  .01
01E0  .44         JMP    IB0
01E1  .05
01E2  .00
01E3  .45   CE3   INP2
01E4  .24         NDI    82
01E5  .82
01E6  .80         ADA
01E7  .40         JFC    IB0
01E8  .05
01E9  .00
01EA  .68         JTZ    CE2
01EB  .D4
01EC  .01
01ED  .44         JMP    IB0
01EE  .05
01EF  .00
01F0  .FF         DC     FF
01F1  .FF         DC     FF
01F2  .FF         DC     FF
01F3  .FF         DC     FF
01F4  .FF         DC     FF
01F5  .FF         DC     FF
01F6  .FF         DC     FF
01F7  .FF         DC     FF
01F8  .FF         DC     FF
01F9  .FF         DC     FF
01FA  .FF         DC     FF
01FB  .FF         DC     FF
01FC  .FF         DC     FF
01FD  .FF         DC     FF
01FE  .FF         DC     FF
01FF  .FF         DC     FF
0200  .FF         END

0200  .FF         OGN    0200
0200  .FF   DF2   EQU    030B
```

TABLE VII CONTINUED

```
0200 .FF   I50  EQU  0005
0200 .FF   C30  EQU  03CD
0200 .FF   ETC  EQU  03E8
0200 .FF   CC0  EQU  00B7
0200 .FF   CF3  EQU  00D2
0200 .FF        DC   FF
0201 .FF        DC   FF
0202 .36   DF1  LLI  05
0203 .05
0204 .61   DF11 OUT20
0205 .4B        INP5
0206 .61        OUT20
0207 .46        CAL  DF2
0208 .0B
0209 .03
020A .44        JMP  DF11
020B .04
020C .02
020D .FF        DC   FF
020E .FF        DC   FF
020F .FF        DC   FF
0210 .C6        DC   C6
0211 .C2        DC   C2
0212 .D7        DC   D7
0213 .D5        DC   D5
0214 .4D        DC   4D
0215 .D6        DC   D6
0216 .C9        DC   C9
0217 .E2        DC   E2
0218 .C4        DC   C4
0219 .C3        DC   C3
021A .D9        DC   D9
021B .60        DC   60
021C .F9        DC   F9
021D .4B        DC   4B
021E .F6        DC   F6
021F .E3        DC   E3
0220 .27        DC   27
0221 .E8        DC   E8
0222 .E6        DC   E6
0223 .6B        DC   6B
0224 .D2        DC   D2
0225 .61        DC   61
0226 .5C        DC   5C
0227 .C8        DC   C8
0228 .E4        DC   E4
0229 .D3        DC   D3
022A .5D        DC   5D
022B .D4        DC   D4
022C .C7        DC   C7
022D .10        DC   10
022E .32        DC   32
022F .FF        DC   FF
0230 .53   DN0  OUT11
0231 .53        OUT11
0232 .0E   DN11 LBI  FF
0233 .FF
0234 .61   DN2  OUT20
0235 .4B        INP5
0236 .61        OUT20
0237 .E0        LEA
0238 .4B        INP5
0239 .02        RLC
023A .02        RLC
023B .02        RLC
023C .02        RLC
023D .A4        NDE
023E .53        OUT11
023F .09        DEB
0240 .68        JTZ  I50
0241 .05
0242 .00
0243 .3C        CPI  FF
0244 .FF
0245 .68        JTZ  DN2
0246 .34
0247 .02
0248 .44        JMP  DN11
0249 .32
024A .02
024B .5B   CN0  OUT15
024C .5D        OUT16
024D .61   CN2  OUT20
024E .49        INP4
024F .5B        OUT15
0250 .0D        RST1
0251 .5D        OUT16
0252 .44        JMP  CN2
0253 .4D
0254 .02
0255 .68   CC2  JTZ  C12
0256 .63
0257 .02
0258 .80        ADA
0259 .1A        RAR
025A .70        JTS  C12C
025B .6C
025C .02
025D .44        JMP  C30
025E .CD
025F .03
0260 .FF        DC   FF
0261 .FF        DC   FF
0262 .FF        DC   FF
0263 .5D   C12  OUT16
0264 .0D        RST1
0265 .C1        LAB
0266 .5D        OUT16
0267 .0D        RST1
0268 .5B        OUT15
0269 .44        JMP  ETC
026A .E3
026B .03
026C .24   C12C NDI  0F
026D .0F
026E .5D        OUT16
026F .34        CRI  F0
0270 .F0
0271 .0D        RST1
0272 .5D        OUT16
```

TABLE VII CONTINUED

```
0273  .0D          RST1
0274  .53          OUT15
0275  .3C          CPI    F8
0276  .F8
0277  .40          JFC    C12D
0278  .8B
0279  .02
027A  .3C          CPI    F6
027B  .F6
027C  .68          JTZ    C12E
027D  .8B
027E  .02
027F  .60          JTC    C12F
0280  .85
0281  .02
0282  .36          LLI    0B
0283  .0B
0284  .07          RET
0285  .36   C12F   LLI    08
0286  .08
0287  .07          RET
0288  .36   C12E   LLI    06
0289  .06
028A  .07          RET
028B  .E6   C12D   LEL
028C  .36          LLI    F8
028D  .F8
028E  .C7          LAM
028F  .34          ORI    01
0290  .01
0291  .F8          LMA
0292  .F4          LLE
0293  .07          RET
0294  .FF          DC     FF
0295  .FF          DC     FF
0296  .FF          DC     FF
0297  .30   CSA    ICL
0298  .BF   CS0    CPM
0299  .48          JFZ    CS5
029A  .D9
029B  .02
029C  .CE   CS2    LBL
029D  .25          RST4
029E  .25          RST4
029F  .25          RST4
02A0  .25          RST4
02A1  .25          RST4
02A2  .25          RST4
02A3  .25          RST4
02A4  .25          RST4
02A5  .25          RST4
02A6  .25          RST4
02A7  .25          RST4
02A8  .D0   CS3    LCA
02A9  .06          LAI    E5
02AA  .E5
02AB  .5D   CS31   OUT16
02AC  .0D          RST1
02AD  .5B          OUT15
02AE  .61          OUT20
02AF  .49          INP4
02B0  .44          JMP    CSA
02B1  .97
02B2  .02
02B3  .31   CS4    DEL
02B4  .E0          LEA
02B5  .C1          LAB
02B6  .CC          LBE
02B7  .96          SUL
02B8  .48          JFZ    CS4
02B9  .CC
02BA  .02
02BB  .C7   CS40   LAM
02BC  .E6          LEL
02BD  .36          LLI    FE
02BE  .FE
02BF  .F9          LMB
02C0  .F4          LLE
02C1  .46          CAL    CC0
02C2  .B7
02C3  .00
02C4  .E6          LEL
02C5  .36          LLI    FE
02C6  .FE
02C7  .C7          LAM
02C8  .F4          LLE
02C9  .44          JMP    CS0
02CA  .98
02CB  .02
02CC  .24   CS41   NDI    EF
02CD  .EF
02CE  .5D          OUT16
02CF  .0D          RST1
02D0  .53          OUT15
02D1  .C1          LAB
02D2  .D7          LCH
02D3  .30          ICL
02D4  .44          JMP    CS0
02D5  .98
02D6  .02
02D7  .FF          DC     FF
02D8  .FF          DC     FF
02D9  .DA   CS5    CPC
02DA  .48          JFZ    CF3
02DB  .D2
02DC  .00
02DD  .CE   CS6    LBL
02DE  .F8          LMA
02DF  .15          RST2
02E0  .F8          LMA
02E1  .15          RST2
02E2  .F8          LMA
02E3  .15          RST2
02E4  .F8          LMA
02E5  .15          RST2
02E6  .F8          LMA
02E7  .15          RST2
02E8  .F8          LMA
02E9  .06   CS7    LAI    E0
02EA  .E0
```

TABLE VII CONTINUED

| | | | | |
|---|---|---|---|---|
| 02EB | .44 | | JMP | CS31 |
| 02EC | .AB | | | |
| 02ED | .02 | | | |
| 02EE | .FF | | DC | FF |
| 02EF | .FF | | DC | FF |
| 02F0 | .FF | | DC | FF |
| 02F1 | .FF | | DC | FF |
| 02F2 | .FF | | DC | FF |
| 02F3 | .F8 | | DC | F8 |
| 02F4 | .C1 | | DC | C1 |
| 02F5 | .C5 | | DC | C5 |
| 02F6 | .F7 | | DC | F7 |
| 02F7 | .F3 | | DC | F3 |
| 02F8 | .F4 | | DC | F4 |
| 02F9 | .F5 | | DC | F5 |
| 02FA | .40 | | DC | 40 |
| 02FB | .F1 | | DC | F1 |
| 02FC | .F2 | | DC | F2 |
| 02FD | .F0 | | DC | F0 |
| 02FE | .31 | CS8 | DEL | |
| 02FF | .E0 | | LEA | |
| 0300 | .E0 | | END | |
| | | | | |
| 0300 | .E0 | | OGN | 0300 |
| 0300 | .E0 | CS40 | EQU | 02BB |
| 0300 | .E0 | CS41 | EQU | 02CC |
| 0300 | .E0 | IB0 | EQU | 0005 |
| 0300 | .E0 | C42 | EQU | 00BE |
| 0300 | .E0 | DF11 | EQU | 0204 |
| 0300 | .E0 | D42 | EQU | 0345 |
| 0300 | .E0 | CH0 | EQU | 00F0 |
| 0300 | .E0 | DF6 | EQU | 00E0 |
| 0300 | .C1 | | LAB | |
| 0301 | .CC | | LBE | |
| 0302 | .96 | | SUL | |
| 0303 | .68 | | JTZ | CS40 |
| 0304 | .BB | | | |
| 0305 | .02 | | | |
| 0306 | .14 | | SUI | 0B |
| 0307 | .0B | | | |
| 0308 | .44 | | JMP | CS41 |
| 0309 | .CC | | | |
| 030A | .02 | | | |
| 030B | .3C | DF2 | CPI | F3 |
| 030C | .F3 | | | |
| 030D | .60 | | JTC | DF21 |
| 030E | .2E | | | |
| 030F | .03 | | | |
| 0310 | .3C | | CPI | FE |
| 0311 | .FE | | | |
| 0312 | .60 | | JTC | D40 |
| 0313 | .3C | | | |
| 0314 | .03 | | | |
| 0315 | .68 | | JTZ | D80 |
| 0316 | .85 | | | |
| 0317 | .03 | | | |
| 0318 | .0E | MK0 | LBI | FF |
| 0319 | .FF | | | |
| 031A | .09 | MK2 | DEB | |
| 031B | .68 | | JTZ | IB0 |
| 031C | .05 | | | |
| 031D | .00 | | | |
| 031E | .47 | | INP3 | |
| 031F | .80 | | ADA | |
| 0320 | .70 | | JTS | IB0 |
| 0321 | .05 | | | |
| 0322 | .00 | | | |
| 0323 | .4B | | INP5 | |
| 0324 | .61 | | ØUT20 | |
| 0325 | .3C | | CPI | FF |
| 0326 | .FF | | | |
| 0327 | .68 | | JTZ | MK2 |
| 0328 | .1A | | | |
| 0329 | .03 | | | |
| 032A | .44 | | JMP | DF2 |
| 032B | .0B | | | |
| 032C | .03 | | | |
| 032D | .FF | | DC | FF |
| 032E | .3C | DF21 | CPI | F1 |
| 032F | .F1 | | | |
| 0330 | .68 | | JTZ | D8A |
| 0331 | .39 | | | |
| 0332 | .03 | | | |
| 0333 | .40 | | JFC | D8B |
| 0334 | .B9 | | | |
| 0335 | .03 | | | |
| 0336 | .44 | | JMP | D12 |
| 0337 | .4C | | | |
| 0338 | .03 | | | |
| 0339 | .4B | D8A | INP5 | |
| 033A | .24 | | NDI | 1F |
| 033B | .1F | | | |
| 033C | .E6 | D40 | LEL | |
| 033D | .F0 | | LLA | |
| 033E | .2E | | LHI | 02 |
| 033F | .02 | | | |
| 0340 | .C7 | | LAM | |
| 0341 | .53 | | ØUT11 | |
| 0342 | .F4 | | LLE | |
| 0343 | .2E | | LHI | 07 |
| 0344 | .07 | | | |
| 0345 | .D0 | D42 | LCA | |
| 0346 | .F8 | | LMA | |
| 0347 | .31 | | DEL | |
| 0348 | .0B | | RFZ | |
| 0349 | .36 | | LLI | F5 |
| 034A | .F5 | | | |
| 034B | .07 | | RET | |
| 034C | .4B | D12 | INP5 | |
| 034D | .02 | | RLC | |
| 034E | .02 | | RLC | |
| 034F | .02 | | RLC | |
| 0350 | .02 | | RLC | |
| 0351 | .C3 | | LBA | |
| 0352 | .61 | | ØUT20 | |
| 0353 | .4B | | INP5 | |
| 0354 | .A1 | | NDB | |
| 0355 | .C8 | | LBA | |
| 0356 | .3C | | CPI | F0 |
| 0357 | .F0 | | | |
| 0358 | .60 | | JTC | D12A |

TABLE VII CONTINUED

```
0359 .60
035A .03
035B .3C           CPI    FA
035C .FA
035D .60           JTC    D12B
035E .D2
035F .03
0360 .53   D12A    OUT11
0361 .44           JMP    D42
0362 .45
0363 .03
0364 .FA           DC     FA
0365 .03           DC     03
0366 .3C   D12C    CPI    F3
0367 .F3
0368 .40           JFC    D12D
0369 .7C
036A .03
036B .3C           CPI    F6
036C .F6
036D .68           JTZ    D12E
036E .79
036F .03
0370 .60           JTC    D12F
0371 .76
0372 .03
0373 .36           LLI    F0
0374 .F0
0375 .07           RET
0376 .36   D12F    LLI    F3
0377 .F3
0378 .07           RET
0379 .36   D12E    LLI    F5
037A .F5
037B .07           RET
037C .E6   D12D    LEL
037D .36           LLI    F8
037E .F8
037F .C7           LAM
0380 .34           ØRI    01
0381 .01
0382 .F8           LMA
0383 .F4           LLE
0384 .07           RET
0385 .4B   DS0     INP5
0386 .3C           CPI    F5
0387 .F5
0388 .60           JTC    DS3
0389 .A9
038A .03
038B .C3           LBA
038C .09           DEB
038D .C7   DS2     LAM
038E .35           RST6
038F .C7           LAM
0390 .35           RST6
0391 .C7           LAM
0392 .35           RST6
0393 .C7           LAM
0394 .35           RST6
```

TABLE VII CONTINUED

```
0395 .C7           LAM
0396 .35           RST6
0397 .C7           LAM
0398 .35           RST6
0399 .C7           LAM
039A .35           RST6
039B .C7           LAM
039C .35           RST6
039D .C7           LAM
039E .35           RST6
039F .C7           LAM
03A0 .35           RST6
03A1 .C7           LAM
03A2 .35           RST6
03A3 .C7           LAM
03A4 .35           RST6
03A5 .30   DS5     ICL
03A6 .44           JMP    DS5A
03A7 .D6
03A8 .03
03A9 .04   DS3     ADI    0A
03AA .0A
03AB .C3           LBA
03AC .C2           LAC
03AD .FA           LMC
03AE .35           RST6
03AF .FA           LMC
03B0 .35           RST6
03B1 .FA           LMC
03B2 .35           RST6
03B3 .FA           LMC
03B4 .35           RST6
03B5 .FA           LMC
03B6 .35           RST6
03B7 .FA           LMC
03B8 .35           RST6
03B9 .4B   D8B     INP5
03BA .24           NDI    2F
03BB .2F
03BC .E6           LEL
03BD .F0           LLA
03BE .2E           LHI    02
03BF .02
03C0 .3C           CPI    2D
03C1 .2D
03C2 .C7           LAM
03C3 .53           ØUT11
03C4 .F4           LLE
03C5 .2E           LHI    07
03C6 .07
03C7 .60           JTC    D42
03C8 .45
03C9 .03
03CA .44           JMP    DF6
03CB .E0
03CC .00
03CD .5D   C30     ØUT16
03CE .0D           RST1
03CF .53           ØUT15
03D0 .3C           CPI    2D
```

TABLE VII CONTINUED

```
03D1  .2D
03D2  .44         JMP  CH0
03D3  .F0
03D4  .00
03D5  .07         DC   07
03D6  .D7   D55A  LCM
03D7  .31         DEL
03D8  .44         JMP  DF11
03D9  .04
03DA  .02
03DB  .E6   D12B  LEL
03DC  .F0         LLA
03DD  .2E         LHI  03
03DE  .03
03DF  .C7         LAM
03E0  .2E         LHI  07
03E1  .07
03E2  .F4         LLE
03E3  .53         OUT11
03E4  .C1         LAB
03E5  .44         JMP  D12C
03E6  .66
03E7  .03
03E8  .44   ETC   JMP  C42
03E9  .BE
03EA  .00
03EB  .FF         DC   FF
03EC  .FF         DC   FF
03ED  .FF         DC   FF
03EE  .FF         DC   FF
03EF  .FF         DC   FF
03F0  .02         DC   02
03F1  .1E         DC   1E
03F2  .15         DC   15
03F3  .25         DC   25
03F4  .0B         DC   0B
03F5  .0C         DC   0C
03F6  .1F         DC   1F
03F7  .00         DC   00
03F8  .2D         DC   2D
03F9  .3D         DC   3D
03FA  .FF         DC   FF
03FB  .FF         DC   FF
03FC  .FF         DC   FF
03FD  .FF         DC   FF
03FE  .FF         DC   FF
03FF  .FF         DC   FF
0400  .FF         END

0000  .07         BGN  0000
0000  .47         DC   47
0001  .00         DC   00
0002  .40         DC   40
0003  .00         DC   00
0004  .00         DC   00
0005  .00         DC   00
0006  .00         DC   00
0007  .00         DC   00
0008  .00         DC   00
0009  .00         DC   00
000A  .00         DC   00
```

TABLE VII CONTINUED

```
000B  .44         DC   44
000C  .45         DC   45
000D  .00         DC   00
000E  .00         DC   00
000F  .00         DC   00
0010  .2D         DC   2D
0011  .00         DC   00
0012  .00         DC   00
0013  .00         DC   00
0014  .00         DC   00
0015  .42         DC   42
0016  .00         DC   00
0017  .00         DC   00
0018  .00         DC   00
0019  .00         DC   00
001A  .00         DC   00
001B  .00         DC   00
001C  .00         DC   00
001D  .00         DC   00
001E  .41         DC   41
001F  .46         DC   46
0020  .00         DC   00
0021  .00         DC   00
0022  .00         DC   00
0023  .00         DC   00
0024  .00         DC   00
0025  .43         DC   43
0026  .00         DC   00
0027  .20         DC   20
0028  .00         DC   00
0029  .00         DC   00
002A  .00         DC   00
002B  .00         DC   00
002C  .00         DC   00
002D  .48         DC   48
002E  .00         DC   00
002F  .00         DC   00
0030  .00         DC   00
0031  .00         DC   00
0032  .2E         DC   2E
0033  .00         DC   00
0034  .00         DC   00
0035  .00         DC   00
0036  .00         DC   00
0037  .00         DC   00
0038  .00         DC   00
0039  .00         DC   00
003A  .00         DC   00
003B  .00         DC   00
003C  .00         DC   00
003D  .49         DC   49
003E  .00         DC   00
003F  .00         DC   00
0040  .3A         DC   3A
0041  .00         DC   00
0042  .00         DC   00
0043  .00         DC   00
0044  .00         DC   00
0045  .00         DC   00
0046  .00         DC   00
0047  .00         DC   00
```

TABLE VII CONTINUED

| | | |
|---|---|---|
| 0048 .00 | DC | 00 |
| 0049 .00 | DC | 00 |
| 004A .00 | DC | 00 |
| 004B .1D | DC | 1D |
| 004C .00 | DC | 00 |
| 004D .14 | DC | 14 |
| 004E .00 | DC | 00 |
| 004F .00 | DC | 00 |
| 0050 .00 | DC | 00 |
| 0051 .00 | DC | 00 |
| 0052 .00 | DC | 00 |
| 0053 .00 | DC | 00 |
| 0054 .00 | DC | 00 |
| 0055 .00 | DC | 00 |
| 0056 .00 | DC | 00 |
| 0057 .00 | DC | 00 |
| 0058 .00 | DC | 00 |
| 0059 .00 | DC | 00 |
| 005A .00 | DC | 00 |
| 005B .00 | DC | 00 |
| 005C .26 | DC | 26 |
| 005D .2A | DC | 2A |
| 005E .00 | DC | 00 |
| 005F .00 | DC | 00 |
| 0060 .1B | DC | 1B |
| 0061 .25 | DC | 25 |
| 0062 .00 | DC | 00 |
| 0063 .00 | DC | 00 |
| 0064 .00 | DC | 00 |
| 0065 .00 | DC | 00 |
| 0066 .00 | DC | 00 |
| 0067 .00 | DC | 00 |
| 0068 .00 | DC | 00 |
| 0069 .00 | DC | 00 |
| 006A .00 | DC | 00 |
| 006B .23 | DC | 23 |
| 006C .00 | DC | 00 |
| 006D .00 | DC | 00 |
| 006E .00 | DC | 00 |
| 006F .00 | DC | 00 |
| 0070 .00 | DC | 00 |
| 0071 .00 | DC | 00 |
| 0072 .00 | DC | 00 |
| 0073 .00 | DC | 00 |
| 0074 .00 | DC | 00 |
| 0075 .00 | DC | 00 |
| 0076 .00 | DC | 00 |
| 0077 .00 | DC | 00 |
| 0078 .00 | DC | 00 |
| 0079 .00 | DC | 00 |
| 007A .00 | DC | 00 |
| 007B .00 | DC | 00 |
| 007C .00 | DC | 00 |
| 007D .00 | DC | 00 |
| 007E .00 | DC | 00 |
| 007F .00 | DC | 00 |
| 0080 .00 | DC | 00 |
| 0081 .00 | DC | 00 |
| 0082 .00 | DC | 00 |
| 0083 .00 | DC | 00 |
| 0084 .00 | DC | 00 |
| 0085 .00 | DC | 00 |
| 0086 .00 | DC | 00 |
| 0087 .00 | DC | 00 |
| 0088 .00 | DC | 00 |
| 0089 .00 | DC | 00 |
| 008A .00 | DC | 00 |
| 008B .00 | DC | 00 |
| 008C .00 | DC | 00 |
| 008D .00 | DC | 00 |
| 008E .00 | DC | 00 |
| 008F .00 | DC | 00 |
| 0090 .00 | DC | 00 |
| 0091 .00 | DC | 00 |
| 0092 .00 | DC | 00 |
| 0093 .00 | DC | 00 |
| 0094 .00 | DC | 00 |
| 0095 .00 | DC | 00 |
| 0096 .00 | DC | 00 |
| 0097 .00 | DC | 00 |
| 0098 .00 | DC | 00 |
| 0099 .00 | DC | 00 |
| 009A .00 | DC | 00 |
| 009B .00 | DC | 00 |
| 009C .00 | DC | 00 |
| 009D .00 | DC | 00 |
| 009E .00 | DC | 00 |
| 009F .00 | DC | 00 |
| 00A0 .00 | DC | 00 |
| 00A1 .00 | DC | 00 |
| 00A2 .00 | DC | 00 |
| 00A3 .00 | DC | 00 |
| 00A4 .00 | DC | 00 |
| 00A5 .00 | DC | 00 |
| 00A6 .00 | DC | 00 |
| 00A7 .00 | DC | 00 |
| 00A8 .00 | DC | 00 |
| 00A9 .00 | DC | 00 |
| 00AA .00 | DC | 00 |
| 00AB .00 | DC | 00 |
| 00AC .00 | DC | 00 |
| 00AD .00 | DC | 00 |
| 00AE .00 | DC | 00 |
| 00AF .00 | DC | 00 |
| 00B0 .00 | DC | 00 |
| 00B1 .00 | DC | 00 |
| 00B2 .00 | DC | 00 |
| 00B3 .00 | DC | 00 |
| 00B4 .00 | DC | 00 |
| 00B5 .00 | DC | 00 |
| 00B6 .00 | DC | 00 |
| 00B7 .00 | DC | 00 |
| 00B8 .00 | DC | 00 |
| 00B9 .00 | DC | 00 |
| 00BA .00 | DC | 00 |
| 00BB .00 | DC | 00 |
| 00BC .00 | DC | 00 |
| 00BD .00 | DC | 00 |
| 00BE .00 | DC | 00 |
| 00BF .00 | DC | 00 |
| 00C0 .00 | DC | 00 |
| 00C1 .84 | DC | 84 |
| 00C2 .11 | DC | 11 |
| 00C3 .19 | DC | 19 |

TABLE VII CONTINUED

| | | | |
|---|---|---|---|
| 00C4 | .18 | DC | 18 |
| 00C5 | .85 | DC | 85 |
| 00C6 | .10 | DC | 10 |
| 00C7 | .2C | DC | 2C |
| 00C8 | .27 | DC | 27 |
| 00C9 | .16 | DC | 16 |
| 00CA | .00 | DC | 00 |
| 00CB | .00 | DC | 00 |
| 00CC | .00 | DC | 00 |
| 00CD | .00 | DC | 00 |
| 00CE | .00 | DC | 00 |
| 00CF | .00 | DC | 00 |
| 00D0 | .00 | DC | 00 |
| 00D1 | .00 | DC | 00 |
| 00D2 | .24 | DC | 24 |
| 00D3 | .29 | DC | 29 |
| 00D4 | .2B | DC | 2B |
| 00D5 | .13 | DC | 13 |
| 00D6 | .15 | DC | 15 |
| 00D7 | .12 | DC | 12 |
| 00D8 | .00 | DC | 00 |
| 00D9 | .1A | DC | 1A |
| 00DA | .00 | DC | 00 |
| 00DB | .00 | DC | 00 |
| 00DC | .00 | DC | 00 |
| 00DD | .00 | DC | 00 |
| 00DE | .00 | DC | 00 |
| 00DF | .00 | DC | 00 |
| 00E0 | .00 | DC | 00 |
| 00E1 | .00 | DC | 00 |
| 00E2 | .17 | DC | 17 |
| 00E3 | .1F | DC | 1F |
| 00E4 | .23 | DC | 23 |
| 00E5 | .00 | DC | 00 |
| 00E6 | .22 | DC | 22 |
| 00E7 | .00 | DC | 00 |
| 00E8 | .21 | DC | 21 |
| 00E9 | .00 | DC | 00 |
| 00EA | .00 | DC | 00 |
| 00EB | .00 | DC | 00 |
| 00EC | .00 | DC | 00 |
| 00ED | .00 | DC | 00 |
| 00EE | .00 | DC | 00 |
| 00EF | .00 | DC | 00 |
| 00F0 | .8D | DC | 8D |
| 00F1 | .8B | DC | 8B |
| 00F2 | .8C | DC | 8C |
| 00F3 | .87 | DC | 87 |
| 00F4 | .88 | DC | 88 |
| 00F5 | .89 | DC | 89 |
| 00F6 | .1E | DC | 1E |
| 00F7 | .86 | DC | 86 |
| 00F8 | .83 | DC | 83 |
| 00F9 | .1C | DC | 1C |
| 00FA | .00 | DC | 00 |
| 00FB | .00 | DC | 00 |
| 00FC | .00 | DC | 00 |
| 00FD | .00 | DC | 00 |
| 00FE | .00 | DC | 00 |
| 00FF | .2F | DC | 2F |
| 0100 | .2F | END | |

Preferred values of the electrical components for the preferred, practical, four bit data slice embodiment of FIGS. 15-26 may now be set out. It will be realized by those skilled in the art that no limitation to these values is intended, and the values are given as a guide and aid to persons lawfully using and utilizing the present invention.

The electrical components are set out in the attached Tale VIII, where each particular part number of FIGS. 15-26 is separately set out, the part is identified, the manufacturer is given, and the manufacturer's number or the value of the part is given, where any manufacturer's part will do.

It will be realized by those skilled in the art that individual components, such as AND gates, OR gates, inverters, and like logical components are incorporated in multiple units and are not individually purchased. Therefore, where a composite component is indicated in Table VIII, it will be immediately recognized by those skilled in the art that the particular part numbered may be included within the manufacturer's part indicated, with the particulr portion of that part being indicated on the drawings of FIGS. 15-26 by the identification of inputs.

It will be lastly recognized that no designation of power supply or filter capacitors has been provided, as these components are dictated by particular logic requirements, are well set out in manufacturer's specifications, and are well within the skill of the art.

TABLE VIII

| PART NR | PART | MANUFACTURER | MFR #/VALUE |
|---|---|---|---|
| 1501 | AND GATE | SIGNETICS | N7408 |
| 1502 | SEE 1501 | | |
| 1504 | SEE 1501 | | |
| 1506 | QUADRUPLE LATCH | SIGNETICS | N7475 |
| 1507 | SEE 1506 | | |
| 1508 | QUADRUPLE LATCH | SIGNETICS | N74175 |
| 1509 | SEE 1508 | | |
| 1510 | SEE 1501 | | |

TABLE VIII CONTINUED

| PART NR | PART | MANUFACTURER | MFR #/VALUE |
|---|---|---|---|
| 1511 | NAND GATE | SIGNETICS | N7400 |
| 1514 | 3-8 LINE DECODER | SIGNETICS | N74155 |
| 1516 | SEE 1511 | | |
| 1517 | SEE 1511 | | |
| 1520 | SEE 1511 | | |
| 1522 | RESISTOR | ALLEN BRADLEY | 1000 OHM, 1/4 WATT |
| 1523 | SEE 1522 | | |
| 1524 | SEE 1522 | | |
| 1525 | SEE 1522 | | |
| 1526 | SEE 1522 | | |
| 1527 | SEE 1522 | | |
| 1528 | SEE 1522 | | |
| 1529 | SEE 1522 | | |
| 1530 | SEE 1522 | | |
| 1531 | SEE 1522 | | |
| 1532 | SEE 1522 | | |
| 1533 | SEE 1522 | | |
| 1534 | SEE 1522 | | |
| 1535 | SEE 1522 | | |
| 1536 | SEE 1522 | | |
| 1537 | VOLTAGE TERMINAL | | PLUS 5 VOLTS |
| 1538 | SEE 1537 | | |
| 1539 | SEE 1537 | | |
| 1540 | SEE 1537 | | |
| 1601 | READ ONLY MEMORY | INTEL | 1702 |
| 1602 | SEE 1601 | | |
| 1603 | SEE 1601 | | |
| 1604 | SEE 1601 | | |
| 1605 | SEE 1601 | | |
| 1606 | SEE 1601 | | |
| 1607 | RANDOM ACCESS MEMORY | SIGNETICS | 2501 |
| 1608 | SEE 1607 | | |
| 1609 | SEE 1607 | | |
| 1610 | SEE 1607 | | |
| 1611 | SEE 1607 | | |
| 1612 | SEE 1607 | | |
| 1613 | SEE 1607 | | |
| 1614 | SEE 1607 | | |
| 1615 | SEE 1511 | | |
| 1616 | SEE 1511 | | |
| 1617 | SEE 1511 | | |
| 1618 | SEE 1511 | | |
| 1619 | SEE 1511 | | |
| 1620 | SEE 1511 | | |
| 1621 | SEE 1511 | | |
| 1622 | SEE 1511 | | |
| 1623 | NAND BUFFER | SIGNETICS | N7438 |
| 1624 | SEE 1623 | | |
| 1625 | SEE 1623 | | |
| 1626 | SEE 1623 | | |
| 1627 | SEE 1623 | | |
| 1628 | SEE 1623 | | |
| 1629 | SEE 1623 | | |
| 1630 | SEE 1623 | | |
| 1635 | SEE 1537 | | |

TABLE VIII CONTINUED

| PART NR | PART | MANUFACTURER | MFR #/VALUE |
|---|---|---|---|
| 1636 | SEE 1537 | | |
| 1637 | SEE 1537 | | |
| 1638 | SEE 1537 | | |
| 1639 | SEE 1537 | | |
| 1640 | SEE 1537 | | |
| 1641 | SEE 1537 | | |
| 1642 | SEE 1537 | | |
| 1643 | SEE 1537 | | |
| 1661 | SEE 1537 | | |
| 1662 | SEE 1522 | | |
| 1663 | SEE 1522 | | |
| 1664 | SEE 1537 | | |
| 1702 | NOR GATE | SIGNETICS | SP381A |
| 1704 | NOR GATE | SIGNETICS | 8875 |
| 1706 | NOR GATE | SIGNETICS | N7402 |
| 1708 | SEE 1702 | | |
| 1710 | SEE 1511 | | |
| 1712 | SEE 1704 | | |
| 1714 | SEE 1511 | | |
| 1716 | SEE 1511 | | |
| 1718 | SEE 1706 | | |
| 1720 | SEE 1702 | | |
| 1722 | SEE 1702 | | |
| 1724 | SEE 1706 | | |
| 1726 | SEE 1704 | | |
| 1728 | 3-8 LINE DECODER | SIGNETICS | 82S50 |
| 1730 | MICROPROCESSOR | INTEL | 8008 |
| 1732 | SEE 1501 | | |
| 1734 | SEE 1511 | | |
| 1736 | SEE 1706 | | |
| 1738 | QUADRUPLE LATCH | SIGNETICS | 8T10 |
| 1739 | SEE 1738 | | |
| 1740 | SEE 1738 | | |
| 1741 | SEE 1738 | | |
| 1742 | BUS DRIVER | SIGNETICS | 8T26 |
| 1743 | SEE 1742 | | |
| 1744 | SEE 1742 | | |
| 1745 | SEE 1742 | | |
| 1749 | GROUND TERMINAL OR SIGNAL GROUND | | |
| 1750 | SEE 1749 | | |
| 1751 | SEE 1537 | | |
| 1752 | SEE 1537 | | |
| 1753 | SEE 1537 | | |
| 1754 | SEE 1537 | | |
| 1755 | SEE 1537 | | |
| 1756 | SEE 1537 | | |
| 1757 | SEE 1537 | | |
| 1758 | SEE 1522 | | |
| 1759 | RESISTOR | ALLEN BRADLEY | 12 KOHM, 1/4 WATT |
| 1760 | SEE 1759 | | |
| 1761 | SEE 1759 | | |
| 1762 | SEE 1759 | | |
| 1763 | SEE 1759 | | |
| 1764 | SEE 1759 | | |
| 1765 | SEE 1759 | | |

TABLE VIII CONTINUED

| PART NR | PART | MANUFACTURER | MFR #/VALUE |
|---|---|---|---|
| 1766 | SEE 1759 | | |
| 1767 | SEE 1522 | | |
| 1768 | SEE 1522 | | |
| 1769 | SEE 1522 | | |
| 1770 | SEE 1522 | | |
| 1771 | SEE 1522 | | |
| 1772 | SEE 1522 | | |
| 1773 | SEE 1522 | | |
| 1802 | CRYSTAL | INTERNATIONAL CRYSTAL | 8.57 MHz |
| 1804 | INVERTER | SIGNETICS | N74S04 |
| 1806 | SEE 1804 | | |
| 1808 | SEE 1511 | | |
| 1810 | SEE 1501 | | |
| 1812 | SEE 1511 | | |
| 1814 | SEE 1702 | | |
| 1816 | JK FLIP FLOP | SIGNETICS | N7476 |
| 1817 | SEE 1816 | | |
| 1818 | SEE 1816 | | |
| 1819 | SEE 1816 | | |
| 1820 | NAND GATE | SIGNETICS | N7410 |
| 1822 | SEE 1501 | | |
| 1824 | SEE 1706 | | |
| 1826 | SEE 1702 | | |
| 1828 | INVERTER | SIGNETICS | N7404 |
| 1830 | SEE 1511 | | |
| 1832 | SEE 1511 | | |
| 1834 | AND GATE | SIGNETICS | N7411 |
| 1836 | SEE 1511 | | |
| 1838 | SEE 1511 | | |
| 1840 | SEE 1511 | | |
| 1842 | SEE 1706 | | |
| 1844 | SEE 1706 | | |
| 1846 | SEE 1804 | | |
| 1848 | SEE 1804 | | |
| 1850 | SEE 1501 | | |
| 1852 | SEE 1501 | | |
| 1854 | SEE 1834 | | |
| 1856 | SEE 1834 | | |
| 1858 | SEE 1501 | | |
| 1860 | SEE 1702 | | |
| 1862 | SEE 1804 | | |
| 1864 | SEE 1804 | | |
| 1866 | SEE 1828 | | |
| 1868 | SEE 1511 | | |
| 1870 | SEE 1537 | | |
| 1871 | SEE 1537 | | |
| 1872 | SEE 1537 | | |
| 1873 | SEE 1537 | | |
| 1874 | SEE 1537 | | |
| 1875 | SEE 1537 | | |
| 1876 | SEE 1537 | | |
| 1877 | SEE 1537 | | |
| 1878 | SEE 1522 | | |
| 1879 | RESISTOR | ALLEN BRADLEY | 10 KOHM, 1/4 WATT |

TABLE VIII CONTINUED

| PART NR | PART | MANUFACTURER | MFR #/VALUE |
|---|---|---|---|
| 1880 | RESISTOR | ALLEN BRADLEY | 47 KOHM, 1/4 WATT |
| 1881 | SEE 1522 | | |
| 1882 | SEE 1522 | | |
| 1883 | SEE 1522 | | |
| 1884 | RESISTOR | ALLEN BRADLEY | 2.2 KOHM, 1/4 WATT |
| 1885 | RESISTOR | ALLEN BRADLEY | 5.6 KOHM, 1/4 WATT |
| 1886 | SEE 1522 | | |
| 1887 | SEE 1522 | | |
| 1888 | SEE 1522 | | |
| 1889 | SEE 1522 | | |
| 1890 | CAPACITOR | KEMET | 22 MFD, 20 VOLT |
| 1891 | SEE 1890 | | |
| 1892 | CAPACITOR | CORNELL DUBILIER | 51 PF MICA |
| 1894 | SEE 1749 | | |
| 1895 | SEE 1749 | | |
| 1896 | SEE 1749 | | |
| 1897 | SEE 1828 | | |
| 1901 | SEE 1828 | | |
| 1902 | SEE 1511 | | |
| 1903 | SEE 1511 | | |
| 1904 | SEE 1820 | | |
| 1906 | SEE 1511 | | |
| 1907 | SEE 1706 | | |
| 1908 | SEE 1506 | | |
| 1909 | SEE 1506 | | |
| 1910 | SEE 1828 | | |
| 1912 | NAND GATE | SIGNETICS | N7420 |
| 1914 | SEE 1511 | | |
| 1915 | SEE 1820 | | |
| 1916 | SEE 1828 | | |
| 1917 | SEE 1706 | | |
| 1918 | SEE 1706 | | |
| 1919 | SEE 1706 | | |
| 1920 | SEE 1501 | | |
| 1921 | SEE 1511 | | |
| 1924 | SEE 1501 | | |
| 1926 | SEE 1508 | | |
| 1928 | SEE 1912 | | |
| 1930 | SEE 1506 | | |
| 1932 | SEE 1511 | | |
| 1934 | SEE 1514 | | |
| 1936 | SEE 1537 | | |
| 1937 | SEE 1537 | | |
| 1938 | SEE 1537 | | |
| 1939 | SEE 1537 | | |
| 1940 | SEE 1522 | | |
| 1941 | SEE 1522 | | |
| 1942 | SEE 1522 | | |
| 1943 | SEE 1522 | | |
| 1944 | SEE 1522 | | |
| 1945 | SEE 1522 | | |
| 1946 | SEE 1522 | | |
| 2002 | EXCLUSIVE NOR | SIGNETICS | 8242 |
| 2003 | SEE 1816 | | |
| 2004 | COUNTER | SIGNETICS | N7493 |

TABLE VIII CONTINUED

| PART NR | PART | MANUFACTURER | MFR #/VALUE |
|---|---|---|---|
| 2005 | SEE 2004 | | |
| 2006 | SEE 1828 | | |
| 2008 | SEE 1828 | | |
| 2010 | SEE 1508 | | |
| 2012 | SEE 1828 | | |
| 2014 | SEE 1514 | | |
| 2016 | SEE 1828 | | |
| 2018 | SEE 1828 | | |
| 2019 | SEE 1511 | | |
| 2020 | SEE 1706 | | |
| 2022 | EIA DRIVER | FAIRCHILD | 9616 |
| 2023 | SEE 2022 | | |
| 2024 | SEE 2022 | | |
| 2026 | SEE 1706 | | |
| 2028 | SEE 1828 | | |
| 2030 | JUNCTION POINT | | |
| 2031 | SEE 2030 | | |
| 2032 | SEE 2030 | | |
| 2033 | SEE 2030 | | |
| 2034 | SEE 2030 | | |
| 2035 | SEE 2030 | | |
| 2036 | SEE 2030 | | |
| 2037 | SEE 2030 | | |
| 2038 | SEE 2030 | | |
| 2039 | SEE 2030 | | |
| 2040 | SEE 1749 | | |
| 2044 | SEE 1537 | | |
| 2045 | SEE 1522 | | |
| 2050 | TERMINAL | | -12 VOLTS DC |
| 2051 | TERMINAL | | +12 VOLTS DC |
| 2101 | SEE 1828 | | |
| 2102 | SEE 1511 | | |
| 2103 | SEE 1511 | | |
| 2104 | SEE 1834 | | |
| 2106 | SEE 1511 | | |
| 2107 | SEE 1828 | | |
| 2108 | SEE 1834 | | |
| 2110 | SEE 1816 | | |
| 2112 | SEE 1511 | | |
| 2114 | SEE 1828 | | |
| 2116 | EIA RECEIVER | FAIRCHILD | 9617 |
| 2117 | SEE 2116 | | |
| 2118 | SEE 1816 | | |
| 2119 | SEE 1623 | | |
| 2120 | SEE 1706 | | |
| 2122 | SEE 1828 | | |
| 2124 | SEE 1706 | | |
| 2125 | SEE 1623 | | |
| 2126 | SEE 1623 | | |
| 2127 | SEE 1623 | | |
| 2128 | SEE 1623 | | |
| 2129 | SEE 1623 | | |
| 2130 | SEE 1623 | | |
| 2131 | SEE 1623 | | |

TABLE VIII CONTINUED

| PART NR | PART | MANUFACTURER | MFR #/VALUE |
|---|---|---|---|
| 2132 | SEE 1623 | | |
| 2133 | SEE 1623 | | |
| 2134 | SEE 1623 | | |
| 2135 | SEE 1623 | | |
| 2136 | SEE 1623 | | |
| 2137 | SEE 1623 | | |
| 2138 | SEE 1623 | | |
| 2139 | SEE 1623 | | |
| 2150 | SEE 1537 | | |
| 2151 | SEE 1537 | | |
| 2152 | SEE 1522 | | |
| 2153 | SEE 1522 | | |
| 2154 | CAPACITOR | SPRAGUE | 0.001 MFD CERAMIC |
| 2155 | SEE 2154 | | |
| 2156 | SEE 2154 | | |
| 2157 | SEE 2154 | | |
| 2158 | SEE 2154 | | |
| 2160 | SEE 1749 | | |
| 2201 | SEE 1511 | | |
| 2202 | SEE 1511 | | |
| 2203 | SEE 1828 | | |
| 2204 | SEE 1816 | | |
| 2206 | SEE 2004 | | |
| 2208 | OPTION BLOCK | | |
| 2210 | SEE 1511 | | |
| 2211 | SEE 1511 | | |
| 2212 | SEE 1511 | | |
| 2220 | SEE 1537 | | |
| 2222 | SEE 1537 | | |
| 2224 | SEE 1537 | | |
| 2226 | SEE 1522 | | |
| 2228 | SEE 1522 | | |
| 2230 | SEE 1749 | | |
| 2301 | SEE 1511 | | |
| 2302 | SEE 1511 | | |
| 2303 | SEE 1511 | | |
| 2304 | SEE 1511 | | |
| 2305 | SEE 1511 | | |
| 2306 | SEE 1511 | | |
| 2307 | SEE 1511 | | |
| 2308 | SEE 1511 | | |
| 2309 | SEE 1511 | | |
| 2310 | SEE 1511 | | |
| 2311 | SEE 1511 | | |
| 2312 | SEE 1511 | | |
| 2314 | SEE 1706 | | |
| 2316 | SEE 1508 | | |
| 2318 | SEE 1828 | | |
| 2319 | SEE 1501 | | |
| 2320 | SEE 1706 | | |
| 2321 | SEE 1706 | | |
| 2322 | SEE 1828 | | |
| 2323 | SEE 1501 | | |
| 2324 | SHIFT REGISTER | FAIRCHILD | 9300 |
| 2326 | SEE 2002 | | |

TABLE VIII CONTINUED

| PART NR | PART | MANUFACTURER | MFR #/VALUE |
|---|---|---|---|
| 2328 | SEE 2116 | | |
| 2330 | FIFO | FAIRCHILD | 3341 |
| 2331 | SEE 2330 | | |
| 2332 | SEE 1511 | | |
| 2334 | SEE 1816 | | |
| 2336 | SEE 1816 | | |
| 2340 | SEE 1706 | | |
| 2342 | SEE 1828 | | |
| 2343 | SEE 1828 | | |
| 2344 | SEE 1828 | | |
| 2346 | SEE 1623 | | |
| 2347 | SEE 1623 | | |
| 2348 | SEE 1623 | | |
| 2349 | SEE 1623 | | |
| 2350 | SEE 2324 | | |
| 2352 | SEE 1816 | | |
| 2360 | SEE 1537 | | |
| 2361 | SEE 1522 | | |
| 2362 | SEE 1522 | | |
| 2363 | SEE 2154 | | |
| 2364 | SEE 2154 | | |
| 2365 | SEE 2154 | | |
| 2402 | SEE 1508 | | |
| 2404 | SEE 1828 | | |
| 2406 | SEE 1834 | | |
| 2408 | SEE 1511 | | |
| 2409 | SEE 1511 | | |
| 2410 | SEE 1834 | | |
| 2412 | SEE 1511 | | |
| 2413 | SEE 1501 | | |
| 2414 | SEE 1501 | | |
| 2416 | SEE 1511 | | |
| 2417 | SEE 1511 | | |
| 2418 | SEE 1511 | | |
| 2420 | SEE 1828 | | |
| 2422 | SEE 1834 | | |
| 2423 | SEE 1511 | | |
| 2424 | SEE 1828 | | |
| 2425 | SEE 1511 | | |
| 2426 | SEE 1511 | | |
| 2427 | SEE 1501 | | |
| 2428 | SEE 1828 | | |
| 2430 | SEE 1828 | | |
| 2432 | SEE 1511 | | |
| 2433 | SEE 1511 | | |
| 2434 | SEE 1511 | | |
| 2436 | SEE 1816 | | |
| 2437 | SEE 1816 | | |
| 2438 | SEE 1816 | | |
| 2440 | SEE 1511 | | |
| 2441 | SEE 1501 | | |
| 2442 | SEE 1828 | | |
| 2444 | SEE 1508 | | |
| 2446 | SEE 1501 | | |
| 2448 | SEE 1511 | | |

TABLE VIII CONTINUED

| PART NR | PART | MANUFACTURER | MFR #/VALUE |
|---|---|---|---|
| 2450 | SEE 1501 | | |
| 2452 | SEE 1511 | | |
| 2501 | SEE 2324 | | |
| 2502 | SEE 2324 | | |
| 2503 | SEE 2330 | | |
| 2504 | SEE 2330 | | |
| 2505 | SEE 2324 | | |
| 2506 | SEE 2324 | | |
| 2508 | SEE 1828 | | |
| 2509 | SEE 1828 | | |
| 2510 | SEE 1828 | | |
| 2511 | SEE 1828 | | |
| 2512 | SEE 1828 | | |
| 2513 | SEE 1828 | | |
| 2514 | SEE 1828 | | |
| 2516 | SEE 1623 | | |
| 2517 | SEE 1623 | | |
| 2518 | SEE 1623 | | |
| 2519 | SEE 1623 | | |
| 2520 | SEE 1623 | | |
| 2521 | SEE 1623 | | |
| 2522 | SEE 1623 | | |
| 2523 | SEE 1623 | | |
| 2524 | SEE 1501 | | |
| 2525 | SEE 1706 | | |
| 2526 | SEE 1706 | | |
| 2527 | SEE 1828 | | |
| 2530 | SEE 1816 | | |
| 2532 | SEE 1508 | | |
| 2533 | SEE 1508 | | |
| 2534 | SEE 2002 | | |
| 2535 | SEE 2002 | | |
| 2538 | SEE 1511 | | |
| 2540 | SEE 1706 | | |
| 2542 | SEE 1511 | | |
| 2544 | SEE 1511 | | |
| 2546 | SEE 1816 | | |
| 2548 | SEE 1816 | | |
| 2550 | SEE 1706 | | |
| 2560 | SEE 1537 | | |
| 2561 | SEE 1537 | | |
| 2562 | SEE 1522 | | |
| 2563 | SEE 1522 | | |
| 2602 | SEE 1828 | | |
| 2604 | SEE 1816 | | |
| 2605 | SEE 1816 | | |
| 2608 | SEE 1501 | | |
| 2609 | SEE 1706 | | |
| 2610 | SEE 1820 | | |
| 2611 | SEE 1511 | | |
| 2612 | SEE 1511 | | |
| 2613 | SEE 1706 | | |
| 2614 | SEE 1834 | | |
| 2616 | SEE 2004 | | |
| 2618 | SEE 1828 | | |

| | | |
|---|---|---|
| 2620 | SEE | 1501 |
| 2621 | SEE | 1834 |
| 2622 | SEE | 1511 |
| 2623 | SEE | 1511 |
| 2624 | SEE | 1511 |
| 2626 | SEE | 1828 |
| 2627 | SEE | 1706 |
| 2628 | SEE | 1511 |
| 2629 | SEE | 1820 |
| 2630 | SEE | 1511 |
| 2631 | SEE | 1511 |
| 2632 | SEE | 1501 |
| 2634 | SEE | 1511 |
| 2635 | SEE | 1511 |
| 2636 | SEE | 1501 |
| 2638 | SEE | 1820 |
| 2640 | SEE | 1828 |
| 2642 | SEE | 1511 |
| 2643 | SEE | 1501 |
| 2646 | SEE | 1508 |
| 2648 | SEE | 1501 |
| 2652 | SEE | 1501 |
| 2654 | SEE | 1511 |

With the foregoing understood, further subtleties of the present invention may be appreciated. For example, the interaction between compaction device 54 of FIG. 7 and the input/output structure in the form of input/output mechanism 50 and 52 of FIG. 7 may now be appreciated. Basically, the input/output structure, especially FIGOs 66 and 102, control the action of compactor 54 of the present invention, while coder/decoder 88 in turn controls some of the interface signals and accomplishes the compaction and decompaction.

At original power on, coder/decoder 88 energizes the I/O hardware, 50 and 52, and proceeds through an initialization sequence, as discussed above, which generally consists of clearing all registers and memory and I/O lines. Subsequently, coder/decoder 88 runs continuously, as instruction address register 1002 of FIG. 10 runs from a free running clock. Compactor 54 of the present invention then runs continuously, whether or not data is being compacted or decompacted. There are no on/off or other controls to operate the compaction device according to the present invention, and the compaction device 54 of the present invention runs continuously whenever it is energized by a suitable power source, not specifically shown.

After initialization, compaction device 54 immediately enters the receive/decompact mode, i.e. the compaction device 54 attempts to obtain data from modem side FIFO 102. If data is available from modem side FIFO 102, coder/decoder 88 will obtain the data as from output register 106, and proceed through the decompaction process as outlined in great detail above. However, even in the event data is being received by modem side converter 114, compaction device 54 of the present invention generally operates much faster than the communications line which provides the data, and in this event, compaction device 54 soon exhausts the supply of data available and ready in modem side FIFO 102.

In this event, i.e. where modem side FIFO is empty of data, and at a location in the microcode as set forth above with respect to Table VII, when the coder/decoder can safely stop without losing data or causing any timing problems to the I/O interfaces to the communications path with which the compaction device 54 of the present invention interacts with the outside world, coder/decoder 88 will execute a OUT20 command, which is an output to device 20 instruction. Device 20 is not truly an output device, but rather a signal to FIFOs 102 and 66. If it is necessary, because controller side FIFO 66 is completely full of data or modem side FIFO 102 is empty of data, that the FIFOs need to idle coder/decoder 88 and delay compaction, or decompaction according to the present invention, then the time immediately following an output to device 20 is the appropriate and safe time to do so. This output to device 20 signal can then be executed at some point in the above microcode between any two successive microcode instructions providing for input from FIFO 102 or 66 or any two successive instructions in the microcode providing for any two outputs to FIFOs 66 or 102. The logic of both controller side FIFO 66 and modem side FIFO 102 is then arranged to receive this output to device 20 logic signal, and if either FIFO is not in a condition to accomplish the required function of providing a input or an ouput, because of a full or an empty condition, the FIFO logic will immediately force the coder/decoder 88 into an idle status.

When coder/decoder 88 enters an idle status, I/O control logic is arranged to take control of data bus 86 from the logic associated with memory 90, stop the flow of instructions emanating from instruction memory 92 of memory 90, and substitute instructions from the logic within FIFOs 66 and 102 which coder/decoder 88 proceeds to execute. That is, the instructions provided by FIFOs 66 and 102 are directly substituted for an expected instruction from memory 92, and coder/decoder 88 has no way of noting the source of the instruction, but merely executes the instruction provided. The effect of the instruction provided by FIFOs 66 or 102 is to force coder/decoder 88 into an idle status loop where it remains until logic within FIFO 66 or 102 again indicates that the full or empty condition which forced coder/decoder 88 into an idle status has abated. That is, a continuous status check is made, and the loop is continued so long as the status which forced the idle status condition exists. At a time when the full or empty status condition has abated, input/output control logic 128 provides for a change of status, and allows coder/decoder 88 to leave the idle status and resume the compaction or decompaction process.

As alluded to above, eiter of FIFOs 66 or 102 can force coder/decoder 88 into an idle status. Modem side FIFO 102 will cause such an idle status if the compaction device 54 of the present invention is in a receive mode, and FIFO 102 is unable to supply data to compaction device 54, i.e. FIFO 102 is empty of data. Controller side FIFO 66 will force coder/decoder 88 into an idle status if compaction device 54 is in a receive mode, and FIFO 66 is unable to accept data from compaction device 54 of the present invention, i.e. FIFO 66 is full of data and has no further ability to accept more without a loss of data.

The foregoing then described the interaction of compaction device 54 and input/output members 50 and 52 during the receiver mode. As a further subtlety of the present invention, the normal state of compactor 54 of the present invention is the receive mode, and either in an idle or active status depending on the status of FIFOs 66 or 102 as discussed above. If no data is being transmitted to compaction device 54 of the present invention, the compaction device at each end of the data path or transmission line E of FIG. 1 will exist in the receive mode and also in idle status. Two specific conditions can release compactor 54 from its idle status. The first factor is if modem side FIFO 102 should become not empty, i.e. some data should enter modem side FIFO 102, and also controller side FIFO 66 become not full, i.e. be in a condition to receive and accept data. The logic circuitry for both FIFOs 66 and 102 will then provide logic signals to coder/decoder 88 indicating their condition, and since control logic for coder/decoder 88 is constantly monitoring the logic signals from FIFOs 66 and 102, the control logic for coder/decoder 88 enables leaving the idle status. Compactor 54 will then return to the active status in the receiver mode.

The remaining condition which allows compaction device 54 of the present invention to leave the idle status is when a status line RQT signal, request to transmit signal from line controller B in the exemplary example, becomes high which is evidenced by the transmission of a positive 10 volt signal in the example given. This signal from controller B indicates that the line controller B has data ready to send. Coder/decoder 88 then leaves the idle status, receive mode, and enters the active status, transmit mode. The necessary and conventional control signals are then transmitted by coder/decoder 88 to the controller B, and further appropriate clock signals are provided to controller side converter 56 which then attempts to synchronize on the data in a well known fashion used by many communications devices. Coder/decoder 88 then begins attempts to remove data from output register 70. If data is not yet present, logic associated with controller side FIFO 66 again takes control of data bus 86, in the manner discussed above, and coder/decoder 88 is forced into idle status, transmit mode which is identical to idle status, receive mode, except that coder/decoder 88 will return to the transmit mode upon leaving idle status.

The necessary conditions for coder/decoder 88 to leave the idle status, transmit mode are (1) controller side FIFO 66 not empty and modem side FIFO 102 not full or (2) the RQT, request to transmit, signal from controller B low, off, or at a voltage of a minus 10 in the present example, and in addition modem side FIFO 102 empty. In the first condition, compaction device 54 will enter active status, transmit mode, and in the event of the second condition, compaction device 54 of the present invention will return to idle status, receive mode.

In summary, the interaction between the status of FIFOs 66 and 102 and the mode of compaction device 54 according to the present invention is: compaction device 54 will always be in the receive mode if a RQT signal is low, at a minus 10 volts in the present example, and compaction device 54 will always be in the transmit mode if an RQT signal is high, a positive 10 volts in the present example. If compaction device 54 is in the receive mode, coder/decoder 88 will be in an active receive status if modem side FIFO 102 is not empty and thus coder/decoder 88 may obtain data, and controller side FIFO 66 is not full, and thus coder/decoder 88 has a temporary storage location into which to put data. If compaction device 54 is in the transmit mode, coder/decoder 88 will exist in an active status, transmit mode if controller side FIFO 66 is not empty and thus coder/decoder 88 may obtain data to transmit, and modem side FIFO 102 is not full, thus offering coder/decoder 88 an opportunity to store data without a loss. The transition between modes is occasioned by an RQT signal change. For example, if the RQT signal drops low while connection device 54 is in a transmit mode, coder/decoder 88 will and must wait until any data in modem side converter 102 has been clocked out onto the transmission path or transmission line E. However, upon an RQT signal returning high while compaction controller 54 is in the receive mode, the transition to transmit mode is immediate.

In further summary, the transition between idle status and active status in either mode is totally dependent on the status of FIFOs 66 and 102, and the status of these FIFOs is in turn dependent upon external circumstances such as line speed, data patterns, interface speed, and like circumstances. The transition from active status to idle status and back again may not happen at all in a given block of data, or it may happen as often as every data character which crosses either converter.

For further subtleties according to the present invention, the action of coder/decoder 88 while in the active status can now be further appreciated. As data is made available to coder/decoder 88 from controller side FIFO 66 at the transmitting end of the line, each character is first checked to see if it is the same as a similarly positioned character in whatever prior record is tored within data memory 94. If the current character is found to be identical to a character positioned in the prior record in the same position as the current character occupies in the current record, the number of like characters are counted and an appropriate code is sent to modem side FIFO 102.

This check for a similarly positioned character is accomplished by successively providing the current characters from the selected FIFO into accumulator 1012 of coder/decoder 88 and directly comparing the character in accumulator 1012 against the contents of the memory location representing the position of the current character in the current record. That is, if the current character is the tenth character in the record, it is compared against the tenth character of the prior record, as stored in data memory 94. Data memory 94 is then continuously compared against the current character in accumulator 1012, and the result tested. So long as the current character and the character residing in memory compare, the memory address register is incremented and a new character is read from controller side FIFO 66 to compare against the currently addressed character in data memory 94. As soon as a no match condition exists, a brief arithmetic calculation is accomplished by arithmetic and logic unit 1009 of coder/decoder 88, and the code shown in Table IV is produced indicating the number of similarly positioned identical characters. It is to be noted that this comparison procedure always takes place utilizing data as it is received from or delivered to controller side FIFO F8, that is noncompacted data.

Upon finding a prior record match, the system produces the level 3 code, indicated in Table IV, to indicate this condition exists, and prior record, or vertical compaction may take place. This level 3 code is then followed by a count indicating the number of identical characters in the manner set forth hereinbefore.

When a nonmatching character is reached, or a no match condition exists, the nonmatching current character is next subjected to a test to indicated if it may be the same as the prior character of the current record being compacted. If the current character is identical or the same as the prior character of the record being compacted, again the number of like characters are counted and an appropriate code is created in much the same manner as discussed above with respect to prior record comparison, and the encoded or compacted data is transmitted to modem side FIFO 102 in the manner previously described.

This transmission occurs until a no match condition exists between the current character tested and the prior character stored in a general purpose register 1018, whereupon coder/decoder 88 holds the current character in accumulator 1012 and performs an INP1, input from device 1, instruction. This instruction sends the INPI and the contents of accumulator 1012 onto data bus 86, an then follows by accepting the contents of data bus 86 into accumulator 1012.

While the contents of the accumulator and the INPI instruction are provided to data bus 86, the I/O memory 96 logic is performing a simultaneous process. The logic of I/O memory 96 first holds the contents of data bus 86 in a register, then, if the next eight bits appearing on data bus 86 comprise an INP1 instruction, I/O memory 96 uses the first received data to address the indicated location in I/O memory. The logic associated with I/O memory 96 then places the contents of the conforming memory location back onto data bus 86 in time for coder/decoder 88 to read the contents of the memory location back into accumulator 1012. The entire process takes place during the execution of a single INPI microcode instruction by coder/decoder 88.

Once the contents of the particular memory location of the I/O memory have been read into accumulator 1012 of coder/decoder 88, coder/decoder 88 then checks the eight bit code by adding the accumulator to itself in the arithmetic and logic unit 1009 to thus set the condition flags and then checking the condition flags. The eight bit code is as shown in the listing for the I/O memory, found in Table VII, and this code will determine exactly what particular compacted code is sent to modem side FIFO 102 for provision to communications line E. The current character is then shifted back to its original position in accumulator 1012.

Thus, for the preferred embodiment of the present invention utilizing a 256 character character set, one memory location in I/O memory 96 is allocated to each character. As each character is stored in accumulator 1012, the character forms an address to I/O memory 96 to provide an access to the code associated with that particular character. Further, the codes associated with the respective characters have been uniquely selected to minimize the data transmission and maximize the compaction according to the present invention. This subtlety of the present invention may be more easily explained after a discussion of the particular codes.

At this point, it must be understood that the eight bit code read out of the I/O memory 96 is not necessarily the code which will be transmitted to the modem side FIFO 102. Since a given compacted code may be 4, 8, or 12 bits in length and the I/O memory contents is always 8 bits, this clearly cannot be the case. Rather, the eight bit code which is obtained from I/O memory 96 is provided to accumulator 1012 to provide the information from which the coder/decoder 88 can rapidly generate the actual compacted code which is then transmitted to modem side FIFO 102, and then onto the communications line E. As each class of code is obtained from the I/O memory 96, coder/decoder 88 generates the actual compacted code as set out in Table IV in such a way as to minimize the actual amount of data transmitted.

Therefore, if the code retrieved from the I/O memory is a hexadecimal 00 as represented by the bit string 00000000, this is uniquely indicated by the zero flag on in condition flag 1034, and this hexadecimal 00 code indicates a level 16 character, as set out in Table IV. In this situation, the lower four bits of 0000 are sent to modem side FIFO 102, as the control code set out in Table IV, and the eight bit character itself follows as data from a general purpose register 1018 within coder/decoder 88, where the character was stored while the I/O memory 96 code was provided to accumulator 1012.

As an example, if the input data character is a hexadecimal 54, i.e., one of the unnamed characters in the EBCDIC set, this would cause the coder/decoder 88 to input location 54 from the I/O memory 96 as shown in Table VII. The content of this location is a hexadecimal 00, which would cause a control code output of a hexadecimal 0 followed by a data output of hexadecimal 54. This three hexadecimal digit output may also be represented as a bit string of 0000 0101 0100 as shown in Table IV.

If the code extracted from I/O memory 96 in response to the character address is a hexadecimal 4N, where N indicates any hexadecimal character, the hexadecimal 4 is uniquely indicated by the sign flag on, in condition flag 1034, and this also indicates a level 16 code, but a code reserved for special control characters for particular protocols and requires special attention. The protocol codes are used to flag when a block or a record ends or begins, where records are not otherwise separated, in order to save data for the prior record mask. For this condition, four bits of the hexadecimal 0 are first sent out, to indicate a level 16 code, then four bits of the hexadecimal F, and then the low order four bits from the I/O memory.

As an example, if the input data character was a hexadecimal 2D, i.e. an "ENQ" control character in the EBCDIC set, this would cause the coder/decoder 88 to input location 2D from the I/O memory 96 as shown in Table VII. The content of this location is a hexadecimal 48, which would cause a control code output of a hexadecimal 0 followed by a data output of hexadecimal F8. This three hexadecimal digit output may also be represented as a bit string of 0000 1111 1000 which is a modification of the normal level 16 character to flag it as a control character in this specific application.

If the code extracted from memory is a hexadecimal 8N, where N again represents any value permissible, this condition is uniquely indicated by the carry flag on in condition flags 1034 and indicates a level 1, 2, 4, 5, 7, 8, 9, 10, 11, 12, or 13 control code which, from Table IV, requires only a four bit control code and no data code since only one character is represented at these levels. The low order four bits from I/O memory 96 are then transmitted to modem side FIFO 102 as this control code.

As an example, if the input data character was a hexadecimal C5, i.e. an alphabetic E in the EBCDIC set, this would cause the coder/decoder 88 to input location C5 from the I/O memory 96 as shown in Table VII. The content of this location is a hexadecimal 85, which would cause a control code output of a hexadecimal 5. No data bits follow as only one character exists at this control level. This one hexadecimal digit output may also be represented as a bit string of 0101. As may be seen by Table IV, this is the control code for level 12, at which only the letter E exists.

If the code is a hexadecimal 1N, with N again indicating any permissible character, this condition is uniquely indicated by bit four, and indicates a level 14 code which requires a four bit control code and a four bit data code, as discussed above with respect to Table IV. The high order four bits then are provided to modem side FIFO 102 as the control code and the low order four bits from memory follow as the data.

As an example, if the input data character was a hexadecimal C6, i.e. an alphabetic F in the EBCDIC set, this would cause the coder/decoder 88 to input location C6 from the I/O memory 96 as shown in Table VII. The content of this location is a hexadecimal 10 which would cause a control code input of a hexadecimal 1 followed by a data output of hexadecimal 0. This two hexadecimal digit output may also be represented as a bit string of 0001 0000. As may be seen by Table IV, this is the bit string for the first character in level 14, or an alphabetic F.

If the code retrieved from I/O memory 96 is a hexadecimal 2N, where N again represents any permissible character, this condition is indicated uniquely by bit five and indicates a level 15 code. From Table IV, a level 15 codes requires a four bit control code and a four bit data code, and thus the high order four bits retrieved from memory 96 are provided to modem side FIFO 102 and are followed by the data as similarly retrieved.

As an example, if the input data character was a hexadecimal E8, i.e. an alphabetic Y in the EBCDIC set, this would cause the coder/decoder 88 to input location E8 from the I/O memory 96 as shown in Table VII. The content of this location is a hexadecimal 21 which would cause a control code output of a hexadecimal 2 followed by a data output of hexadecimal 1. This two hexadecimal digit output may also be represented as a bit string of 0010 0001. As may be seen by Table IV, this is the bit string for the second character in level 15, or an alphabetic Y.

Thus, coder/decoder 88 uniquely provides the appropriate codes to modem side FIFO 102 for transmission to the modem and to data path or communications line E. As each character is provided from controller side FIFO 66, and the eight bit format assumed for the example set out, it is then first checked in the manner set out above in an attempt to determine if it is identical or the same as a similarly positioned character in a prior record, by a direct comparison against the appropriate location in data memory 94, and if no match is found, is checked as indicated above in an effort to find if the current character is the same as a prior character by direct comparison against this prior character held in a general purpose register 1018, and if neither condition exists, resort is had to the code stored in I/O memory 96 to generate the appropriate control and data codes.

If at any time, output shift register 106 for modem side FIFO 102 becomes empty, and there is no four bit code waiting in FIFO 102 to drop into register 106, the logic associated with modem side FIFO 102 will shift in a hexadecimal F for transmission as a normal character. This hexadecimal character F is the compactor "idle" used to compensate for the wide variety of line speeds, interface speeds, and data patterns encountered. This is interpreted at the receive end as a level 6 control code.

As the data then passes across the data path or transmission line E, the data becomes available at the modem side FIFO 102 of the device at the receiving end of the line in the manner previously described. At the time data is available at the receive modem side FIFO 102, this FIFO allows coder/decoder 88 of the receive compaction device to enter the active state, receive status.

As coder/decoder 88 of the receive compaction device extracts the first four bits from output register 106 of the receive modem side FIFO 102, these four bits are tested by the coder/decoder 88 for the appropriate control level. If the first four bits represent a hexadecimal F, this indicates a level 6 idle control character, as indicated in Table IV, and the control character is deleted without being passed on to controller side FIFO 66.

If the first four bits are a hexadecimal 0, and the next eight bits are not a hexadecimal F0 through F9, this is indicative of a level 16 character as represented in Table IV, and coder/decoder 88, under the direction of instruction memory 92, deletes the initial four bit control code, and passes the next eight bits representing the character to input shift register 62 for transmission to controller side FIFO 66.

If the first four bits received represent a hexadecimal 0, and the next eight bits received represent hexadecinal F0 through F9, this also represents a level 16 control code; but, not as represented in Table IV, but a special control character for the given control protocol which requires special attention. These characters are decoded and used to flag start and stop points for a block or record and allow the data compression device of the present invention at the receive end of the line to note the end or beginning of a record and thus allow the compression device at the end of a line to maintain its prior record mask identical to the record mask at the transmit end of the line. In this case, the hexadecimal 0 control code is dropped by coder/decoder 88 under the direction of instruction memory 92, and the next eight bits form the address for ROM 1603 forming a portion of instruction memory 92 as represented in FIG. 16, where the appropriate character is stored. This character is then transmitted to controller side FIFO 66.

If the first four bits represent a hexadecimal 1, this code identifies a level 14 character. In this case, the hexadecimal 1 and the next four bits form an eight bit address "1N" which is the location in ROM 1604 of instruction memory 92 in which the eight bit character may be found. This eight bit character is then transmitted to input/output 50 under the control of coder/decoder 88.

If the first four bits represent a hexadecimal 2, this indicates a level 15 character, and again the hexadecimal 2 and the next four bits form an eight bit address "2N" which is the location in ROM 1604 of instruction memory 92 where the eight bit character may be found. This character is similarly passed to controller side FIFO 66.

If the first four bits from modem side FIFO 102 represent hexadecimal numbers 3, 4, 5, 6, 7, 8, 9, A, B, C, or D, these codes signify control levels 11, 8, 12, 9, 10, 13, 7, 5, 4, 2, or 1, respectively. Upon the finding of one of the above enumerated codes, a hexadecimal F is provided by the coder/decoder 88 and is used for the high order four bits of the address along with the control code as the lower order of four bits of the address, and together the eight bits form the address in ROM 1604 where the character may be found and provided to controller side FIFO 66 in the manner described above.

If the first four bits represent a hexadecimal E, this character indicates control level 3 as described in Table IV. The next four bits received then indicate the count and whether the bit string is the same as the prior record, representing vertical compression or compaction, or the same as the prior character of the current record, representing horizontal compression or compaction. The appropriate characters are then extracted and passed to controller side FIFO 66 as described hereinbefore.

If the second four bits represent a hexadecimal 5 through a hexadecimal F, this indicates prior record compaction and the appropriate number of characters as shown in Table IV are extracted from the data memory 94 and passed on to the controller side FIFO 66. If the second four bits represent a hexadecimal 0 through hexadecimal 4, this indicates prior character compaction and the character in general purpose register 1018 is extracted an appropriate number of times as shown in Table IV and passed on to the controller side FIFO 66.

At the completion of a block of data, the compactor at the transmit end of data path or line E, is forced into receive mode, idle status, by the fact that the RQT (request to transmit) signal has dropped and that modem side FIFO 102 indicates an empty status. Also, the compaction device at the receive end of the line has also been forced into a receive mode, idle status, by the fact that modem side FIFO 102 also indicates an empty status. Both compactors are then ready for the next block of data, regardless of which end of the line the data emanates from.

It can now be seen and appreciated that coder/decoder 88 and the logic associated with FIFOs 66 and 102 share the control of compaction according to the present invention to achieve a device which has the maximum efficiency in terms of speed capacity when the data rate is highest and the minimum efficiency at times when the data rate is low or absent. This is possible by making all status changes to an idle status by external logic of the FIFOs 66 and 102. This relieves the coder/decoder of any responsibility for monitoring the FIFOs when it is busy. By comparison, when idle, the coder/decoder 88 has nothing to do and does most of the monitoring of the FIFO status lines. This is contrary to normal practice which usually gives the heaviest extra load to the main logic device just when the load is heaviest.

It can also now be seen and appreciated that I/O memory 96 logic in conjunction with coder/decoder 88 can perform a 256 way table lookup in one machine instruction.

It can now also be seen and appreciated that the compaction code provides a rapid compaction and decompaction by a high degree of table usage. All of these tables have been shown in the microcode of Table VII.

It can further be seen and appreciated that the compaction code is completely nonambiguous and that all information needed to decompact is self-contained in the code or is extracted from the code.

It can still further be seen and appreciated that an idle character may be used to allow a high degree of flexibility with respect to line speeds, interface speeds, and data content and type.

It can still further be seen and appreciated that compaction according to the present invention is highly adaptive to the format and content of data passing through the device according to the present invention, and that since this adaption is done after the fact, no data is delayed more than a few milliseconds. This sequential, real time, adaptive compression makes a data compactor according to the present invention the compactor of choice, if not ideal, for many applications where other techniques may not be used due to an inherent delay in working on a block by block basis incorporated in these previous and prior techniques.

It may still further be seen and appreciated that a total and completely accurate reconstitution of the data compacted according to the present invention renders the present invention the compactor of choice, if not ideal and required, for any application where total accuracy is a requirement.

It may now further be seen and appreciated that the present device provides a transparent interface which interferes in no manner with data transmission on a data path.

It may also be seen and appreciated that data compaction according to the present invention integrates prior record, prior character, and character frequency techniques into a single, integrated, highly expandable data compression method and apparatus, heretofore not available and considered only remotely possible if at all.

It can further now be seen and appreciated that an entire 256 character character set is usable according to the present invention through its use of a variable number base encoding scheme, and that the present invention allows an open ended and highly expandable further encoding scheme allowing thousands of characters to be utilized and processed without an addition or disturbance of the normal character set or the techniques or apparatus presented herein, with the minor exception of increased memory size.

It can further be appreciated and seen that the present invention utilizes FIFO stacks to smooth the flow of data and guarantee a maxium throughput.

Now that the basic teachings of the present invention have been explained, many extensions and variations will be obvious to one having an ordinary skill in the art. For example, the present invention has been explained in relation to a specific transmission path between a controller and a modem and another modem and a controller and for a specfic application. No limitation to this approach is intended. It is intended that the techniques and apparatus of the present invention be utilized upon any transmission path between any two devices or upon a looped transmission path. Thus, by way of example and not limitation, compaction devices according to the present invention are envisioned as usuable between: bulk storage or external memory devices for large computing systems, such as disc or core storage, magnetic tape storage, paper tape storage, and the like, and the central processor for that computing system; between two such storage devices themselves; between two such central processors themselves; between two peripheral devices, whether with a central processing unit or not; between a peripheral device and a storage device, either with or without a central processing unit; and between any two communication devices; or in a data loop interconnecting with one or more of the above devices, or similar or other arrangements, as will now be obvious to those skilled in the art.

Also, the present invention has been explained utilizing input/output devices, such as devices 50 and 52 of the figures. It will now be recognized that these devices are not necessary. Systems and apparatus may thus be designed with or without such input/output devices. The techniques and apparatus associated with compactor 54 are not dependent upon the input/output devices set out; but the input/output devices set out are clearly preferred for the environment set forth.

Further, the word "compaction" as used in the description of the present invention indicates both the generic meaning of a device utilizing the teachings of the method and apparatus according to the present invention, including compaction, only decompaction, or both and the particular section of a device according to the present invention which compacts data or symbols.

Furthermore, while the compactor according to the present invention has been described herein as including both a compaction section and a decompaction section on both ends of a transmission path, this is not necessary either. Systems Such as a simple path to a storage device may utilize only two lines, a line into the storage device and back from the storage device, and only one compaction device according to the present invention. Also, special situations may dictate the use of only compaction or only decompaction on one or both ends of a transmission path. All of these situations are intended to be embraced within the teachings of the present invention.

Furthermore, one device according to the present invention may be utilized with more than one transmission path, or one device according to the present invention may accept many inputs from various other devices, provide an output to one device, or alternately one device according to the present invention may accept an input from a single device and provide an output to many devices, or any combination or intermediary arrangement may be utilized. Also, any of the above may occur with or without additional buffering.

Still further, it will be recognized by those skilled in the art that the teachings according to the present invention can be utilized with or without buffering in any environment.

Thus, since the invention disclosed herein may be embodied in other specific forms without departing from the spirit or general characteristics thereof, some of which forms have been indicated, the embodiments described herein are to be considered in all respect illustrative and not restrictive. The scope of the present invention is indicated by the appended claims, rather than by the foregoing description, and all changes which come within the meaning and range of equivalency of the claims are intended to be embraced therein.

What is claimed is:

1. Data compaction apparatus for use on a path of communication of groups of symbols, comprising in combination: compaction apparatus inserted into the communication path at the transmission end and decompaction apparatus inserted into the communication path at the reception end for compacting data to be transmitted and decompacting data to be received, the compaction apparatus comprising: means for accepting an input from the communcation path; means for controlling the compaction apparatus and causing the compaction apparatus to perform a data dependent sequence of operations; means for storing, associated with the compaction apparatus and including a portion for storing selected data from the communication path and a portion for storing preset coding including coding for at least selected of the symbols from the communication path; means for selectively causing the storage of symbols from the communication path and for providing sequential, real time, adaptive coding of symbols from the communication path by comparing the symbols received by the compaction device in a sequential and serial fashion with prior symbols received and stored in the means for storing and for causing a type of compacted symbol to be transmitted if a symbol within the coding means of the compaction apparatus conforms to a symbol of a prior symbol received and stored in the means for storing, and for causing another type of compacted symbol to be transmitted if the symbol within the coding means of the compaction apparatus is not appropriately conforming to prior symbols received and stored in the means for storing but conforms to the preset coding within the means for storing, and for causing yet another type of compacted symbol to be transmitted if the symbol within the coding means of the compaction apparatus is not appropriately conforming to prior symbols received and stored in the means for storing and not appropriately conforming to preset coding within the means for storing; means for providing the sequences of symbols from the coding means to the communication path in a sequential fashion conforming to the sequence received; and the decompaction apparatus comprising: means for accepting an input from the communication path; means for controlling the decompaction apparatus and causing the decompaction apparatus to perform compacted data dependent sequence of operations; means for storing, associated with the decompaction apparatus and including a portion for storing selected data from the communication path and a portion for storing preset decoding including decoding for at least selected of the symbols from the communication path conforming to the selected symbols stored in the means for storing associated with the compaction apparatus; means for providing sequential, real time, adaptive decoding of symbols from the communication path by recognizing the first mentioned type of compacted symbols, the another type of compacted symbols, and the yet another type of compacted symbols, and for providing appropriate decoded symbols from the means for storing conforming to the particular symbols received; means for providing the decoded sequences of symbols from the decoding means to the communication path in a sequential fashion conforming to the sequence received; means for providing electrical connection between the means for storing associated with the compaction apparatus and the means for controlling associated with the compaction apparatus; means for providing electrical connection between the means for storing associated with the compaction apparatus and the coding means; means for providing electrical connection between the means for storing associated with the decompaction apparatus and the means for controlling associated with the decompaction apparatus; means for providing electrical connection between the means for storing associated with the decompaction apparatus and the decoding means; means for providing electrical connection between the means for controlling associated with the compaction apparatus and the coding means; means for providing electrical connection between the means for controlling associated with the decompaction apparatus and the decoding means.

2. The data compression apparatus of CLAIM 1, wherein the coding means of the compaction apparatus comprises means for comparing the symbols received by the compaction device in a sequential and serial fashion with prior symbols received and prior groups of symbols received and stored in the means for storing associated with the compaction apparatus and for causing a first type of first mentioned sequence of compacted symbols to be transmitted if the symbol within the coding means of the compaction apparatus conforms to a symbol of a prior group received and stored in the means for storing associated with the compaction apparatus and for causing a second type of first mentioned sequence of compacted symbols to be transmitted if the symbol within the coding means of the compaction apparatus conforms to a symbol of a current group received and stored in the means for storing associated with the compaction apparatus.

3. The data compaction apparatus of CLAIM 2, wherein the means for causing yet another type of sequence of symbols to be transmitted comprises means for transmitting the received symbols without compaction.

4. The data compression apparatus of claim 1, wherein the means for accepting an input from the communication path comprises buffering means and wherein the means for providing symbols to the communication path comprises buffering means.

5. Data compression apparatus for use on a path of communication of groups of symbols, comprising in combination: means for storing; means for providing sequential, real time, adaptive, open ended compaction of the symbols; means for providing an electrical connection between the means for storing and the compaction means; and means for providing an electrical connection between the compaction means and the communication path.

6. The apparatus of claim 5, wherein the means for storing includes a portion for providing read-only storage and a portion for providing read-write storage.

7. The apparatus of claim 5, wherein the means for providing an electrical connection between the communication path and the compaction means is transparent.

8. The apparatus of claim 5, wherein the means for providing an electrical connection between the compaction means and the communication path comprises input means for buffering the symbol input.

9. The apparatus of claim 8, wherein the means for providing an electrical connection between the communication path and the compaction device comprises output means for buffering the symbol output.

10. The apparatus of claim 5, further including decompaction apparatus and including means for providing an electrical connection between the decompaction means and the communication path.

11. A method of data compaction for use in conjunction with a path of transmission of groups of symbols, comprising the steps of: intercepting data in the form of symbols upon the transmission path; comparing the intercepted data with prior symbols received and stored; if a comparison is reached, encoding the intercepted data to reflect such a comparison; if no comparison is reached, encoding the intercepted data in a preset manner; transmitting the results of the foregoing steps.

12. The method of claim 11, further including the steps of: buffering the input and output; monitoring the input and the output; inactivating compaction upon the inability of the input and output buffering to properly maintain all intercepted data.

13. The method of claim 11, including the steps of: monitoring the input and output; and controlling the status of compaction with respect to the input and output of symbols.

14. The method of claim 11, wherein the comparison step further comprises: comparing the intercepted data to a prior record received; and comparing the intercepted data to a prior character received, both in an integrated manner.

15. The method of claim 14, wherein the encoding step if no comparison is reached comprises adding a transmission code to the intercepted data without further compaction.

16. The method of claim 14, wherein the encoding step if no comparison is reached comprises encoding the intercepted data by substituting a preset coding for the intercepted data.

17. The method of claim 14, wherein the encoding step if no comparison is reached comprises: encoding the intercepted data by substituting a preset coding for selected of the data for which a coding has been preset; and adding a transmission code to the intercepted data without further compaction for remaining of the intercepted data.

18. The method of claim 11, wherein the encoding step if no comparison is reached comprises adding a transmission code to the intercepted data without further compaction.

19. The method of claim 11, wherein the encoding step if no comparison is reached comprises encoding the intercepted data by substituting a preset coding for the intercepted data.

20. The method of claim 11, wherein the encoding stp if no comparison is reached comprises: encoding the intercepted data by substituting a preset coding for selected of the data for which a coding has been preset; and adding a transmission code to the intercepted data without further compaction for remaining of the intercepted data.

21. The method of claim 11 wherein the step of comparing the intercepted data with prior symbols received and stored comprises comparing the symbols of the data of the group currently intercepted against symbols of the data of the group previously intercepted and stored by first comparing the symbols of the currently intercepted data with the symbols stored within specific storage space allocated to storage of previously intercepted symbols and (1) if no comparison is reached, storing the symbols of the data of the group currently intercepted, and compared in the previous method step, within the specific storage space allocated to storage of previously intercepted symbols and (2) if a comparison is reached between the symbols of the data of the group currently inercepted and symbols of the data of the group previously intercepted and stored within the storage space allocated to the storage of previously intercepted symbols, skipping the previous step of storing the symbols of the data of the group currently intercepted and compared, as the symbols of the data of the group currently intercepted and the symbols of the data of the group previously intercepted and stored are identical and it is not necessary to restore identical symbols.

22. The method of claim 21: wherein the step of comparing the symbols of the data of the group currently intercepted against symbols of the data of the group previously intercepted and stored further comprises comparing the currently intercepted symbol with the correspondingly situated symbol of the data of the group of previously intercepted symbols received and stored; and where the encoding step if a comparison is reached further comprises setting up a data independent coding indicating only that the symbol currently intercepted is identical to the correspondingly situated symbol in the previously intercepted group of symbols received and stored; and wherein the step of comparing the symbols of the data of the group currently intercepted against the symbols of the data of the group previously intercepted and stored further comprises comparing the currently intercepted symbol with the immediately previously intercepted symbol received; wherein the encoding step if a comparison is reached comprises setting up a data independent coding indicating only that the symbol currently intercepted is identical to the immediately previously intercepted symbol.

23. The method of claim 22 wherein the storage of symbols of data intercepted within the specific storage space allocated comprises storage of currently intercepted symbols over previously intercepted symbols.

24. The method of claim 22 wherein the step of comparing the currently intercepted symbol with the immediately previously intercepted symbol received is performed only if no comparison is reached indicating the currently intercepted symbol is identical to the correspondingly situated symbol in the group of previously intercepted symbols received and stored.

25. The method of claim 24 wherein the storage of symbols of data intercepted within the specific storage space allocated comprises storage of currently intercepted symbols over previously intercepted symbols.

26. The method of claim 21 wherein the storage of symbols of data intercepted within the specific storage space allocated comprises storage of currently intercepted symbols over previously inercepted symbols.

27. The method of claim 21: wherein the step of comparing the symbols of the data of the group currently intercepted against symbols of the data of the group previously intercepted and stored further comprises comparing the currently intercepted symbol with the correspondingly situated symbol of the data of the group of previously inercepted symbols received and stored; and where the encoding step if a comparison is reached further comprises setting up a data independent coding indicating only that the symbol currently intercepted is identical to the correspondingly situated symbol in the previously intercepted group of symbols received and stored.

28. The method of claim 27 wherein the step of encoding if a comparison is reached, comprises: first setting up a symbol representing the reaching of a comparison; next setting up a data independent symbol representing only the number of such symbols compared which are identical; and collecting the symbols of the immediately preceding two steps in a manner allowing the transmission of the collected symbols.

29. The method of claim 28 further comprises automatically returning to the original comparing step.

30. The method of claim 28 wherein the storage of symbols of data intercepted within the specific storage space allocated comprises storage of currently intercepted symbols over previously intercepted symbols.

31. The method of claim 27 wherein the storage of symbols of data intercepted within the specific storage space allocated comprises storage of currently intercepted symbols over previously intercepted symbols.

32. The method of claim 21 wherein the step of encoding if a comparison is reached, comprises: first setting up a symbol representing the reaching of a comparison; next setting up a data independent symbol representing only the number of such symbols compared which are identical; and collecting the symbols of the immediately preceding two steps in a manner allowing the transmission of the collected symbols.

33. The method of claim 21 wherein the step of encoding the intercepted data to reflect a comparison if a comparison is reached in the situation where at least two consecutive symbols are identical comprises the steps of: first setting up an encoded symbol indicated the reaching of a comparison with respect to the first such identical symbol; and subsequently setting up an encoded symbol indicating the number of such identical symbols.

34. The method of claim 33 wherein the encoding step if a comparison is reached comprises encoding in a data independent manner not reflective of data but only reflective of the reaching of a comparison.

35. The method of claim 11 wherein the step of encoding the intercepted data to reflect a comparison if a comparison is reached in the situation where at least two consecutive symbols are identical comprises the steps of: first setting up an encoded symbol indicated the reaching of a comparison with respect to the first such identical symbol; and subsequently setting up an encoded symbol indicating the number of such identical symbols.

36. The method of claim 35 wherein the encoding step if a comparison is reached comprises encoding in a data independent manner not reflective of data but only reflective of the reaching of a comparison.

37. The method of claim 11 wherein the encoding step if a comparison is reached comprises encoding in a data independent manner not reflective of data but only reflective of the reaching of a comparison.

* * * * *

UNITED STATES PATENT OFFICE
CERTIFICATE OF CORRECTION

Patent No. 4,021,782      Dated May 3, 1977

Inventor(s) John S. Hoerning

It is certified that error appears in the above-identified patent and that said Letters Patent are hereby corrected as shown below:

Column 13, line 51, cancel "transmissions" and substitute therefor -- transmission --.

Column 16, line 34, cancel "(DDDDDD)" and substitute therefor --(DDDDDDDD)--.

Column 33, line 36, cancel "6" and substitute therefor --16--.

Column 33, line 37, cancel "6" and substitute therefor --16--.

Column 38, line 4, cancel "27" and substitute therefor --17--.

Column 40, line 59, cancel "5".

Column 54, line 64, after "above." should be a new paragraph.

Column 57, line 32, cancel "data memory 92," and substitute therefor --data memory 94,--.

UNITED STATES PATENT OFFICE
CERTIFICATE OF CORRECTION

Patent No. 4,021,782      Dated May 3, 1977

Inventor(s) John S. Hoerning

It is certified that error appears in the above-identified patent and that said Letters Patent are hereby corrected as shown below:

Column 60, line 55, cancel "1896" and substitute therefor -- 1897 --.

Column 79, line 45, cancel "memonics" and substitute therefor -- mnemonics --.

Signed and Sealed this

Second Day of May 1978

[SEAL]

Attest:

RUTH C. MASON
Attesting Officer

LUTRELLE F. PARKER
Acting Commissioner of Patents and Trademarks